(12) United States Patent
Liaw

(10) Patent No.: US 12,707,686 B2
(45) Date of Patent: Aug. 11, 2026

(54) SEMICONDUCTOR STRUCTURE AND MANUFACTURING METHOD THEREOF

(71) Applicant: TAIWAN SEMICONDUCTOR MANUFACTURING COMPANY, LTD., Hsinchu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 576 days.

(21) Appl. No.: 18/193,542

(22) Filed: Mar. 30, 2023

(65) Prior Publication Data

US 2024/0170535 A1 May 23, 2024

Related U.S. Application Data

(60) Provisional application No. 63/384,948, filed on Nov. 23, 2022.

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |
| ***H10W 20/20*** | (2026.01) |

(52) U.S. Cl.

CPC ......... *H10D 62/121* (2025.01); *H10D 30/014* (2025.01); *H10D 30/43* (2025.01); *H10D 30/6735* (2025.01); *H10D 30/6757* (2025.01); *H10D 64/017* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 84/85* (2025.01); *H10W 20/20* (2026.01)

(58) Field of Classification Search

CPC .... H10D 62/121; H10D 30/014; H10D 30/43; H10D 30/6735; H10D 30/6757; H10D 64/017; H10D 84/0167; H10D 84/017; H10D 84/0186; H10D 84/0188; H10D 84/038; H10D 84/85; H01L 23/481

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |

(Continued)

*Primary Examiner* — Jay C Kim
*Assistant Examiner* — Woo K Lee
(74) *Attorney, Agent, or Firm* — Cooper Legal Group, LLC

(57) ABSTRACT

A method includes forming a transistor comprising a channel region, a gate structure surrounding the channel region, and a plurality of source/drain regions on opposite sides of the gate structure; forming a front-side contact on a front-side of one of the source/drain regions; forming a back-side conductive via below the one of the source/drain regions, wherein the front-side contact further downwardly extends from the front-side of the one of the source/drain regions to the back-side conductive via; forming a back-side power supply voltage line connecting to the back-side conductive via.

20 Claims, 78 Drawing Sheets

(56) References Cited

U.S. PATENT DOCUMENTS

| | | | | |
|---|---|---|---|---|
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 10,090,325 | B1 | 10/2018 | Liaw | |
| 10,312,332 | B2 | 6/2019 | Liaw | |
| 10,515,967 | B2 | 12/2019 | Liaw | |
| 2019/0348511 | A1* | 11/2019 | Karpov | H10D 84/0149 |
| 2023/0086033 | A1* | 3/2023 | Xie | H10D 62/121 257/401 |
| 2023/0170395 | A1* | 6/2023 | Xie | H01L 21/76834 257/401 |

* cited by examiner

W

C1-C1'

SEMICONDUCTOR STRUCTURE AND MANUFACTURING METHOD THEREOF

PRIORITY CLAIM AND CROSS-REFERENCE

This application claims priority to U.S. Provisional Application Ser. No. 63/384,948, filed Nov. 23, 2022, which is herein incorporated by reference.

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
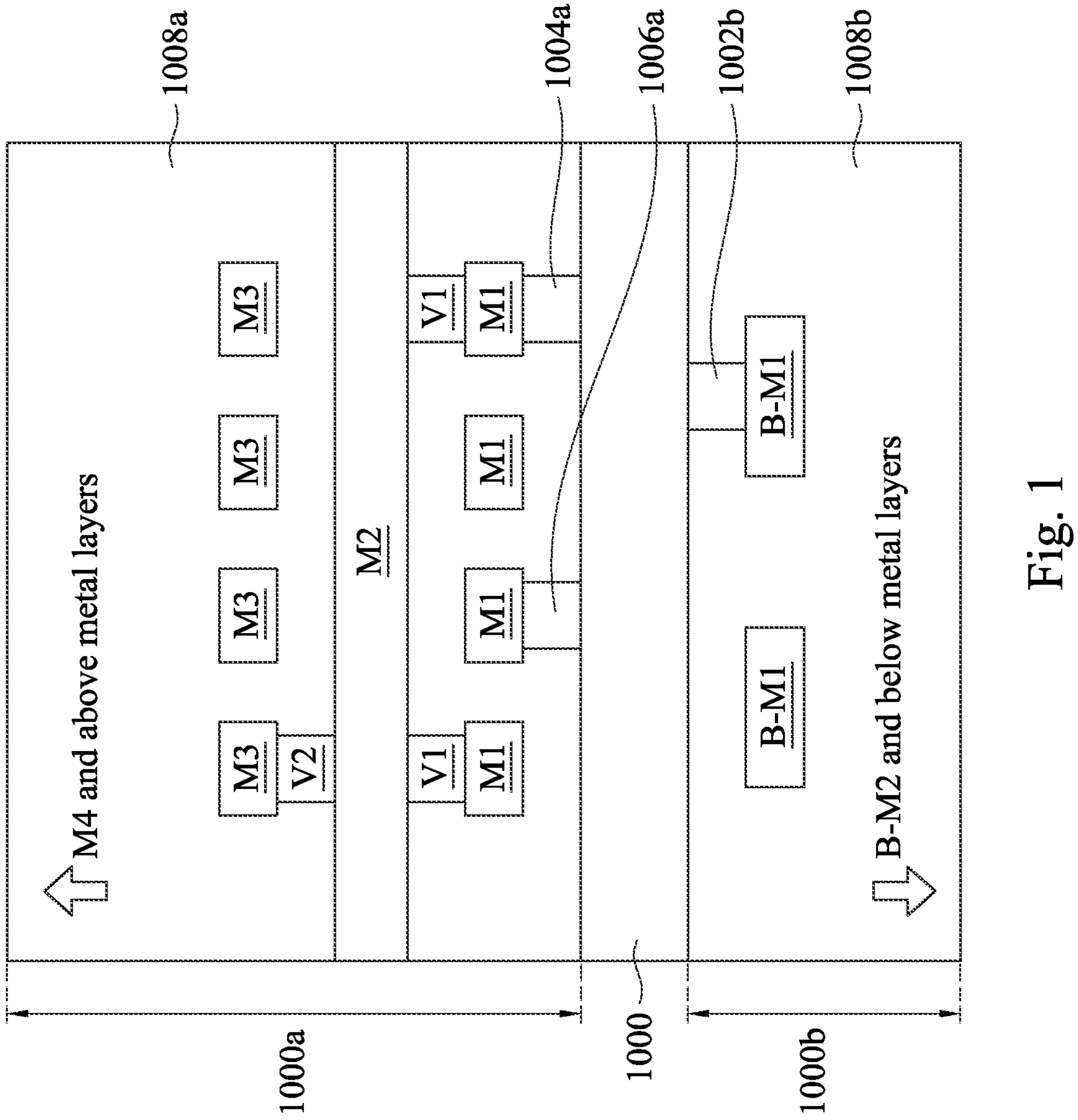
FIG. 1 is schematic view of a wafer including a front-side interconnect structure and a back-side interconnect structure on a device region thereof in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

In the course of IC evolution, functional density (i.e., the number of interconnected devices per chip area) has generally increased while geometry size (i.e., the smallest component (or line) that can be created using a fabrication process) has decreased. However, the smaller and more dense the metal lines in the IC structure will result in worse resistant thereof, thereby wasting processing power and processing speed during the operation of the IC structure. For example, in a cell routing of the IC structure, Vdd and Vss power routing may occupy too many routing resources and therefore impact the cell scaling as well as the performance of the IC structure (e.g., RC delay or IR drop).

Therefore, the present disclosure in various embodiments provides a metal line routing method to improve the functional density and operation performance on the IC structure. That is, the power conductive via is moved to wafer back-side to reduce the routing loading and further decrease the logic cell area. The source/drain region 218 can be served as a power conductor path that connects metal layers (e.g., power supply voltage lines Vdd, Vss) on wafer front-side and wafer back-side, such that an area to serve as an additional connection area for front-side and back-side metal layers can be removed, which in turn saves to provide an extra strap area and a connection manufacturing process for the power conductor path.

In addition, the back-side power conductive via of the present disclosure can be electrically connected to the source/drain region through the front-side power supply voltage contact having a contact area with an upper portion of the source/drain region. In some embodiments, the upper portion of the source/drain region can have a greater surface area and a higher dopant concentration than a lower portion thereof, and thus a connection between the source/drain region and the back-side conductive via with the front-side power supply voltage contact contacting the upper portion of the source/drain region can have an improved resistance-capacitance (RC), such that a contact resistance for a source node to Vdd/Vss connection can be improved.

Reference is made to FIG. 1. FIG. 1 is a schematic view of a wafer including a front-side interconnect structure and a back-side interconnect structure on a device region thereof in accordance with some embodiments of the present disclosure. As shown in FIG. 1, a device region 1000 is provide in the wafer W and includes, such as gate, channel, and source/drain regions. A front-side interconnect structure 1000*a* is formed after the device region formation. Specifically, the front-side interconnect structure 1000*a* is formed to have a front-side gate via 1006*a*, and a front-side source/drain via 1004*a*. The front-side interconnect structure 1000*a* may further include, for example, two metallization layers, labeled as M1, M2, and M3, with two layer of metallization via or interconnect, labeled as V1 and V2. Other embodiments may contain more or fewer metallization layers and corresponding more or fewer number of vias. The metal line illustrated here just for an example, and the metal line may be otherwise oriented (rotated 90 degrees or at other orientations). The front-side interconnect structure 1000*a* includes a full metallization stack, including a portion of each of metallization layers M1, M2, and M3 connected by the interconnect V1 and V2, with the front-side gate via 1006*a*, and the front-side source/drain via 1004*a* connecting the stack to the source/drain region and the gate of the transistor in the device region 1000. Also included in the front-side interconnect structure 1000*a* shown in FIG. 1 is a front-side IMD (inter-metal dielectric) layer 1008*a*. The front-side IMD layer 1008*a* may provide electrical insulation as well as structural support for the various features in the front-side interconnect structure 1000*a*.

As shown in FIG. 1, a back-side interconnect structure 1000*b* is formed after device region formation. Specifically, a back-side interconnect structure 1000*b* is formed to have a back-side via 1002*b*. In some embodiments, the back-side via 1002*b* can connect a source/drain region of a transistor in the device region 1000. The back-side interconnect structure 1000*b* may further include, for example, two metallization layers, labeled as B-M1, with one layer of metallization via or interconnect. Other embodiments may contain more or fewer metallization layers and corresponding more or fewer number of vias. The metal line illustrated here just for an example, and the metal line may be otherwise oriented (rotated 90 degrees or at other orientations). The back-side interconnect structure 1000*b* may include a full metallization stack including the metallization layer and the back-side via 1002*b* connecting the stack to the source/drain region of the transistor in the device region 1000. Also included in the back-side interconnect structure 1000*b* shown in FIG. 1 can be a back-side IMD layer 1008*b*. The back-side IMD layer 1008*b* may provide electrical insulation as well as structural support for the various features in the back-side interconnect structure 1000*b*.

Figure 2A:
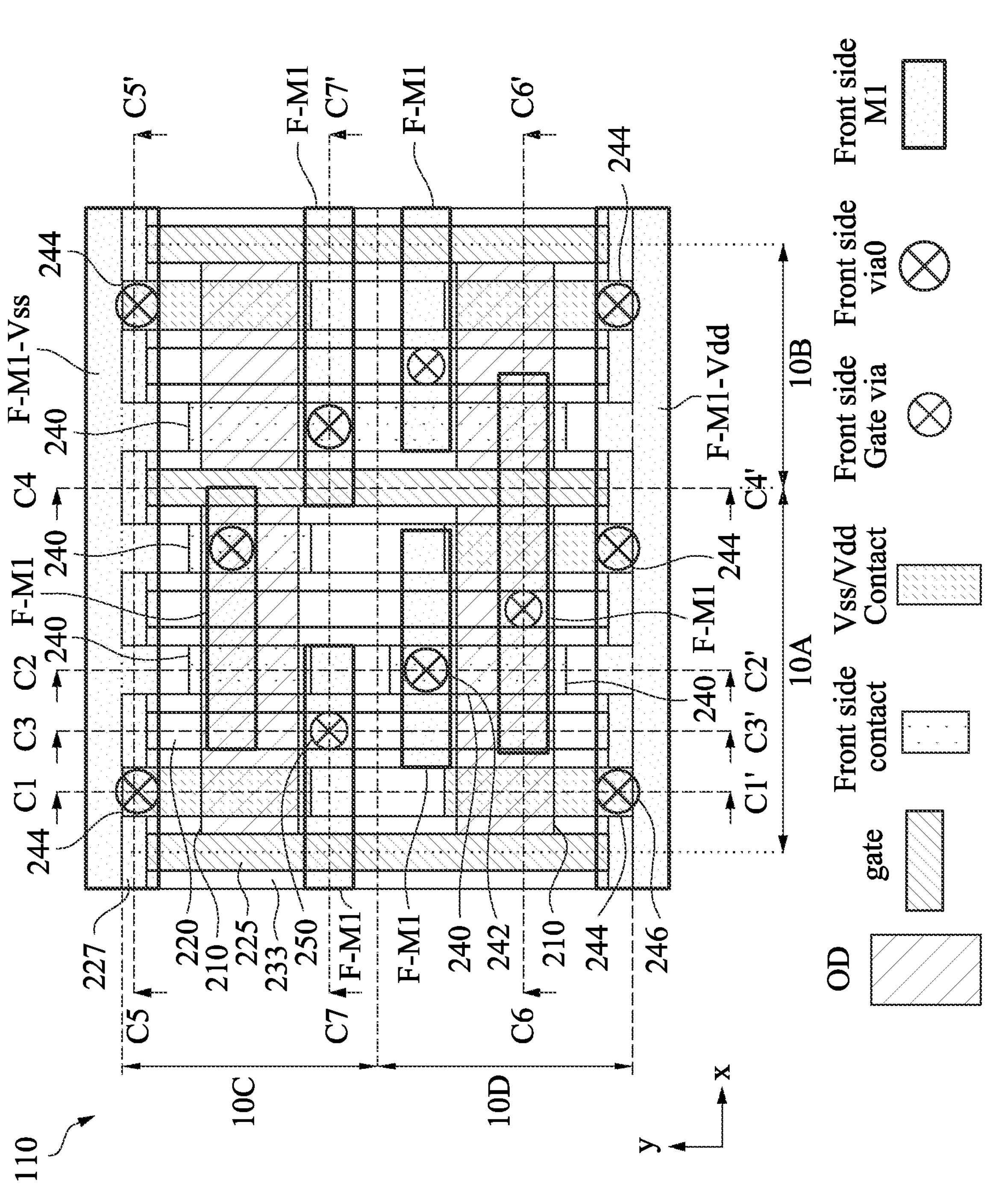
FIGS. 2A and 2B illustrate a cell layout diagram of a logic circuit on a front side and a back side of a semiconductor structure, respectively, according to some embodiments of the present disclosure.
Figure 2B:
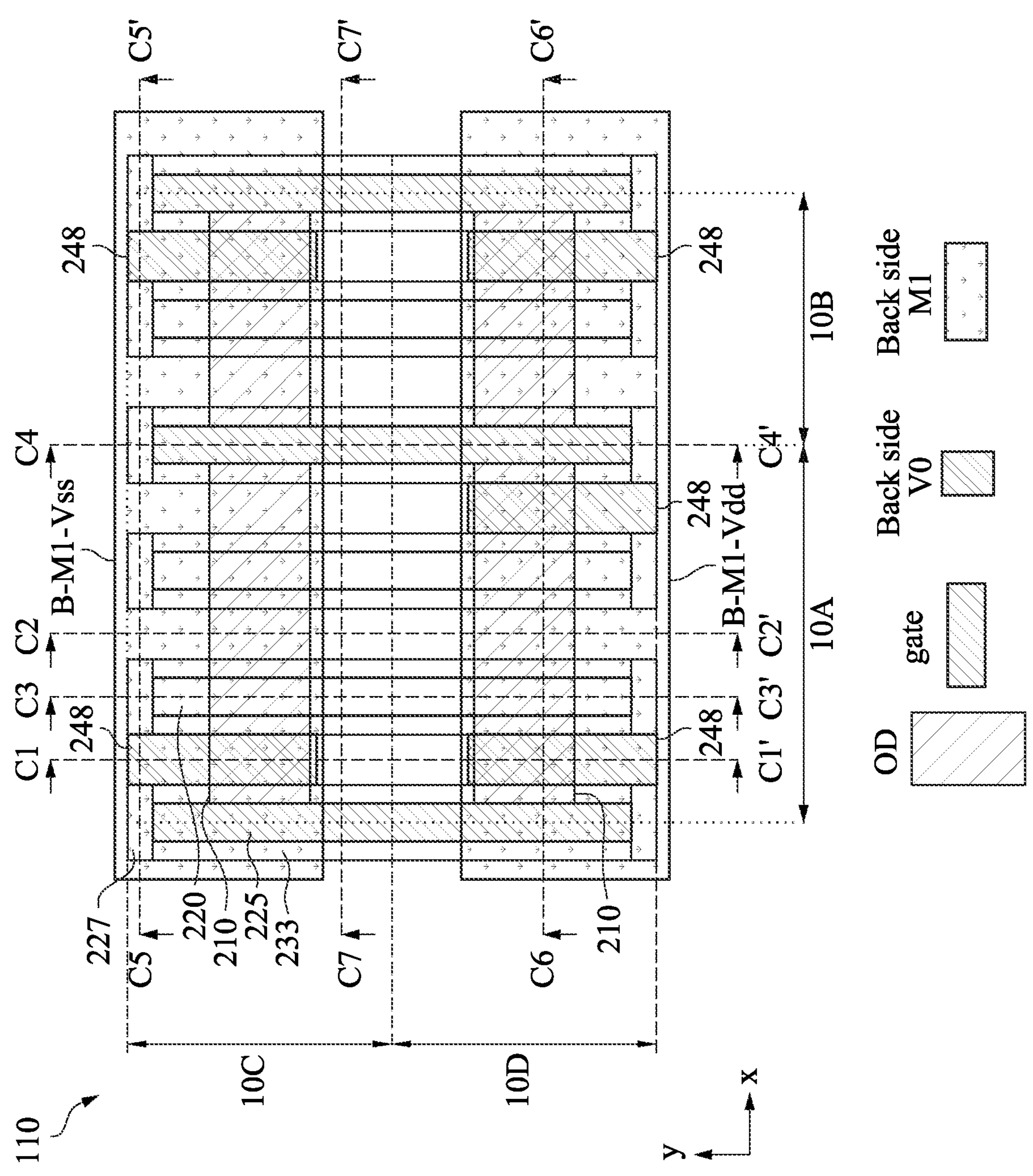
Figure 3A:
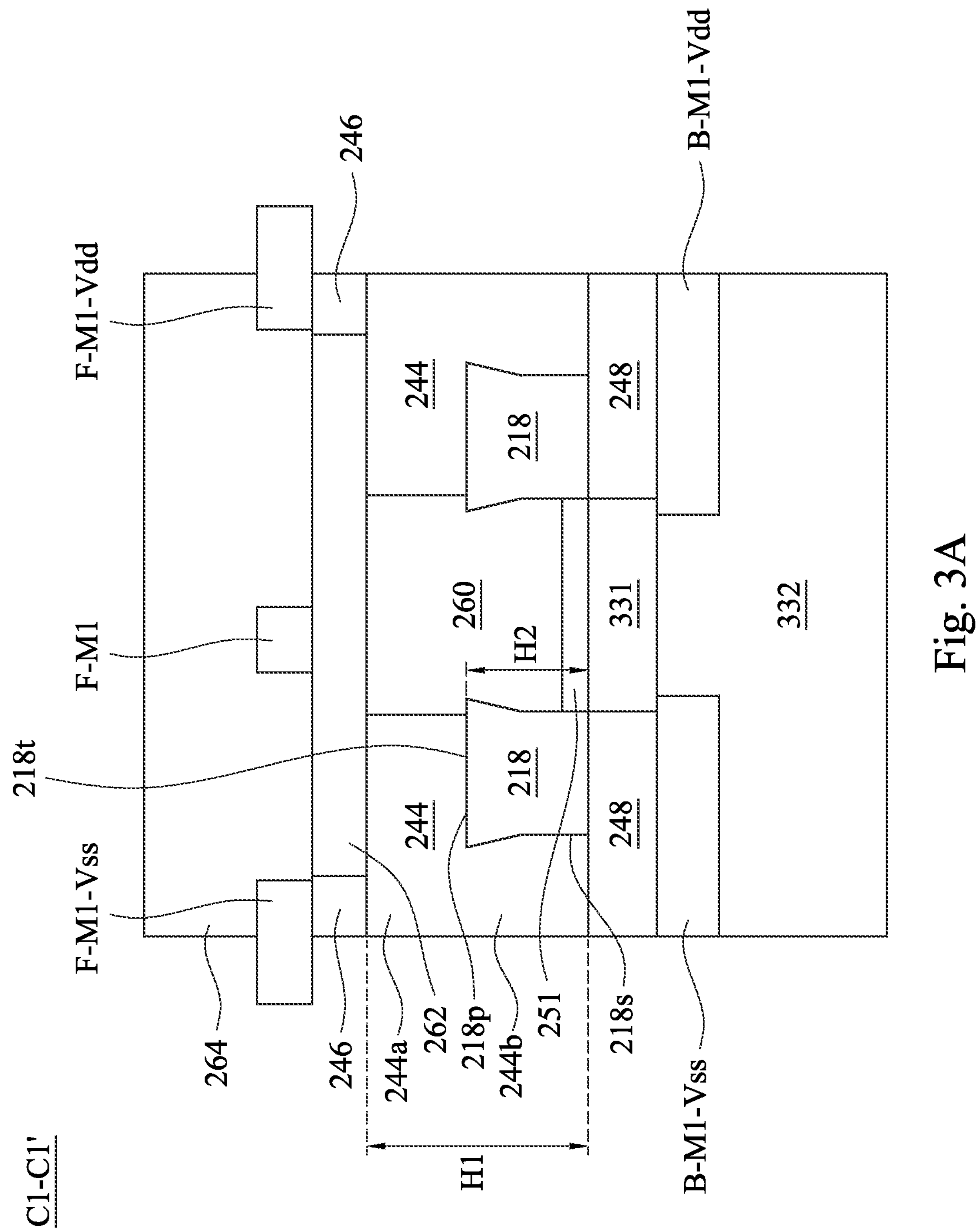
FIGS. 3A and 3C-3H illustrate cross-sectional views obtained from reference cross-section C1-C1', C2-C2', C3-C3', C4-C4', C5-C5', C6-C6', and C7-C7' in FIGS. 2A and 2B.
Figure 3B:
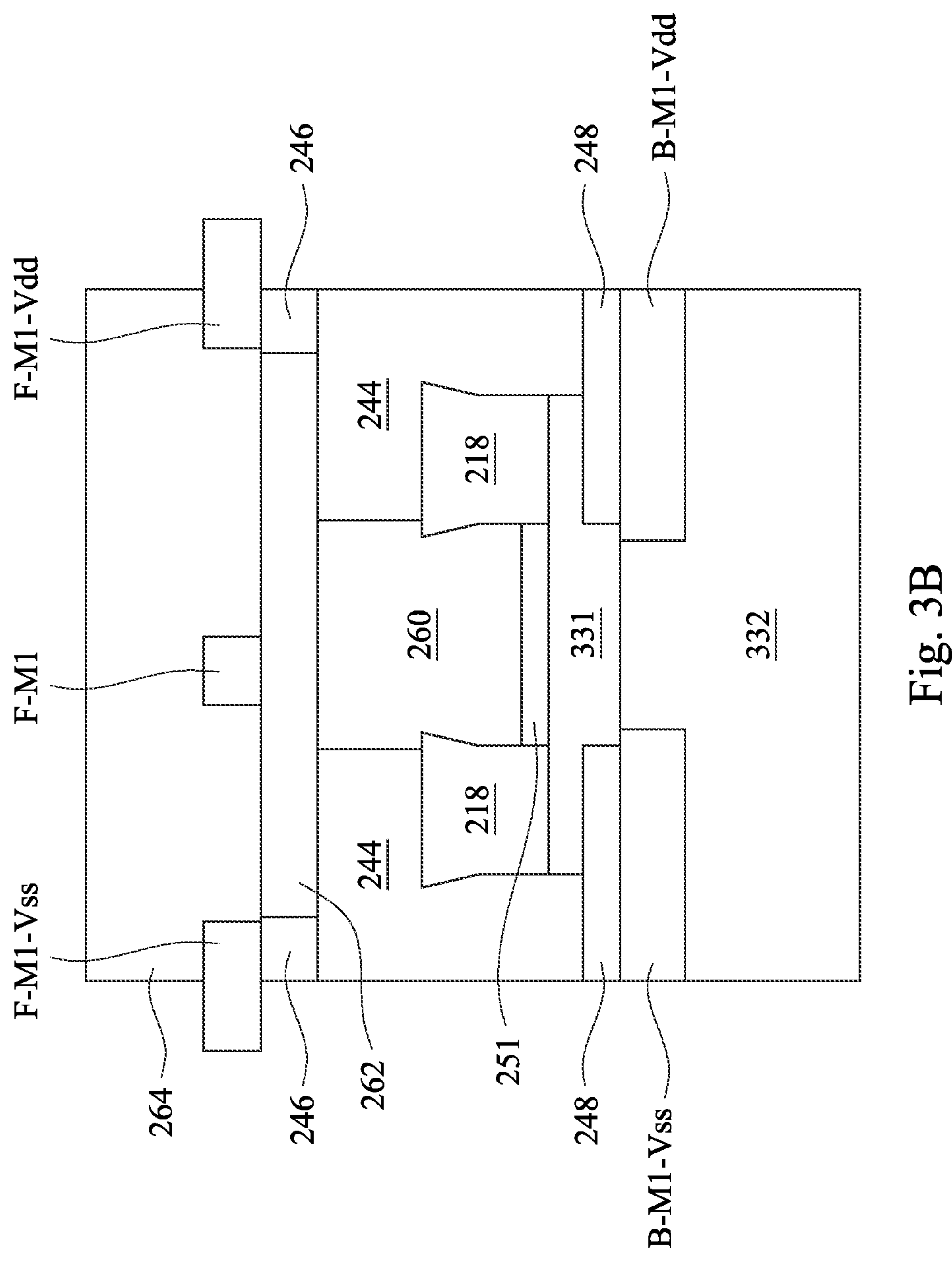
FIG. 3B illustrates a cross-sectional view of a semiconductor structure corresponding to FIG. 3A according to some embodiments of the present disclosure.
Figure 3C:
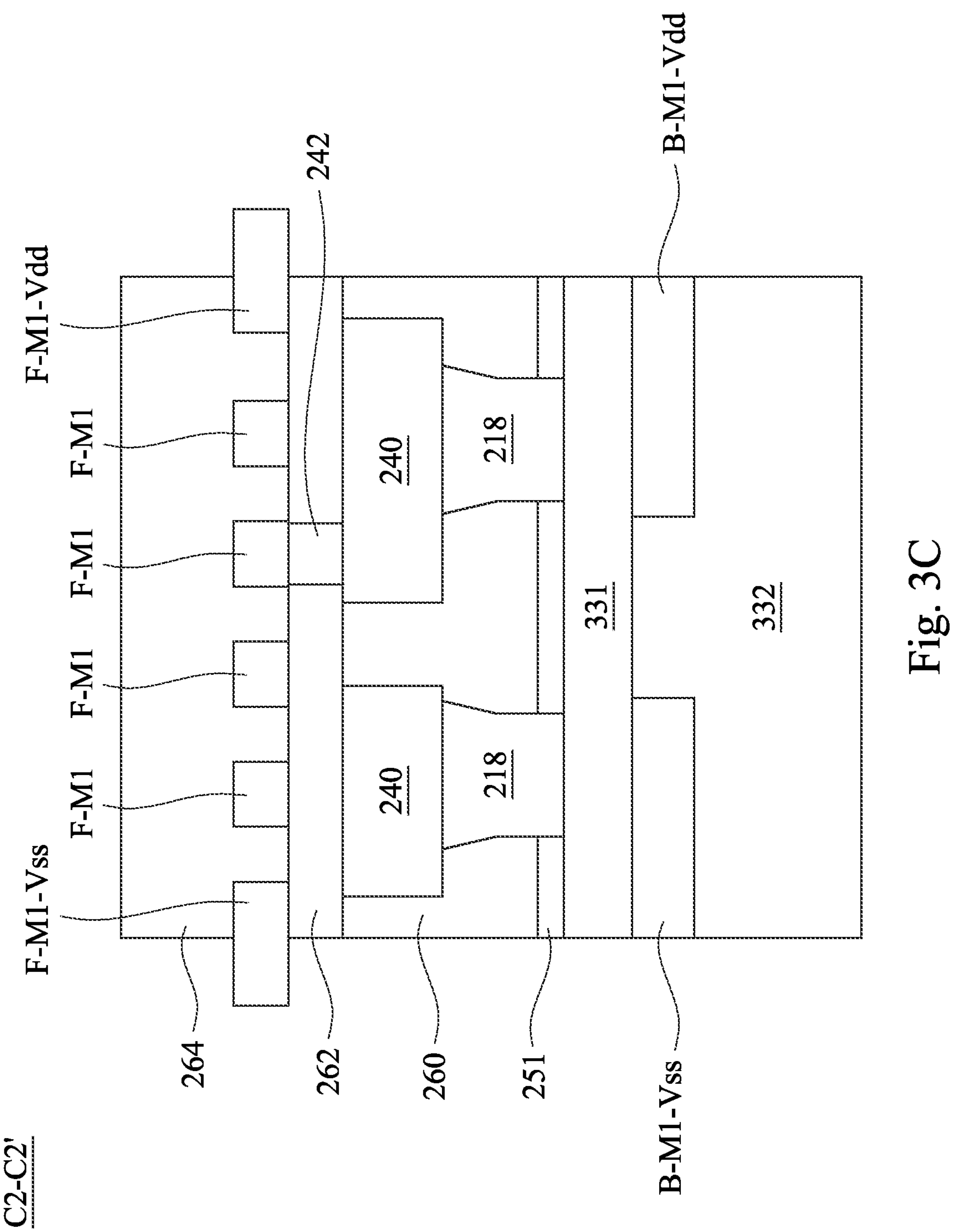

Reference is made to FIGS. 2A, 2B, and 3A-3H. FIGS. 2A and 2B illustrate a cell layout diagram of a logic circuit 110 on a front side and a back side of a semiconductor structure, respectively, according to some embodiments of the present disclosure. FIGS. 3A and 3C-3H illustrate cross-sectional views obtained from reference cross-section C1-C1', C2-C2', C3-C3', C4-C4', C5-C5', C6-C6', and C7-C7' in FIGS. 2A and 2B. FIG. 3B illustrates a cross-sectional view of a semiconductor structure corresponding to FIG. 3A according to some embodiments of the present disclosure. As shown in FIGS. 2A and 2B, a first logic circuit region 10A and a second circuit region 10B are arranged in the same row in the cell. The outer boundary of each of the first logic circuit region 10A and the second circuit region 10B is illustrated using dashed lines. In some embodiments, the first logic circuit region 10A and the second circuit region 10B may have the same cell height H. In some embodiments, the cell width W1 of the first logic circuit region 10A may be wider than the cell width W2 of the second circuit region 10B. In FIGS. 2A and 2B, it should be noted that the configuration of the first logic circuit region 10A and the second circuit region 10B in the logic circuit 110 is used as an illustration, and not to limit the disclosure. In some embodiments, the row in the cell of the logic circuit 110 may include more logic cells or fewer logic cells than the layout shown in FIGS. 2A and 2B. In some embodiments, the cell of the logic circuit 110 may include more rows or fewer rows and more columns or fewer columns than the layout shown in FIGS. 2A and 2B. Each logic cell provides a circuit or portion thereof, exemplary functionality provided by the cells includes, but are not limited to NAND, NOR, AND, XOR, XNOR, SACN, inverter, Flip-Flop, latch, and/or other suitable logic or storage functions. For example, the first logic circuit region 10A may have a first one of logic circuits shown in FIGS. 6A-6E, and the second circuit region 10B may have a second one of the logic circuits shown in FIGS. 6A-6E.

Figures 6A, 6B, 6C:
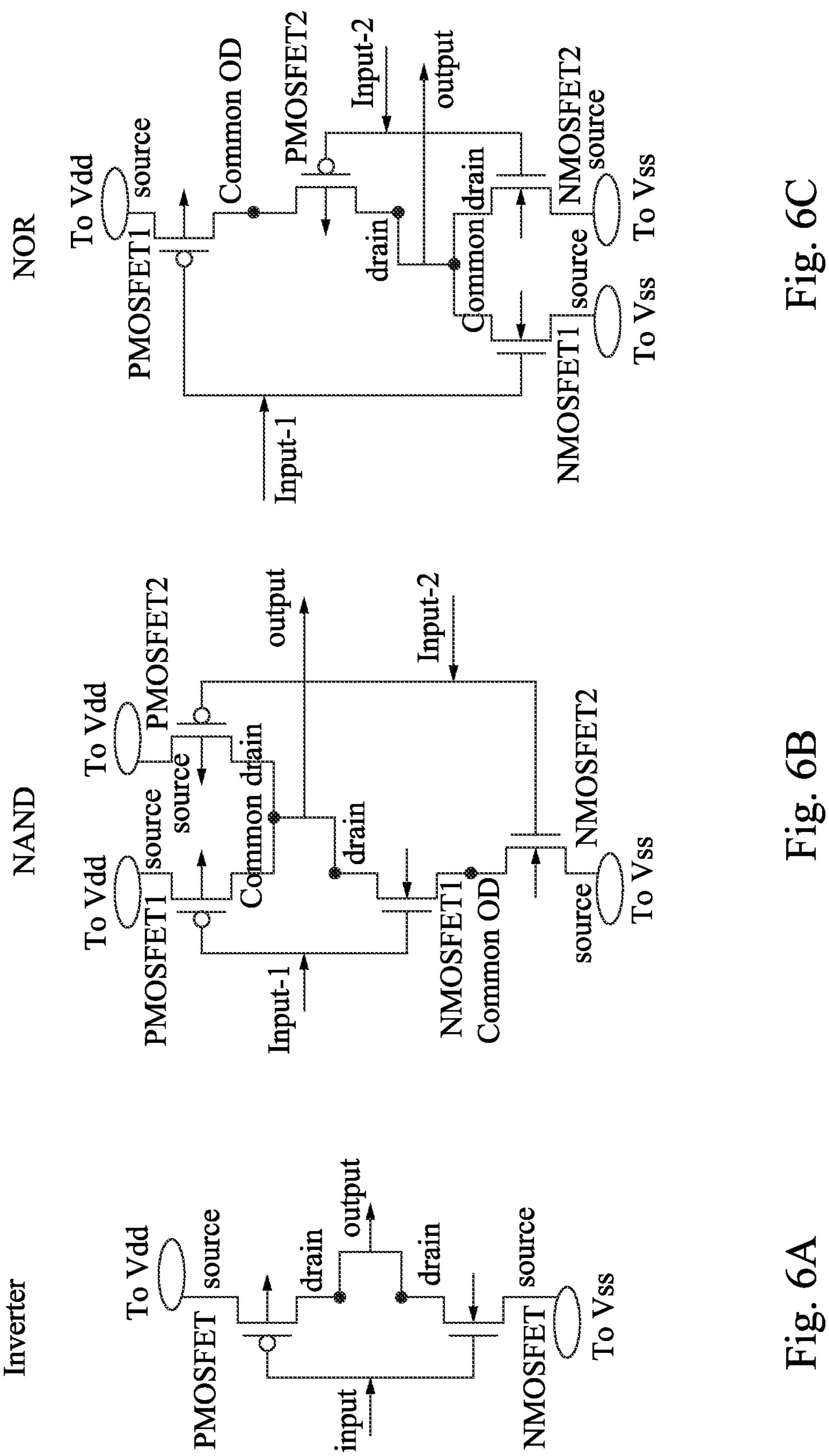
FIGS. 6A to 6E are circuit schematics of various logic gates according to some embodiments of the present disclosure.
Figure 6D:
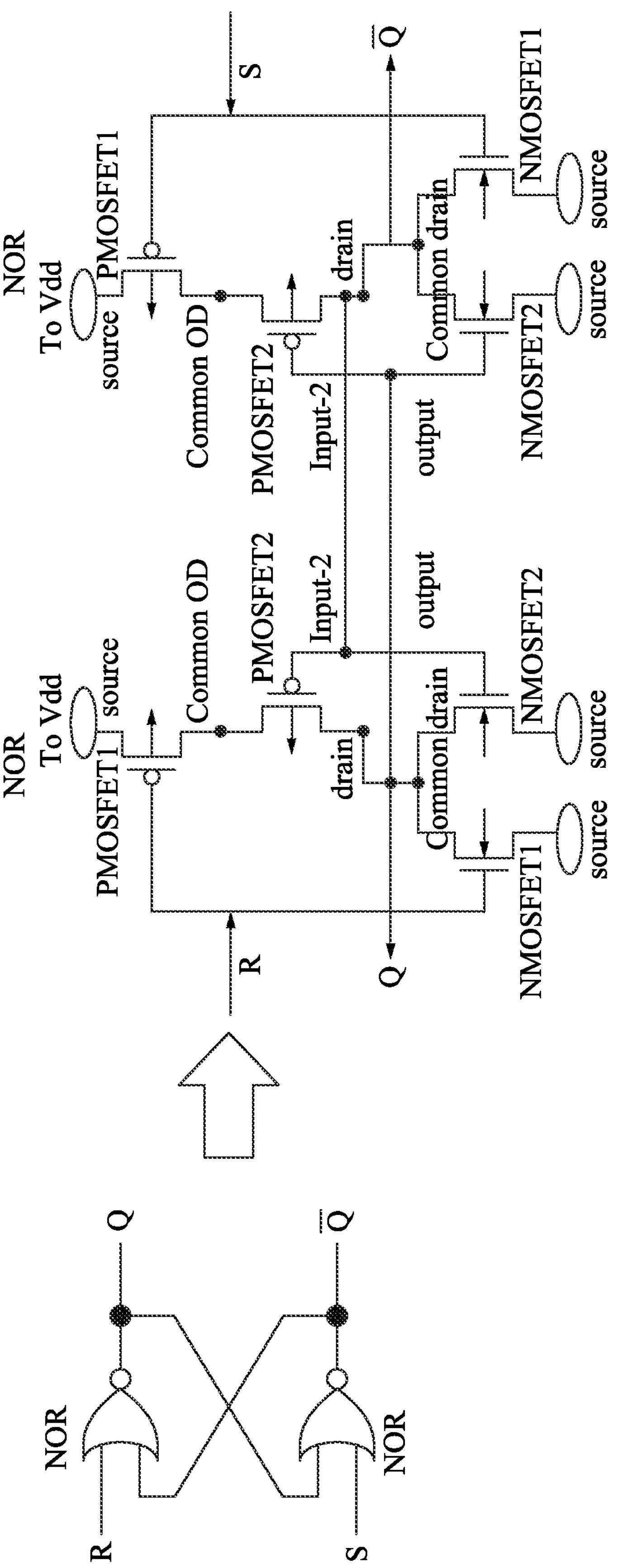
Figure 6E:
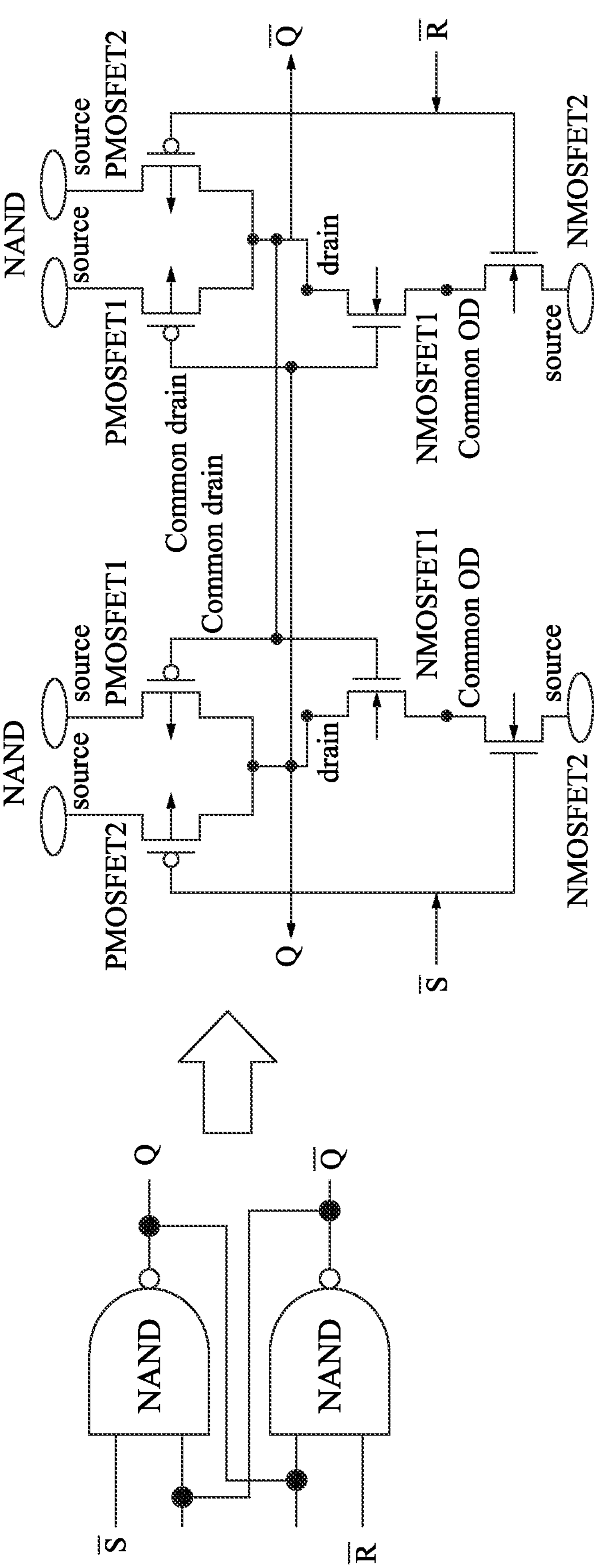

As examples, the logic gates shown in FIGS. 6A, 6B, and 6C include inverter, NAND, and NOR circuit schematics, respectively, and the logic gates shown in FIGS. 6D and 6E include Flip-Flop circuit schematics for NOR and NAND. It is understood that the top view layout of FIGS. 6A-6E may correspond to one or more of the circuit region shown in FIGS. 2A and 2B. The particular type of logic gate is determined by coupling the gate, source, and drain of the NMOSFETs and PMOSFETs in a specific configuration as shown in FIGS. 6A-6E. The input terminal and output terminal of each logic gate is also labeled in FIGS. 6A-6E as such. In the example configuration in FIGS. 6A-6E, many aspects of the channels, the gate electrode layers, gate dielectric layers, and gate spacers, etc. of the circuit schematics are the same as or similar to those shown in FIGS. 2A-3H. By way of example but not limiting the present disclosure, the first logic circuit region 10A may have a NAND circuit, and the second circuit region 10B may have an inverter.

In some embodiments, the logic circuit 110 may include transistors in a first conductivity type device region 10C and a second conductivity type device region 10D. In some embodiments, the transistors in the first conductivity type device region 10C may be NMOSFET transistors with silicon channel regions, and the transistors in the second conductivity type device region 10D may be PMOSFET transistors with silicon channel regions. In some embodiments, the transistors may be GAA FETs. The silicon channel regions of the NMOS and PMOS transistors are formed by semiconductor sheets 210. The semiconductor sheets 210 are stacked along the Z-direction (not shown) and are wrapped by the gate electrode, and the Z-direction is perpendicular to the plane formed by the X-direction and Y-direction.

As shown in FIGS. 2A and 2B, the logic circuit 110 includes dielectric-base gates 225 extending in the Y-direction. The logic circuit 110 further includes gate electrodes 220 extending in the Y-direction and being arranged between adjacent two of the dielectric-base gates 225. The transistors are surrounded by the dielectric-base gates 225. In other words, the dielectric-base gates 225 are formed in the boundary of the first logic circuit region 10A and in the boundary of the second circuit region 10B. Moreover, one of the dielectric-base gates 225 between the first and second logic circuit regions 10A and 10B is shared by the first and second logic circuit regions 10A and 10B, i.e., the first logic circuit region 10A and the second circuit region 10B in the same row are isolated (or separated) from each other by said dielectric-base gate 225. The material of the dielectric-base gates 225 is different from that of the gate electrodes 220. In some embodiments, the dielectric-base gates 225 can be interchangeably referred to dummy gates, dummy gate pattern, dummy gate strip, isolation structures/dielectric gates serving as circuit boundaries. Also included in FIGS. 2A and 2B, spacers 233 are formed on sidewalls of the dielectric-base gates 225 and the gate electrodes 220.

As shown in FIG. 2A illustrating the logic circuit 110 on the front side of the semiconductor structure/wafer, the gate electrodes 220 are connected to an overlying level (e.g., metal line F-M1) through gate vias 250. A source/drain region 218 (see FIGS. 3A-3C and 3G) between corresponding two of the gate electrodes 220 and the dielectric-base gates 225 is electrically coupled to an overlying metal lines F-M1 through a source/drain contact 240 and a source/drain via 242, or electrically coupled to an overlying power supply voltage line F-M1-Vdd/F-M1-Vss through a power supply voltage contact 244 and a conductive via 246. In some embodiments, the power supply voltage line F-M1-Vdd can be interchangeably referred to as a Vdd line that is provided with positive a power supply voltage Vdd, and the power supply voltage line F-M1-Vss can be interchangeably referred to as a Vss line that is provided with power supply voltage Vss. In some embodiments, the cell can be powered through the positive power supply node Vdd that has a positive power supply voltage (also denoted as VDD). The cell can be also connected to power supply voltage Vss (also denoted as VSS), which may be an electrical ground. In some embodiments, the power supply voltage contact 244 can be interchangeably referred to as a Vss/Vdd contact. In some embodiments, the source/drain region 218 can be interchangeably referred to as a power conductor connection.

Throughout the description, the notations of metal lines may be followed by the metal line levels they are in, wherein the respective metal line level is placed in parenthesis. As shown in FIG. 2A, metal lines disposed at the M1 level on the front-side of the semiconductor structure may include the power supply voltage lines F-M1-Vdd and F-M1-Vss and the metal lines F-M1 laterally between the power supply voltage lines F-M1-Vdd and F-M1-Vdd. The metal lines disposed at the M1 level on the front-side of the semiconductor structure may have lengthwise directions parallel to the X-direction (e.g., column direction). In some embodiments, the power supply voltage line F-M1-Vdd/F-M1-Vss disposed at the M1 level can be interchangeably referred to a power supply voltage landing pad or a power supply voltage landing line. In some embodiments, the lines can be interchangeably referred to metal layers, conductive lines, conductive layers, or conductors. The back-side of the semiconductor structure may further include M2 level underlying the M1 level. The back-side M2 level may include power supply voltage lines F-M2-Vdd and F-M2-Vss (not shown) electrically connected to power supply voltage lines F-M1-Vdd and F-M1-Vss in back-side M1 level. The power supply voltage lines F-M2-Vdd and F-M2-Vss back-side M2 level can extend in a direction perpendicular to lengthwise directions of the power supply voltage lines F-M1-Vdd and F-M1-Vss in back-side M1 level.

As shown in FIG. 2B illustrating the logic circuit 110 on the back side of the semiconductor structure, the source/drain region 218 (see FIGS. 3A and 3G) between the gate electrode 220 and the dielectric-base gates 225 is coupled to an underlying power supply voltage line B-M1-Vdd/B-M1-Vss through a conductive via 248. Throughout the description, the notations of metal lines may be followed by the metal line levels they are in, wherein the respective metal line level is placed in parenthesis. As shown in FIG. 2B, metal lines disposed at the M1 level on the back-side of the semiconductor structure may include the power supply voltage lines B-M1-Vss, and B-M1-Vss. The metal lines disposed at the M1 level on the back-side of the semiconductor structure may have lengthwise directions parallel to the X-direction (e.g., column direction). In some embodiments, the power supply voltage line B-M1-Vss/B-M1-Vdd disposed at the M1 level on the back-side of the semiconductor structure can be interchangeably referred to a power supply voltage landing pad or a power supply voltage landing line. In some embodiments, the lines can be interchangeably referred to metal layers, conductive lines, conductive layers, or conductors. In some embodiments, the back-side conductive via 248 can be interchangeably referred to a power conductor.

The back-side power supply voltage line B-M1-Vdd/B-M1-Vss is electrically connected to the front-side power supply voltage line F-M1-Vdd/F-M1-Vss through the back-side conductive via 248, the source/drain region 218 (see FIGS. 3A and 3G), the front-side power supply voltage contact 244, and the front-side conductive via 246. As shown in FIG. 3A, the front-side power supply voltage contact 244 lands on a front-side 218*p* of the source/drain region 218 and further downwardly extends to the back-side conductive via 248 passing through a shallow trench isolation (STI) structure 251 (see FIG. 3A). That is, the back-side conductive via 248 can be in contact with the source/drain region 218 (see FIG. 3A) and the front-side power supply voltage contact 244 (see FIG. 3A) at the same time. The front-side power supply voltage contact 244 can have a first portion 244*a* formed on a top surface 218*t* of the source/drain region 218 and a second portion 244*b* formed on a sidewall 218*s* of the source/drain region 218 from the cross sectional view. In some embodiments, the first portion 244*a* of the power supply voltage contact 244 can be interchangeably referred to a front-side of the power supply voltage contact 244, and the second portion 244*b* of the power supply voltage contact 244 can be interchangeably referred to a back-side of the power supply voltage contact 244. On the other hand, the source/drain region 218 is partially embedded in a back-side 244*b* of a back-side 244*b* of the power supply voltage contact 244, and the conductive via 248 is in contact with the back-side 244*b* of the power supply voltage contact 244. In some embodiments, the power supply voltage contact 244 can have a greater height H1 than a height H2 of the source/drain region 218. In some embodiments, as shown in FIG. 3B, the back-side conductive via 248 can be spaced apart from the source/drain region 218 by a back-side dielectric 331 and electrically connected to the source/drain region 218 through the front-side power supply voltage contact 244. The back-side dielectric 331 is sandwiched between the source/drain regions 218 and the back-side conductive vias 248. In some embodiments, materials of the power supply voltage lines F-M1, F-M1-Vdd, F-M1-Vss, B-M1-Vdd, B-M1-Vss, the conductive via 246, 248, and/or the contact 244 of the semiconductor structure may be made of Cu, Co, Ru, Pt, Al, W, Ti, TaN, TiN, or any combinations thereof.

In some embodiments, the layouts as shown in FIGS. 2A and 2B are represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

The present disclosure provides a metal line routing method to improve the functional density and operation performance on the IC structure. The conductive via 248 is moved to wafer back-side to reduce the routing loading and further decrease the logic cell area. The source/drain region 218 (see FIGS. 3A, 3B, and 3G) can be served as a power conductor path that connects metal layers (e.g., power supply voltage lines Vdd, Vss) on wafer front-side and wafer back-side, such that an area to serve as an additional connection area for front-side and back-side metal layers can be removed, which in turn saves to provide an extra strap area and a connection manufacturing process for the power conductor path. In addition, the present disclosure provides a robustness power mesh in the cell region. Specifically, front-side and back-side of the wafer both can have power supply voltage lines Vss, Vdd. For example, the front-side M1 level and back-side M1 level of the wafer can serve for power supply voltage lines Vss, and other metal levels on the wafer back-side can have Vss power mesh conductor, such that a capability for cell scaling down and RC reduction of the IC structure can be achieved.

In some embodiments, an upper portion of the source/drain region 218 (see FIGS. 3A, 3B, and 3G) has a greater surface area and a higher dopant concentration than a lower portion thereof, and thus a connection between the upper portion of the source/drain region 218 and a conductive material (e.g., back-side conductive via 248, front-side power supply voltage contact 244) can have a lower resistance-capacitance (RC) than a connection between the lower portion of the source/drain region and the conductive material (e.g., back-side conductive via 248, front-side power supply voltage contact 244). For example, the conductive via 248 can be electrically connected to the source/drain region 218 through the front-side power supply voltage contact 244 having a contact area with the upper portion of the source/drain region 218 (see FIGS. 3A and 3B), such that a contact resistance for a source node to Vdd/Vss connection can be improved. In some embodiment, the conductive via 248 can be further in contact with the source/drain region 218 (see FIG. 3A), such that the contact resistance for the source node to Vdd/Vss connection can be further improved.

In some embodiments, a dopant in the source/drain region 218 (see FIGS. 3A, 3B, 3C, and 3G) of the first conductivity type device region 10C has an opposite conductivity type to the second conductivity type device region 10D. For example, the source/drain region 218 of the first conductivity type device region 10C may have an n-type dopant, and the source/drain region 218 of the second conductivity type device region 10D may have a p-type dopant. In some embodiments, the source/drain regions 218 of the first conductivity type device region 10C may include SiP, SiC, SiPC, SiAs, Si, or a combination thereof. In some embodiments, the source/drain region 218 of the first conductivity type device region 10C may have a phosphorus concentration within a range from about 2E19/$cm^3$ to about 3E21/$cm^3$. In some embodiments, an upper portion of the source/drain region 218 of the first conductivity type device region 10C may have a greater phosphorus concentration than a lower portion thereof. In some embodiments, the source/drain region 218 (see FIGS. 3A, 3B, 3C, and 3G) of the second conductivity type device region 10D may have a boron concentration within a range from about 1E19/$cm^3$ to about 6E20/$cm^3$. In some embodiments, the source/drain region 218 of the second conductivity type device region 10D may have a Ge atomic percentage within a range of about 36% to about 85%. In some embodiments, an upper portion of the source/drain region 218 of the second conductivity type device region 10D may have a greater boron concentration than a lower portion thereof.

Figure 3D:
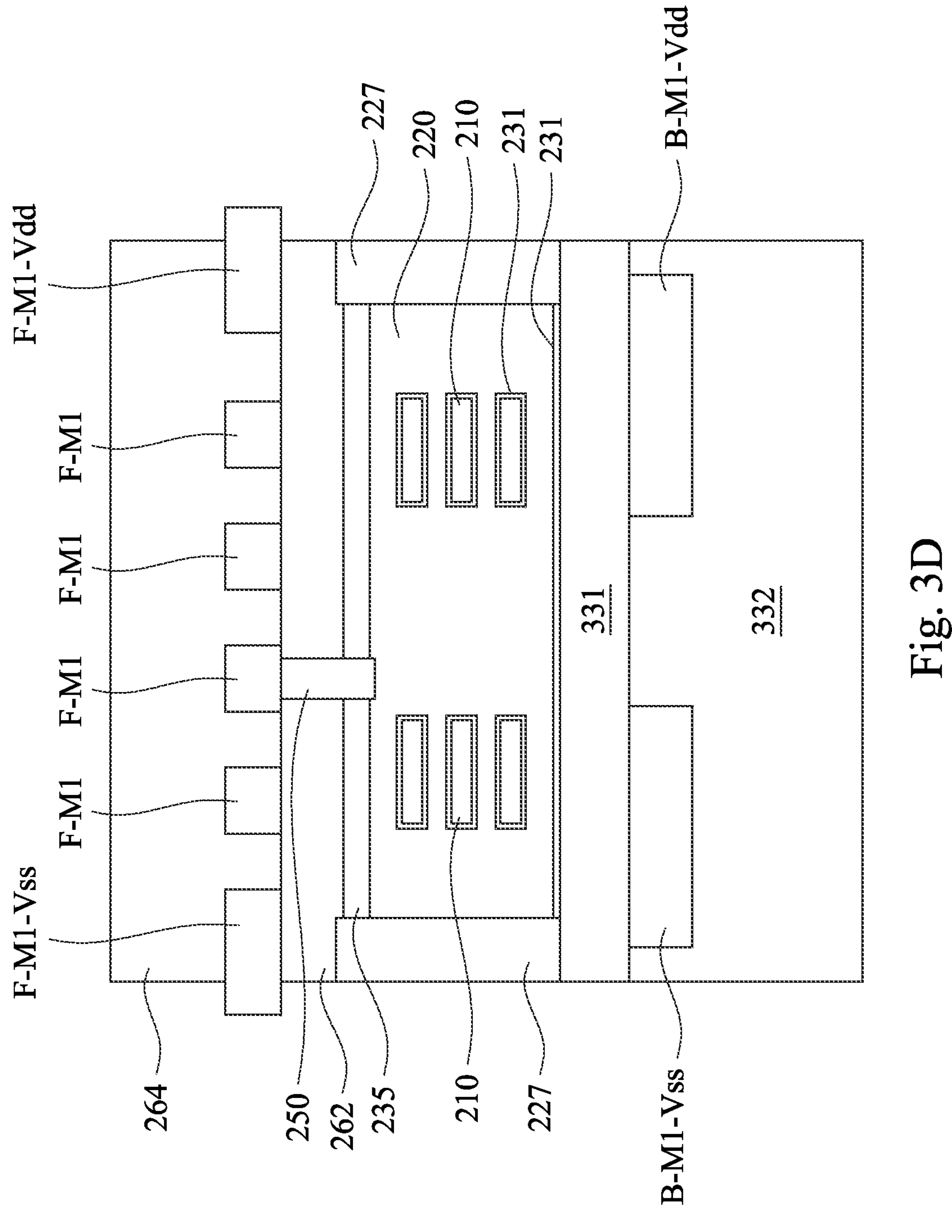
Figure 3E:
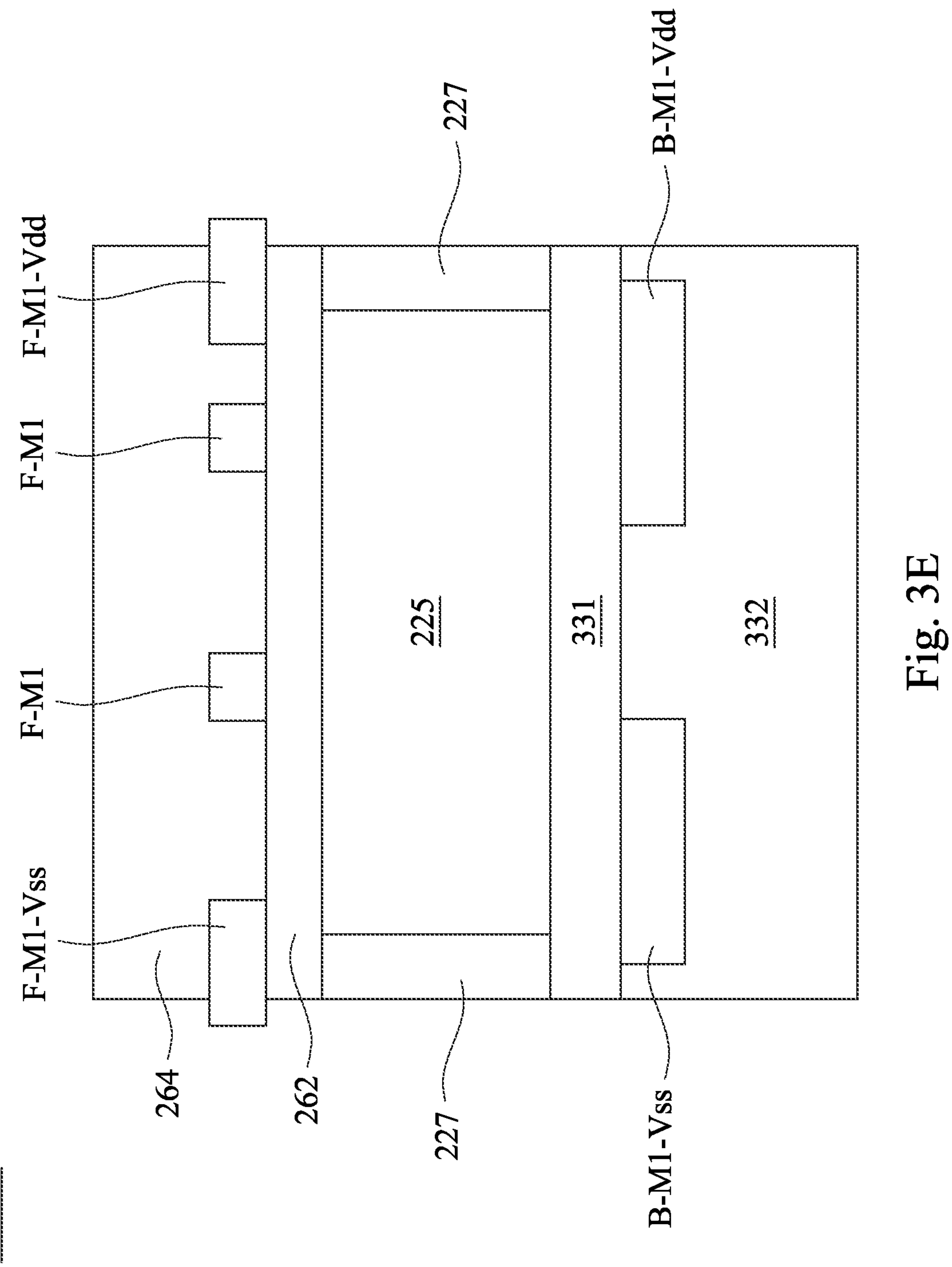
Figure 3F:
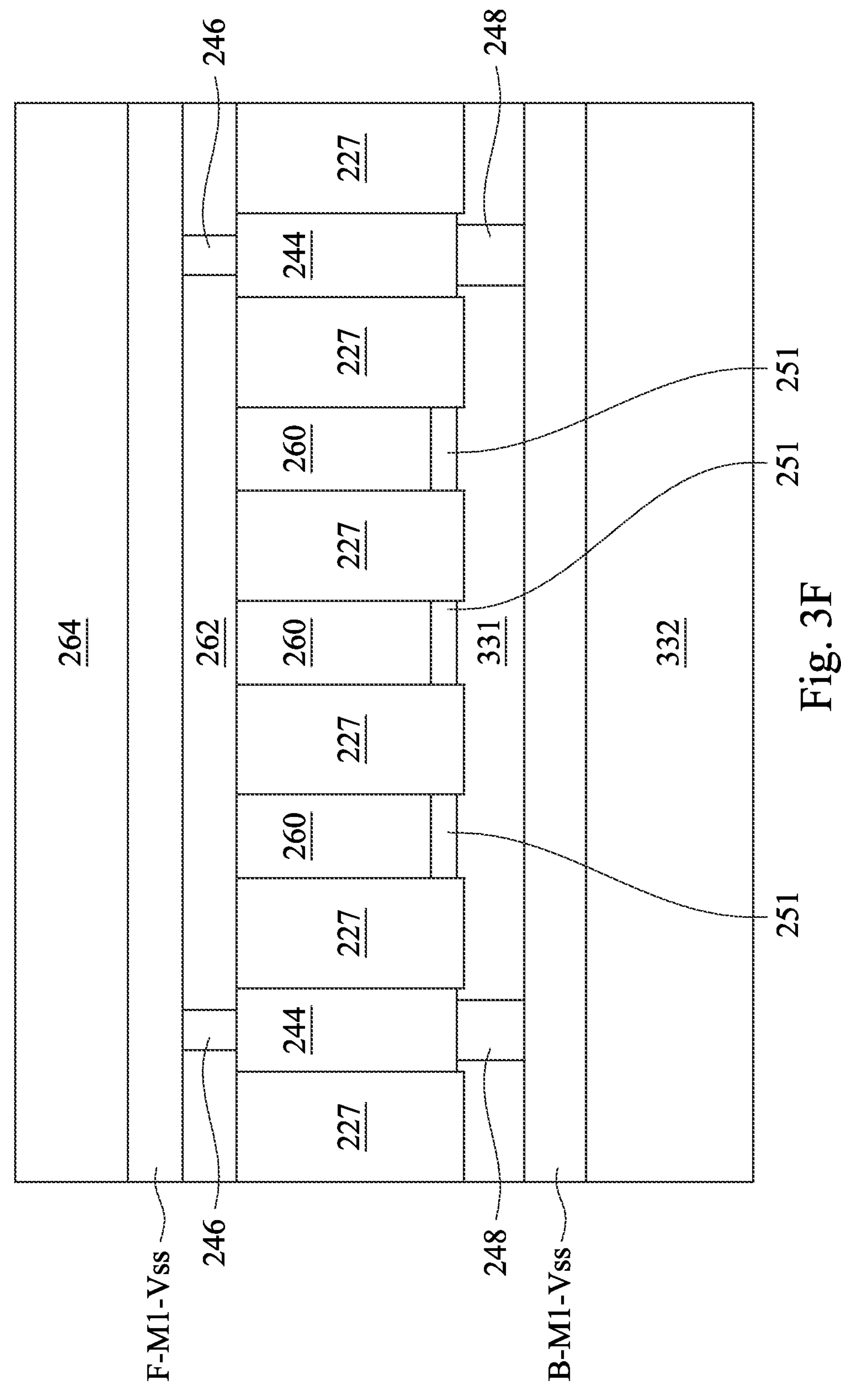
Figure 3G:
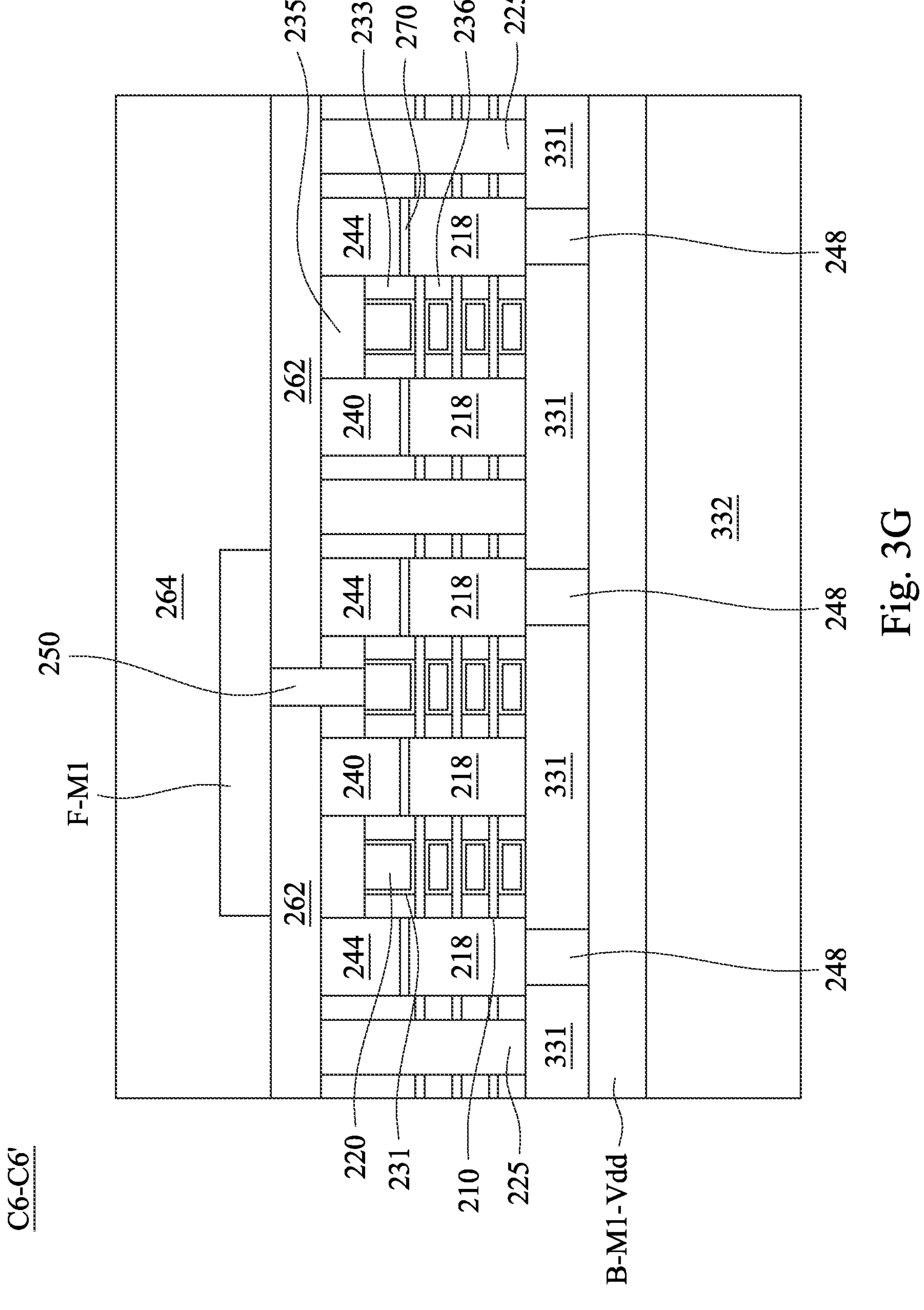
Figure 3H:
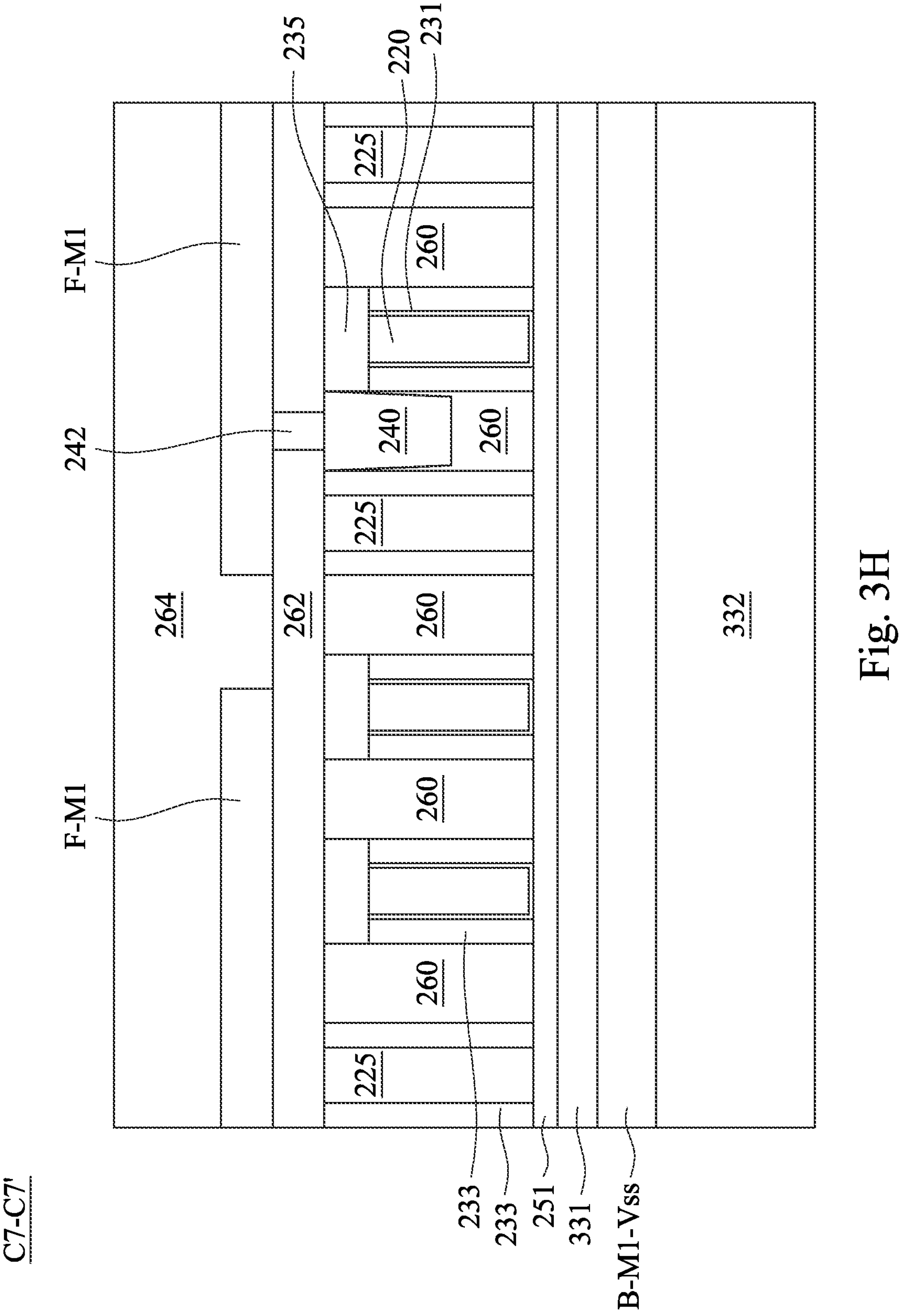

In FIGS. 3G and 3H, gate spacers 233 are formed on the sidewalls of the gate electrode layers 220. In some embodiments, the gate spacer 233 may be made of silicon nitride or silicon oxynitride, although any suitable material, such as low-dielectric constant (low-k) materials having a k-value less than about 3.5, may be utilized. In FIG. 3G, inner spacers 236 can act as isolation features and may be formed between the source/drain regions 218 and the gate electrode layers 220. In some embodiments, the inner spacers 236 can be interchangeably referred to lower gate spacers. In some embodiments, the inner spacers 236 may have a lateral dimension in a range from about 4 nm to about 12 nm. In some embodiments, the inner spacers 236 may be made of silicon nitride or silicon oxynitride, although any suitable material, such as low-dielectric constant (low-k) materials having a k-value less than about 3.5, may be utilized. In some embodiments, the inner spacers 236 may be air gaps. In some embodiments, the inner spacer 236 may have a higher K (dielectric constant) value than the gate spacer 233.

In FIGS. 3D, 3G, and 3H, hard mask layers 235 are formed over the gate electrode layers 220. In some embodiments, the hard mask layer 235 can be interchangeably referred to a gate top dielectric. In some embodiments, the hard mask layer 235 may be made of dielectric material, such as $SiO_2$, $Si_3N_4$, SiON, SiOC, SiOCN base dielectric material, or combinations thereof. In FIGS. 3D, 3E, and 3F, dielectric regions 227 are formed on opposite ends of the gate electrode layers 220. In some embodiments, each dielectric region 227 is a gate-cut structure for the gate structure, and the gate-cut structure is formed by a cut metal gate (CMG) process.

In FIGS. 3A-3C and 3F-3H, an inter-layer dielectric (ILD) layer 260 is formed between the gate electrode layers 220 and over the source/drain regions 218. An ILD layer 262 is formed over the hard mask layers 235 and the ILD layer 260 and laterally surrounds the gate vias 250 and the source/drain vias 242. An inter-metal dielectric (IMD) layer 264 is formed over the ILD layer 262 and can provide electrical insulation as well as structural support for the various features therein, such as the metal line F-M1, the power supply voltage lines F-M1-Vdd, F-M1-Vss. In some embodiments, the ILD layer 260, the ILD layer 262, and/or the IMD layer 264 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

In FIGS. 3A-3G, the back-side dielectric 331 and an IMD layer 332 are deposited over the source/drain regions 218 in sequence. The back-side conductive vias 248 are formed in the back-side dielectric 331. The power supply voltage lines B-M1-Vdd, B-M1-Vss are formed in the IMD layer 332. The back-side dielectric 331 may be made of an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. The IMD layer 332 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

Figure 4A:
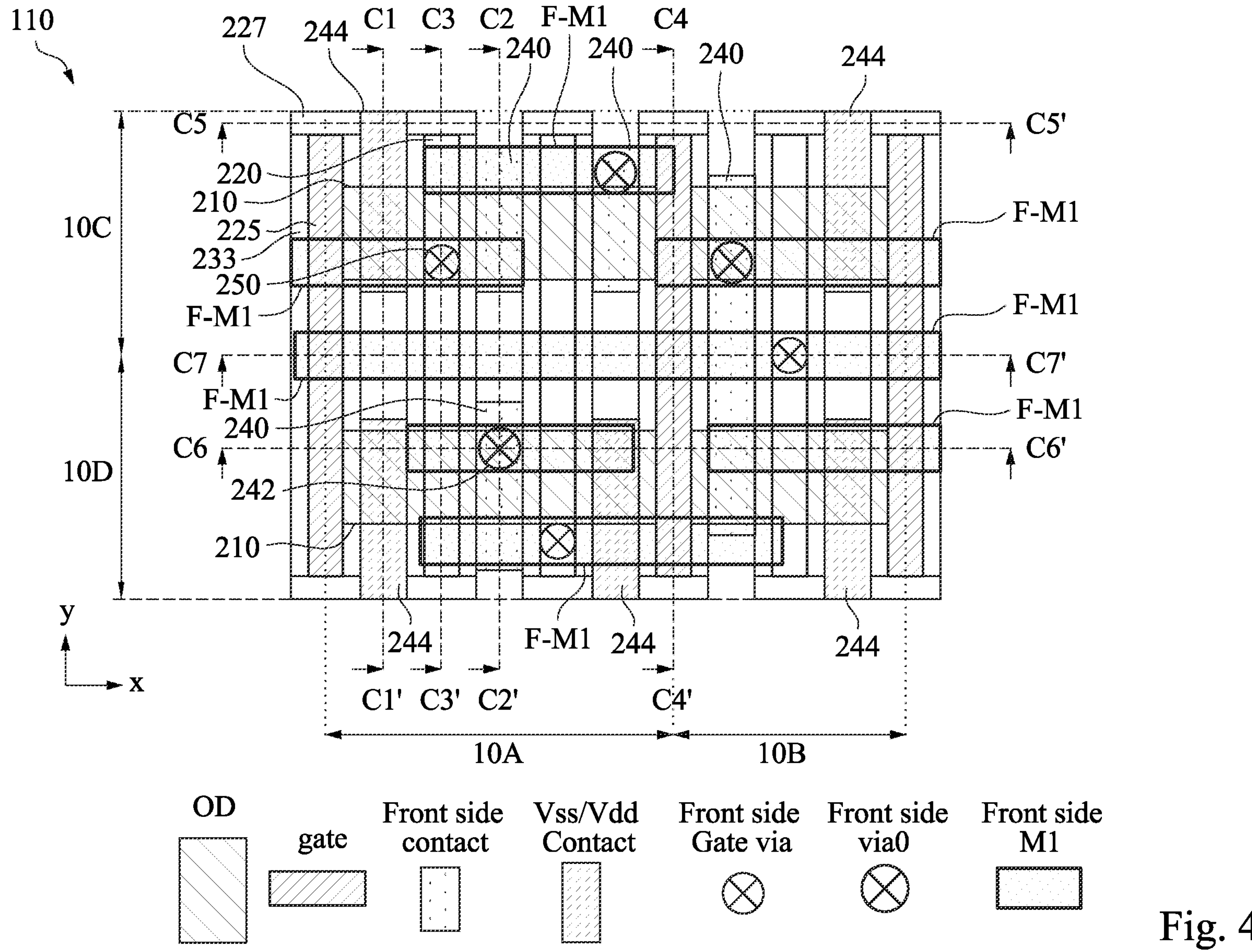
FIGS. 4A and 4B illustrate a cell layout diagram of a logic circuit on a front side and a back side of a semiconductor structure, respectively, according to some embodiments of the present disclosure.
Figure 4B:
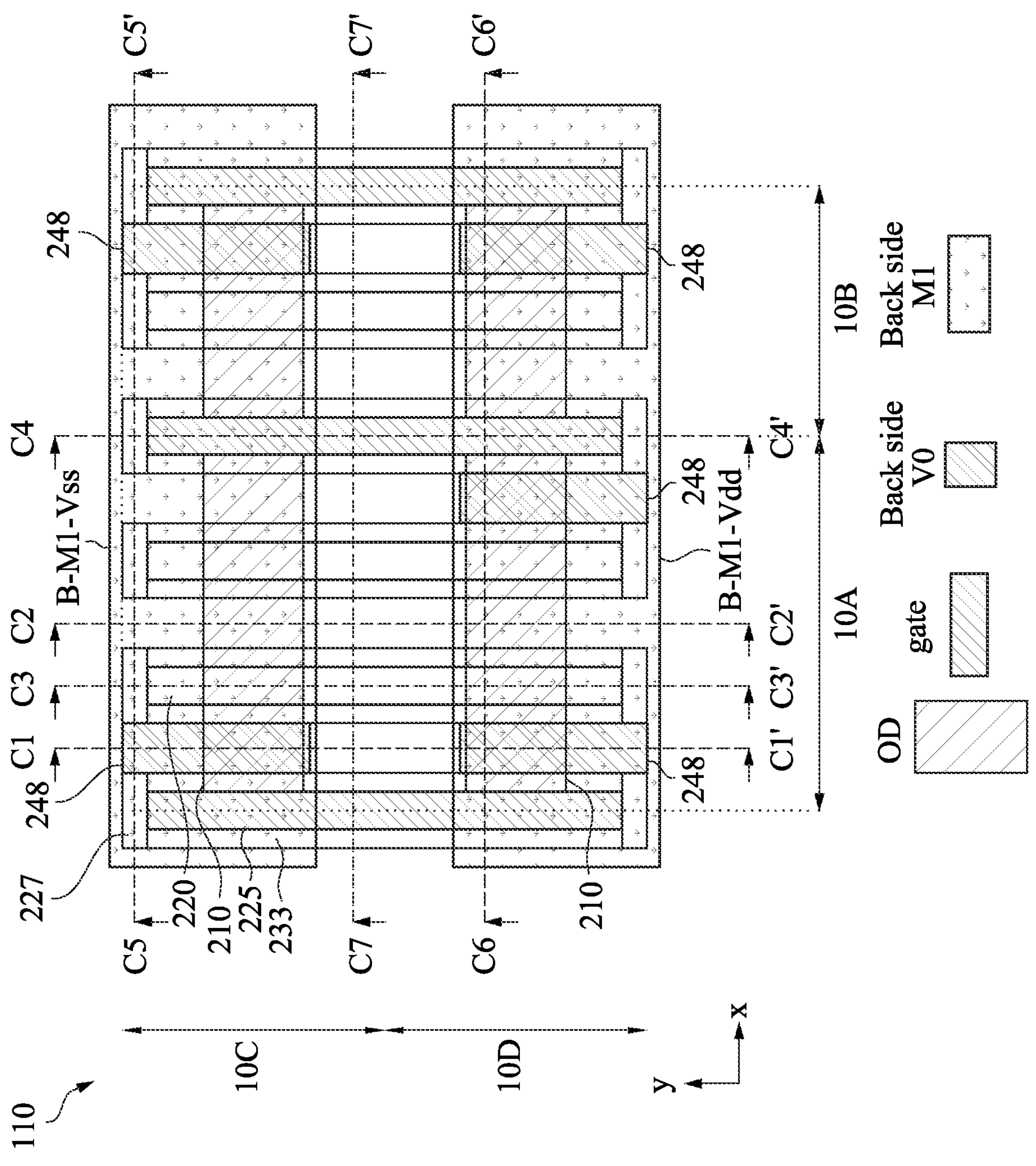
Figure 5A:
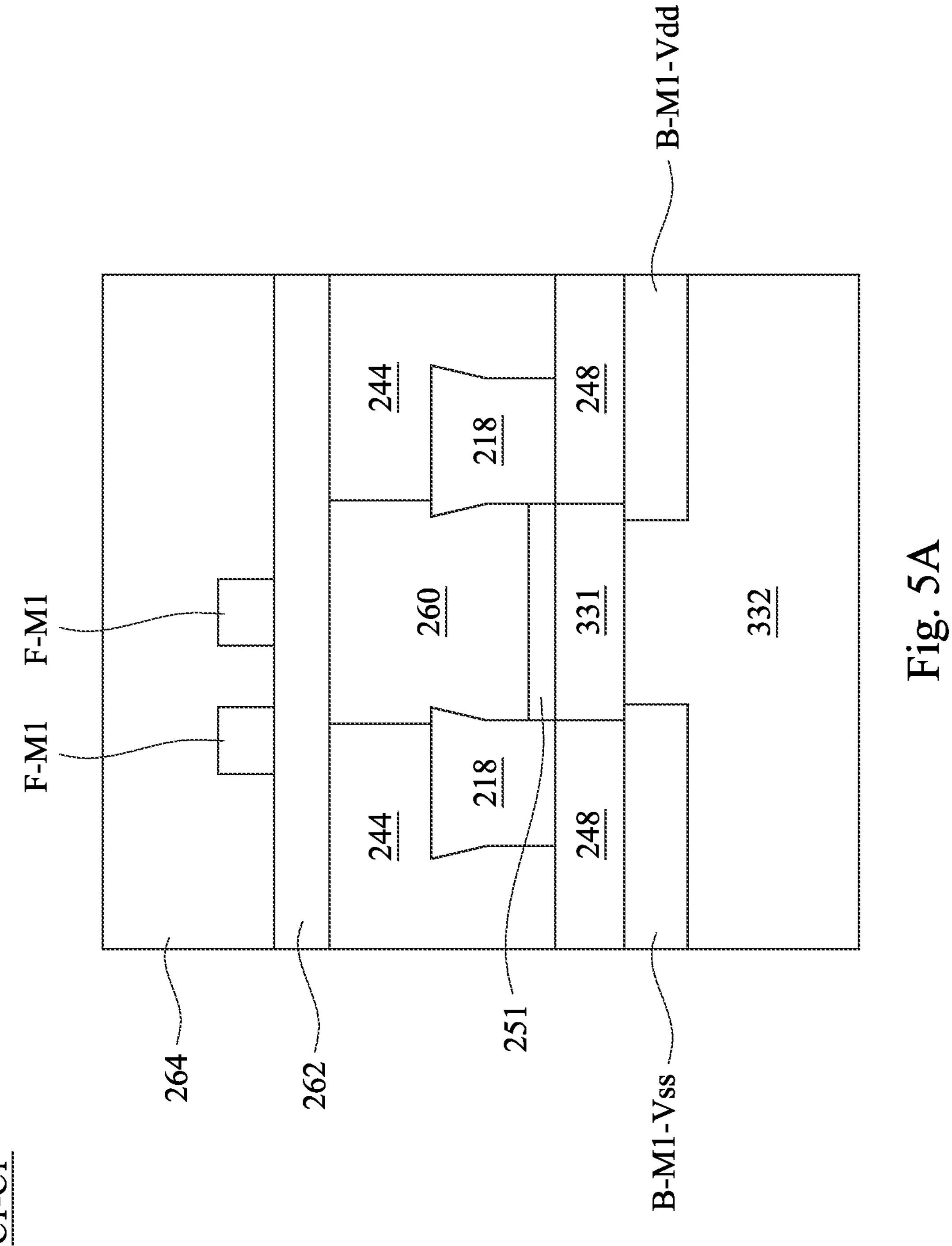
FIGS. 5A and 5C-5H illustrate cross-sectional views obtained from reference cross-section C1-C1', C2-C2', C3-C3', C4-C4', C5-C5', C6-C6', and C7-C7' in FIGS. 4A and 4B.
Figure 5B:
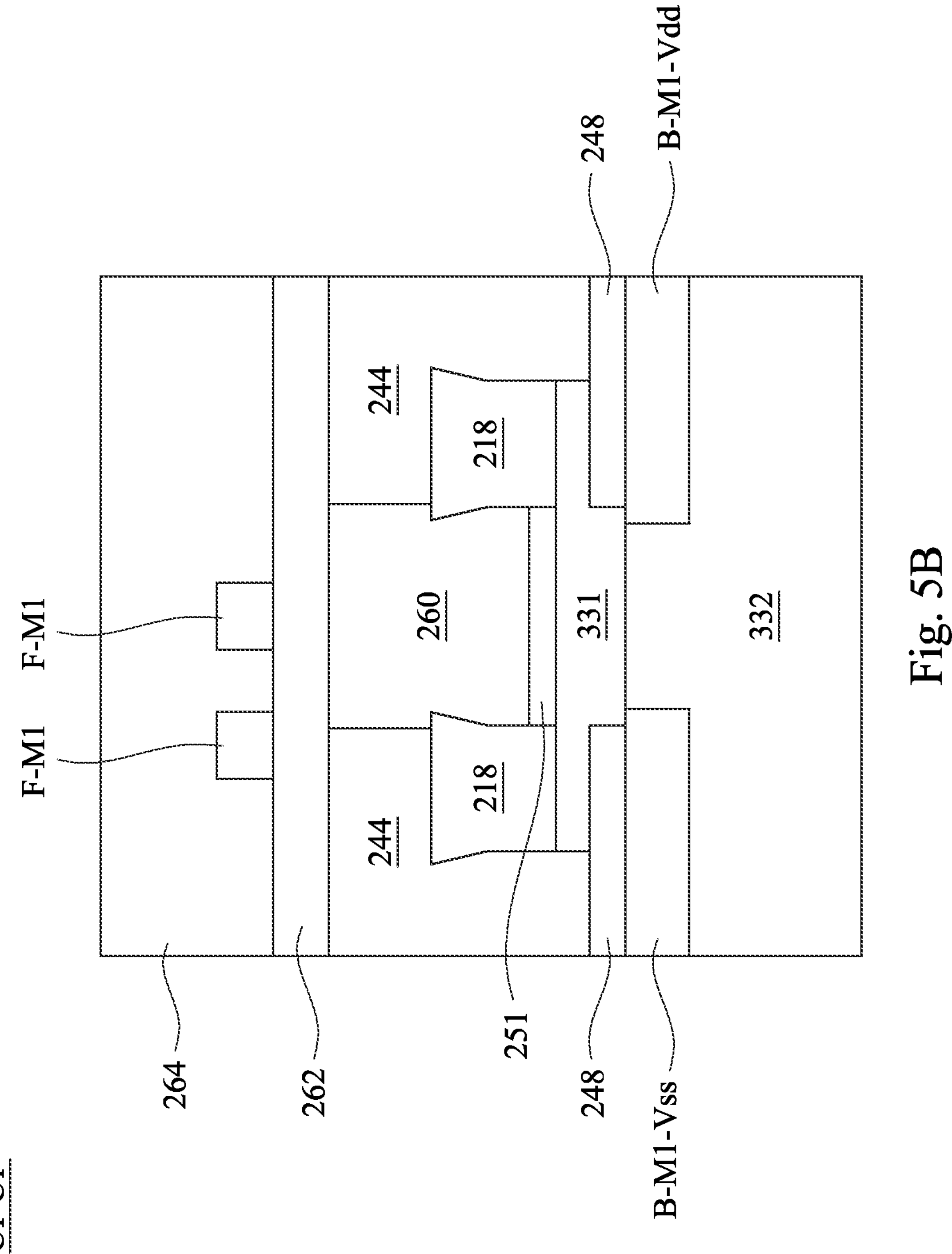
FIG. 5B illustrates a cross-sectional view of a semiconductor structure corresponding to FIG. 5A according to some embodiments of the present disclosure.
Figure 5C:
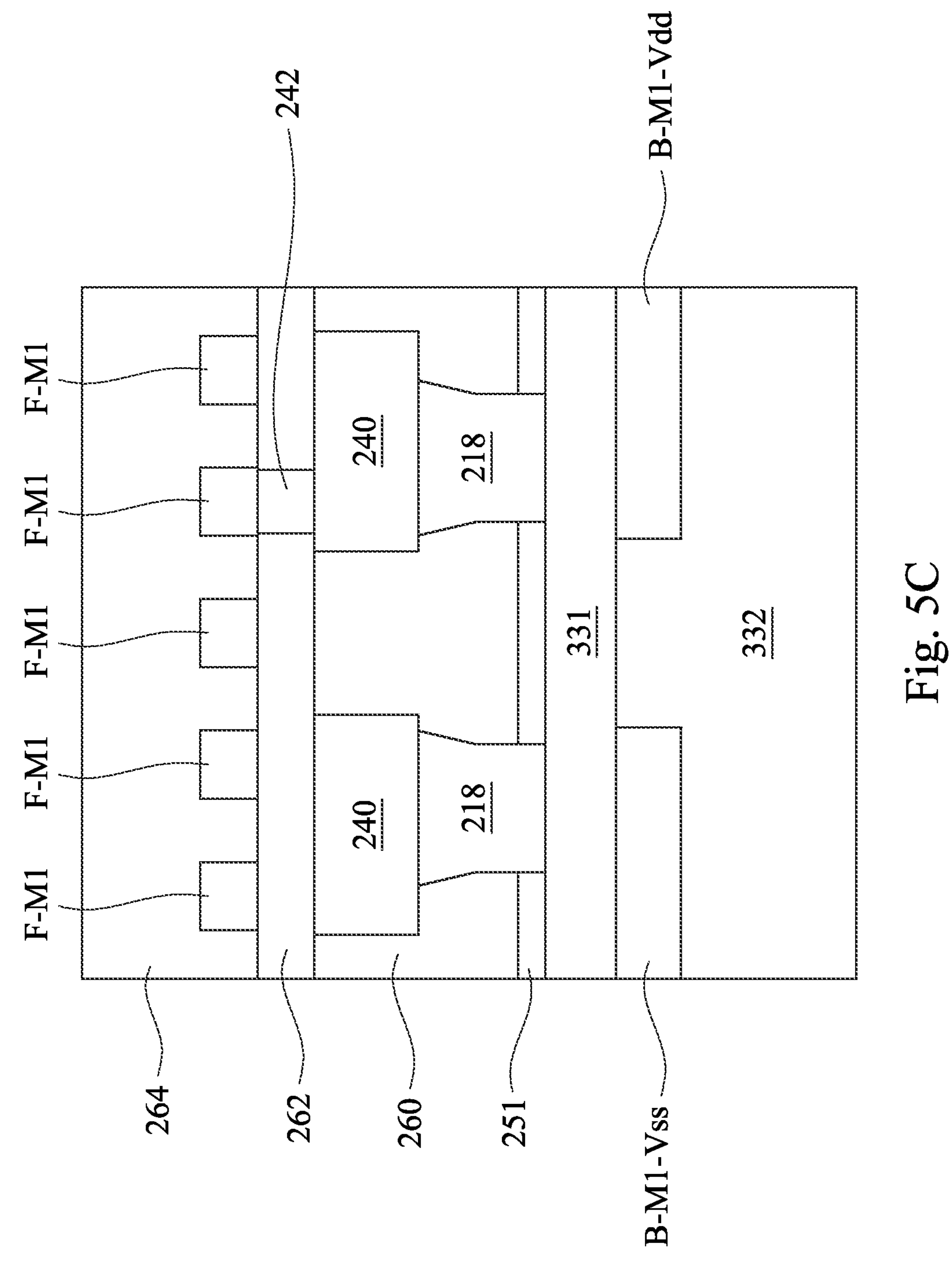
Figure 5D:
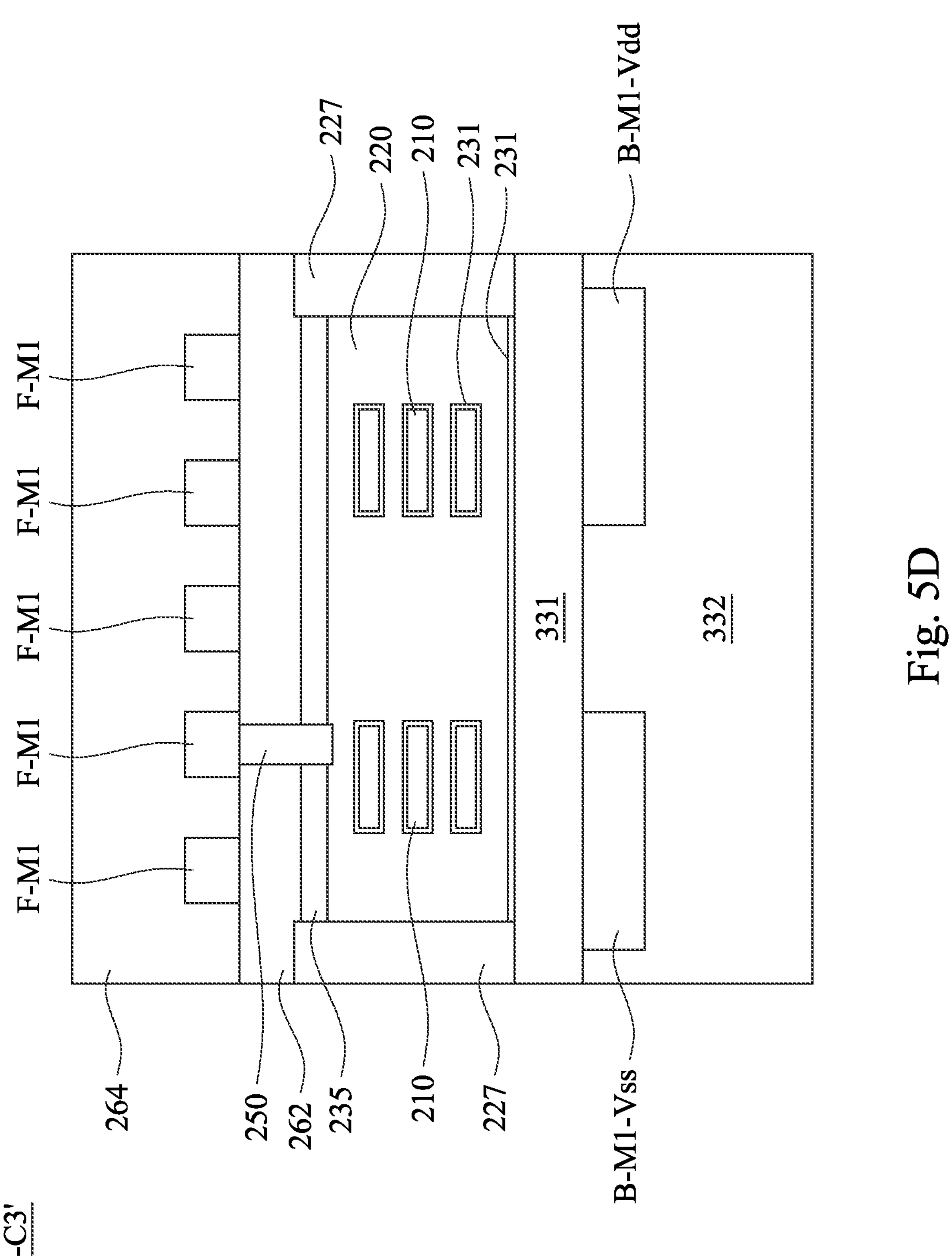
Figure 5E:
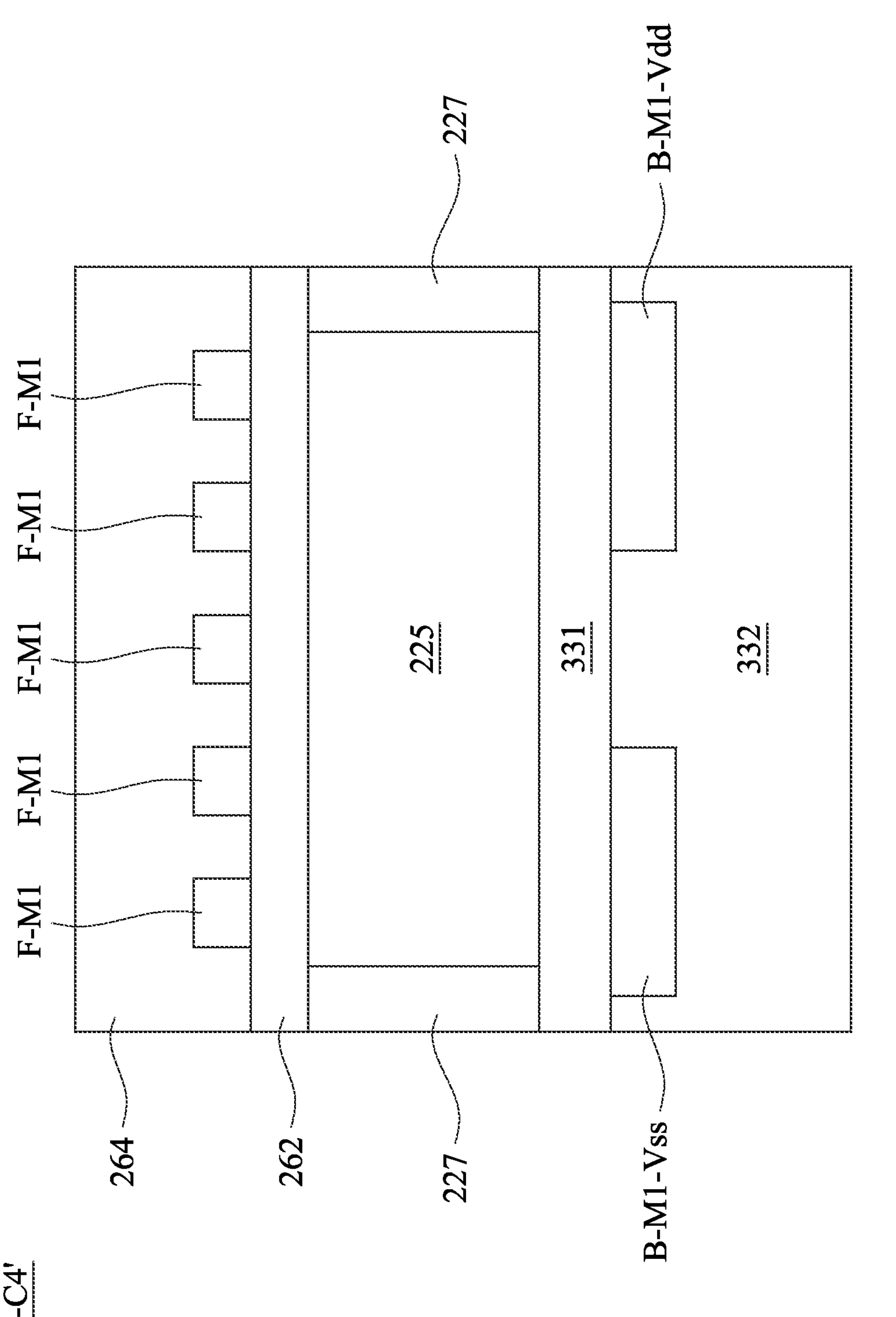
Figure 5F:
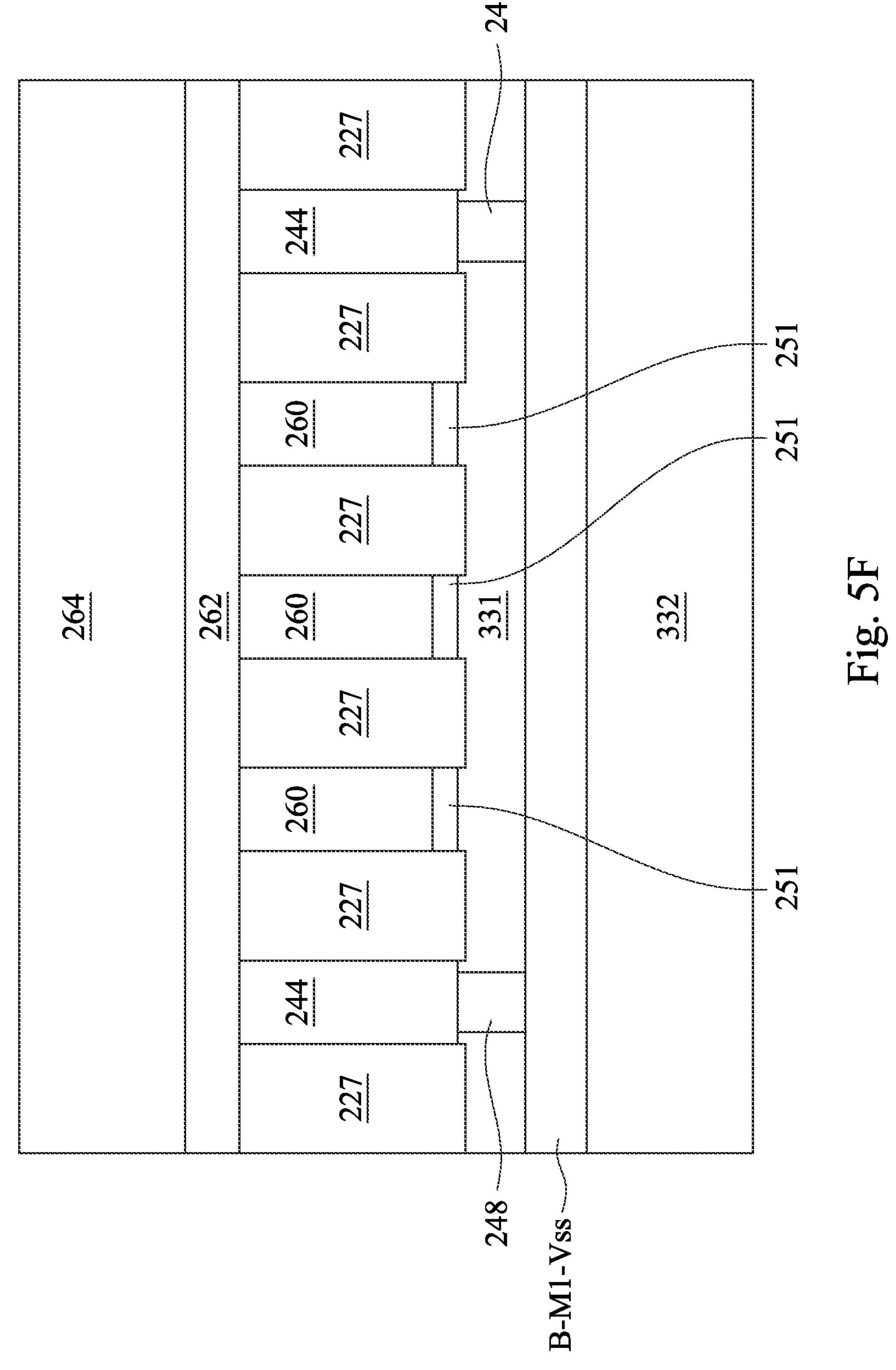
Figure 5G:
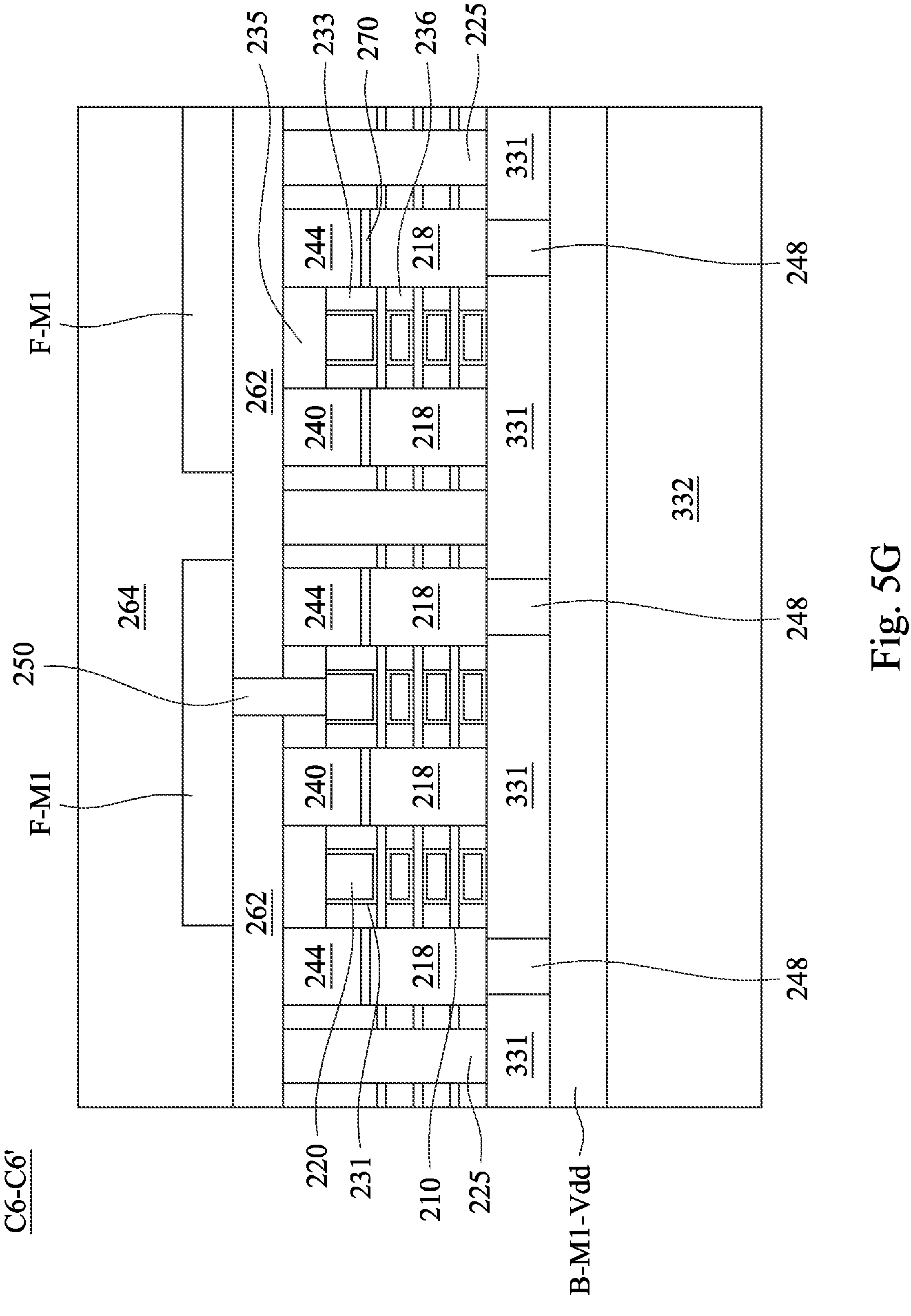
Figure 5H:
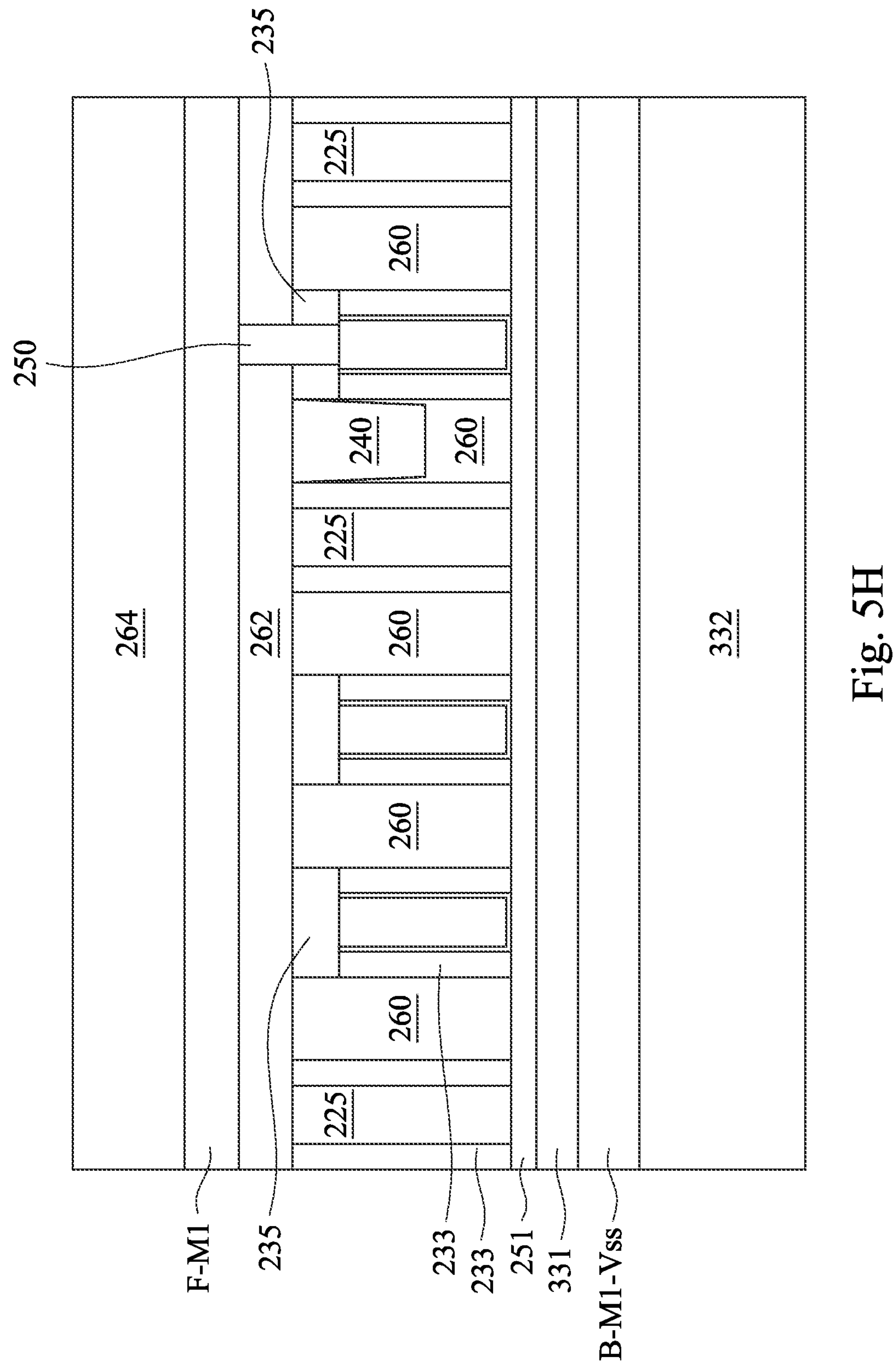

Reference is made to FIGS. 4A-5H. FIGS. 4A and 4B illustrate a cell layout diagram of a logic circuit on a front side and a back side of a semiconductor structure, respectively, according to some embodiments of the present disclosure. FIGS. 5A and 5C-5H illustrate cross-sectional views obtained from reference cross-section C1-C1', C2-C2', C3-C3', C4-C4', C5-C5', C6-C6', and C7-C7' in FIGS. 4A and 4B. FIG. 5B illustrates a cross-sectional view of a semiconductor structure corresponding to FIG. 5A according to some embodiments of the present disclosure. While FIGS. 4A-5H show an embodiment of the semiconductor structure with a different metal line routing method than the semiconductor structure in FIGS. 2A-3H. In addition, the present disclosure may repeat reference numerals and/or letters in the various examples. This repetition is for the purpose of simplicity and clarity and does not in itself dictate a relationship between the various embodiments and/or configurations discussed. It is noted that, the difference between the present embodiment and the embodiment in FIGS. 2A-3H is in that the wafer front-side is free of power supply voltage lines F-M1-Vdd, F-M1-Vss and the conductive via 246. As shown in FIGS. 5A and 5B, the back-side power supply voltage line B-M1-Vdd/B-M1-Vss is electrically connected to the source/drain region 218 through the conductive via 248 and the front-side power supply voltage contact 244. In FIG. 5A, the front-side power supply voltage contact 244 lands on the source/drain region 218 and further downwardly extends to the back-side conductive via 248 through a shallow trench isolation (STI) structure 251. That is, the back-side conductive via 248 can be in contact with the source/drain region 218 and the front-side power supply voltage contact 244 at the same time. In some embodiments, and 5B, the semiconductor structure shown in FIGS. 4A-5H is free of power supply voltage lines on the front-side thereof, and thus the front-side of the front-side power supply voltage contact 244 is free from being in contact with conductive vias 246 (see FIGS. 3A and 3B). In other words, an entirety of a top surface of the power supply voltage contact 244 is in contact with the ILD layer 262. In some embodiments, as shown in FIG. 5B, the back-side conductive via 248 can be spaced apart from the source/drain region 218 by a back-side dielectric 331 and electrically connected to the source/drain region 218 through the front-side power supply voltage contact 244.

Reference is made to FIGS. 7A to 24C. FIGS. 7A to 24C illustrate the cross-sectional views of intermediate stages in the formation of a semiconductor structure in accordance with some embodiments. FIGS. 7A, 8A, 9A, 10A, 11A, 12A, 13A, 14A, 15A, 16A, 17A, 18A, 19A, 20A, 21A, 22A, 23A, and 24A illustrate cross-sectional views obtained from the reference cross-section C1-C1' in FIGS. 2A and 2B of intermediate stages in the formation of a semiconductor structure in accordance with some embodiments. FIGS. 7B, 8B, 9B, 10B, 11B, 12B, 13B, 14B, 15B, 16B, 17B, 18B, 19B, 20B, 21B, 22B, 23B, and 24B illustrate cross-sectional views obtained from the reference cross-section C5-C5' in FIGS. 2A and 2B of intermediate stages in the formation of a semiconductor structure in accordance with some embodiments. FIGS. 7C, 8C, 9C, 10C, 11C, 12C, 13C, 14C, 15C, 16C, 17C, 18C, 19C, 20C, 21C, 22C, 23C, and 24C illustrate cross-sectional views obtained from the reference cross-section C6-C6' in FIGS. 2A and 2B of intermediate stages in the formation of a semiconductor structure in accordance with some embodiments.

Figure 7A:
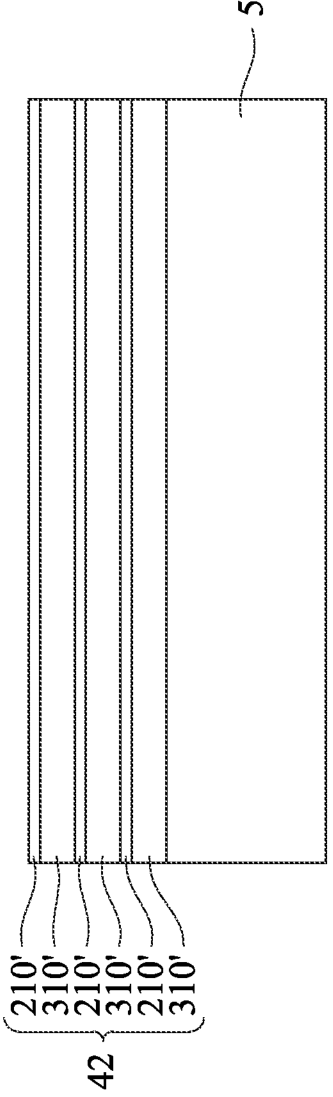
FIGS. 7A to 24C illustrate cross-sectional views of intermediate stages in the formation of a semiconductor structure in accordance with some embodiments.
Figure 7B:
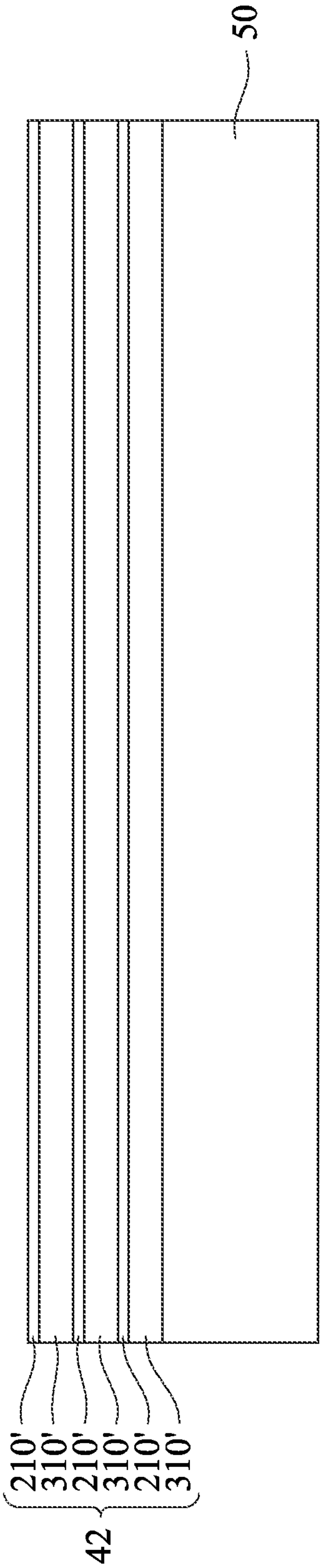
Figure 7C:
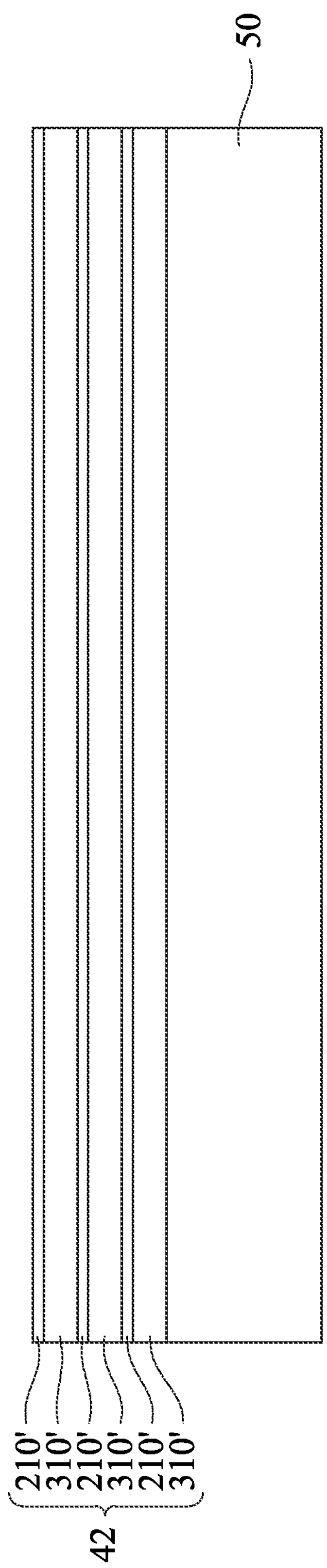

Reference is made to FIGS. 7A, 7B, and 7C. A substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

Subsequently, a multi-layer stack 42 is formed over the substrate 50. The multi-layer stack 42 includes alternating first semiconductor layers 310' and second semiconductor layers 210'. The first semiconductor layers 310' formed of a first semiconductor material, and the second semiconductor layers 210' are formed of a second semiconductor material. The semiconductor materials may each be selected from the candidate semiconductor materials of the substrate 50. In some embodiments, the multi-layer stack 42 includes three layers of each of the first semiconductor layers 310' and the second semiconductor layers 210'. It should be appreciated that the multi-layer stack 42 may include any number of the first semiconductor layers 310' and the second semiconductor layers 210'.

In some embodiments, and as will be subsequently described in greater detail, the first semiconductor layers 310' will be removed and the second semiconductor layers 210' will patterned to form channel regions for the nano-FETs. The first semiconductor layers 310' are sacrificial layers (or dummy layers), which will be removed in subsequent processing to expose the top surfaces and the bottom surfaces of the second semiconductor layers 210'. The first semiconductor material of the first semiconductor layers 310' is a material that has a high etching selectivity from the etching of the second semiconductor layers 210', such as silicon germanium. The second semiconductor material of the second semiconductor layers 210' is a material suitable for both n-type and p-type devices, such as silicon.

In some embodiments, the first semiconductor material of the first semiconductor layers 310' may be made of a material, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 210' may be made of a material, such as silicon, silicon carbide, a III-V compound semiconductor, a II-VI compound semiconductor, or the like. The first semiconductor material and the second semiconductor material may have a high etching selectivity from the etching of one another. Each of the layers of the multi-layer stack 42 may be grown by a process such as vapor phase epitaxy (VPE) or molecular beam epitaxy (MBE), deposited by a process such as chemical vapor deposition (CVD) or atomic layer deposition (ALD), or the like. In some embodiments, the multi-layer stack 42 may have a thickness in a range from about 70 to 120 nm, such as about 70, 80, 90, 100, 110, or 120 nm. In some embodiments, each of the layers may have a small thickness, such as a thickness in a range of about 5 nm to about 40 nm. In some embodiments, some layers (e.g., the second semiconductor layers 210') are formed to be thinner than other layers (e.g., the first semiconductor layers 310'). For example, in embodiments in which the first semiconductor layers 310' are sacrificial layers (or dummy layers) and the second semiconductor layers 210' are patterned to form channel regions for the nano-FETs.

Figure 8A:
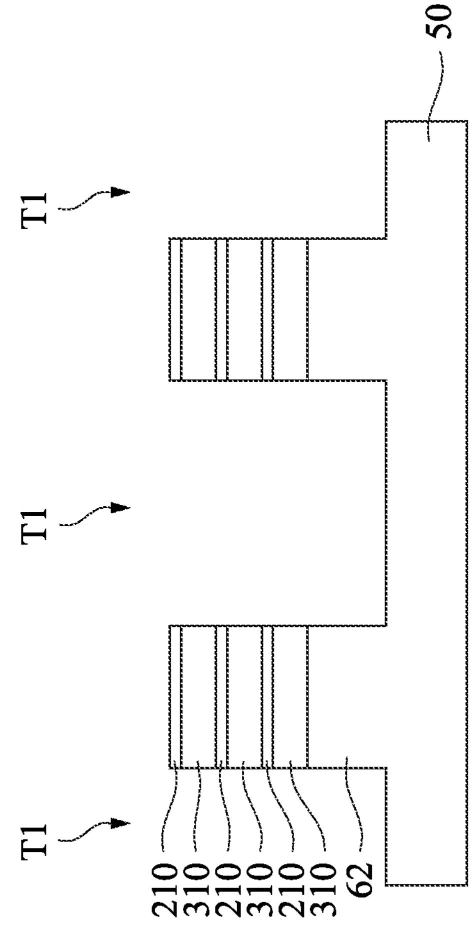
Figure 8B:
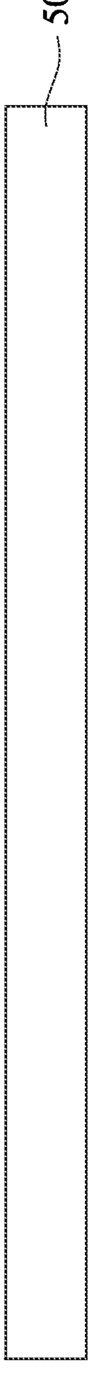
Figure 8C:
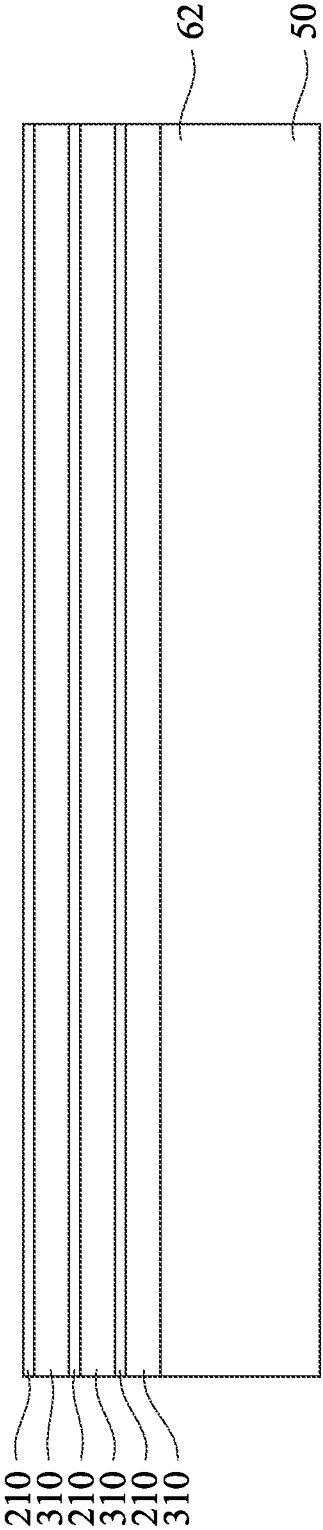

Reference is made to FIGS. 8A, 8B, and 8C. Trenches T1 are patterned in the substrate 50 and the multi-layer stack 42 to form fins 62, first semiconductor sheets 310, and second semiconductor sheets 210. The fins 62 are semiconductor strips patterned in the substrate 50. The first semiconductor sheets 310 and the second semiconductor sheets 210 include the remaining portions of the first semiconductor layers 310' and the second semiconductor layers 210', respectively. The trenches T1 may be patterned by any acceptable etch process, such as a reactive ion etch (RIE), neutral beam etch (NBE), the like, or a combination thereof. The etching may be anisotropic.

The fins 62 and the first and second semiconductor sheets 310, 210 may be patterned by any suitable method. For example, the fins 62 and the first and second semiconductor sheets 310, 210 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the first and second semiconductor sheets 310, 210. In some embodiments, the mask (or other layer) may remain on the first and second semiconductor sheets 310, 210. The fins 62 and the first and second semiconductor sheets 310, 210 may each have widths in a range of about 8 nm to about 40 nm. In some embodiments, the fins 62 and the first and second semiconductor sheets 310, 210 have substantially equal widths.

Figure 9A:
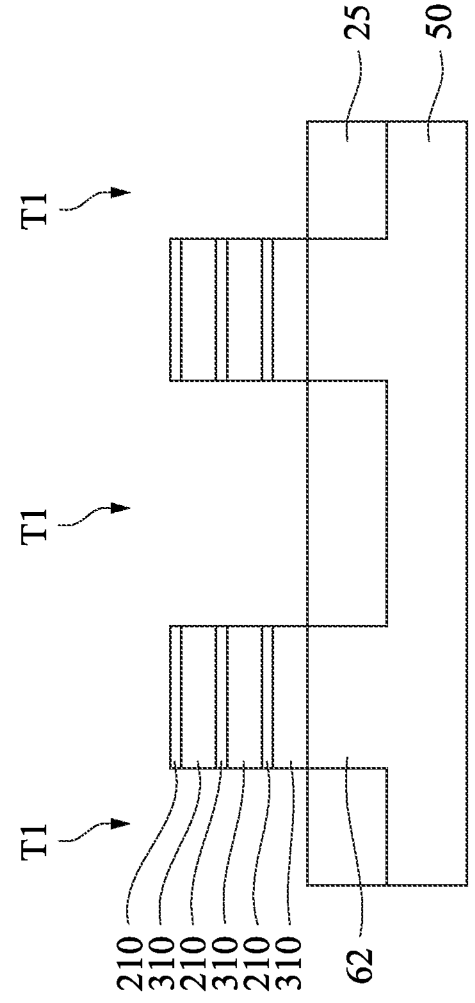
Figure 9B:
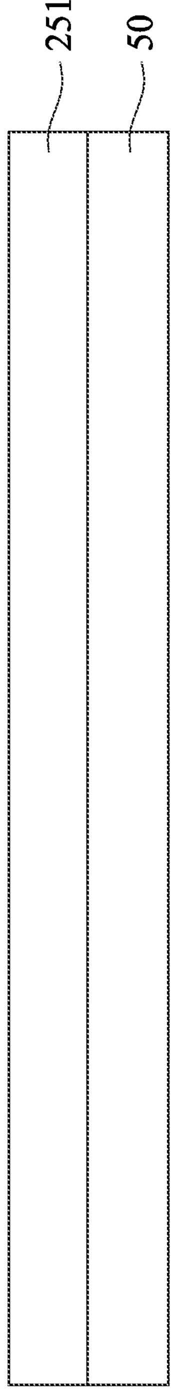
Figure 9C:
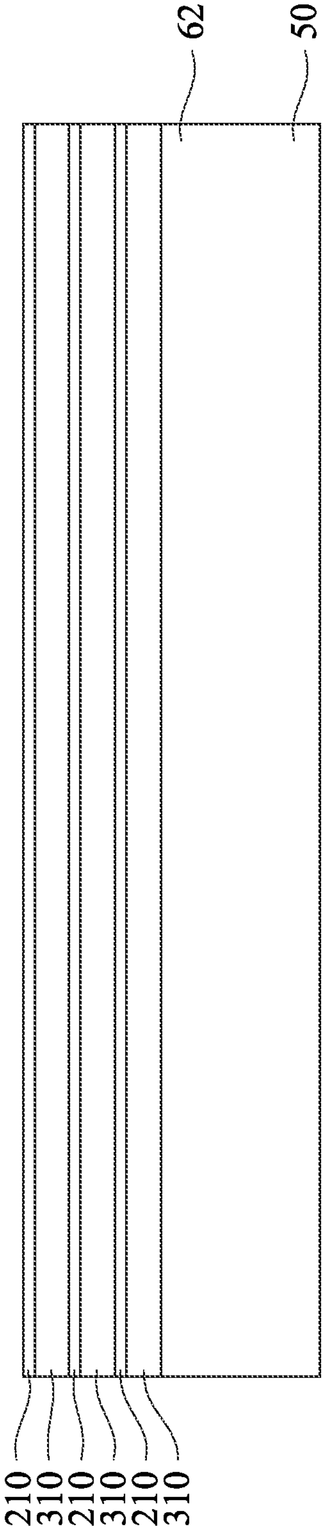

Reference is made to FIGS. 9A, 9B, and 9C. STI structures 251 are formed over the substrate 50 and between adjacent fins 62. The STI structures 251 are disposed around at least a portion of the fins 62 such that at least a portion of the first and second semiconductor sheets 310, 210 protrude from between adjacent STI structures 251. In some embodiments, the top surfaces of the STI structures 251 are coplanar (within process variations) with the top surfaces of the fins 62. In some embodiments, the top surfaces of the STI structures 251 are above or below the top surfaces of the fins 62. The STI structures 251 separate the features of adjacent devices.

The STI structures 251 may be formed by any suitable method. For example, an insulation material can be formed over the substrate 50 and the first and second semiconductor sheets 310, 210, and between adjacent fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the first and second semiconductor sheets 310, 210. Although the STI structures 251 are each illustrated as a single layer, some embodiments may utilize multiple layers. For example, in some embodiments a liner (not separately illustrated) may first be formed along surfaces of the substrate 50, the fins 62, and the first and second semiconductor sheets 310, 210. Thereafter, a fill material, such as those previously described may be formed over the liner.

A removal process is then applied to the insulation material to remove excess insulation material over the first and second semiconductor sheets 310, 210. In some embodiments, a planarization process such as a chemical mechanical polish (CMP), an etch-back process, combinations thereof, or the like may be utilized. In embodiments in which a mask remains on the first and second semiconductor sheets 310, 210, the planarization process may expose the mask or remove the mask. After the planarization process, the top surfaces of the insulation material and the mask (if present) or the first and second semiconductor sheets 310, 210 are coplanar (within process variations). Accordingly, the top surfaces of the mask (if present) or the first and second semiconductor sheets 310, 210 are exposed through the insulation material. In some embodiments, no mask remains on the first and second semiconductor sheets 310, 210. The insulation material is then recessed to form the STI structures 251. The insulation material is recessed, such as in a range from about 30 nm to about 80 nm, such that at least a portion of the first and second semiconductor sheets 310, 210 protrude from between adjacent portions of the insulation material. Further, the top surfaces of the STI structures 251 may have a flat surface as illustrated, a convex surface, a concave surface (such as dishing), or a combination thereof. The top surfaces of the STI structures 251 may be formed flat, convex, and/or concave by an appropriate etch. The insulation material may be recessed using any acceptable etching process, such as one that is selective to the material of the insulation material (e.g., selectively etches the insulation material of the STI structures 251 at a faster rate than the materials of the fins 62 and the first and second semiconductor sheets 310, 210). For example, an oxide removal may be performed using dilute hydrofluoric (dHF) acid.

The process previously described is just one example of how the fins 62 and the first and second semiconductor sheets 310, 210 may be formed. In some embodiments, the fins 62 and/or the first and second semiconductor sheets 310, 210 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the first and second semiconductor sheets 310, 210. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Figure 10A:
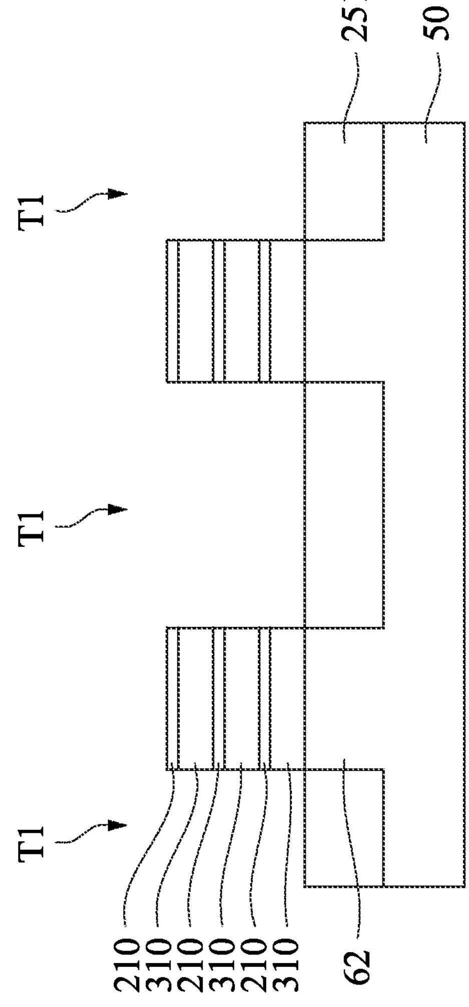
Figure 10B:
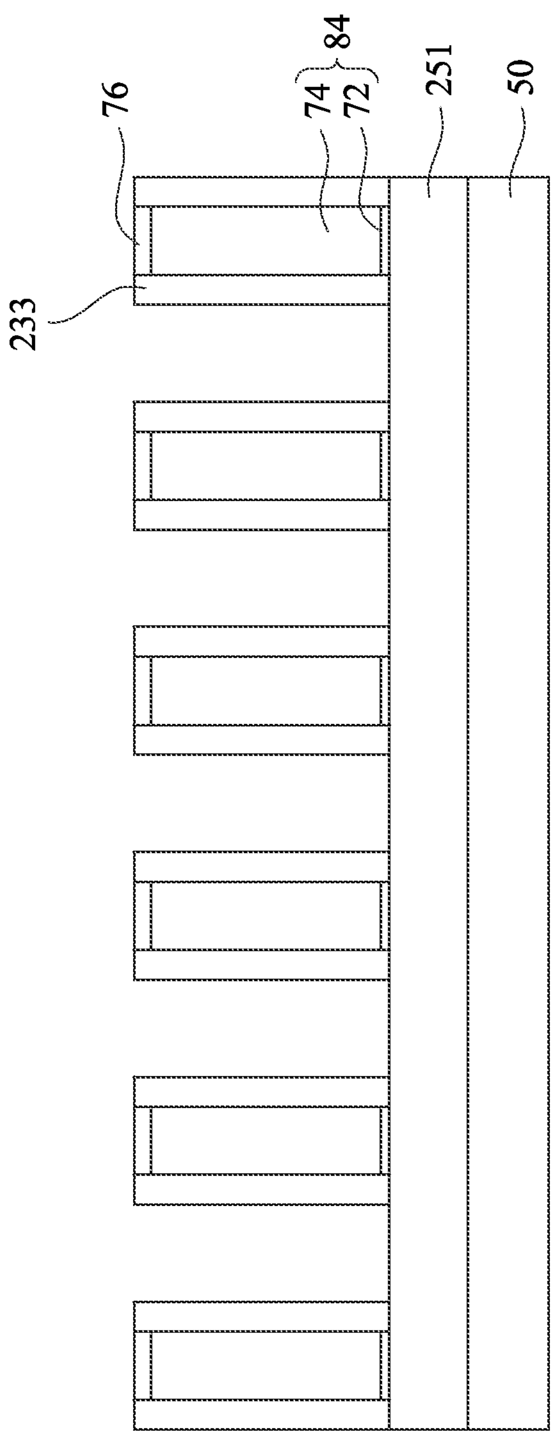
Figure 10C:
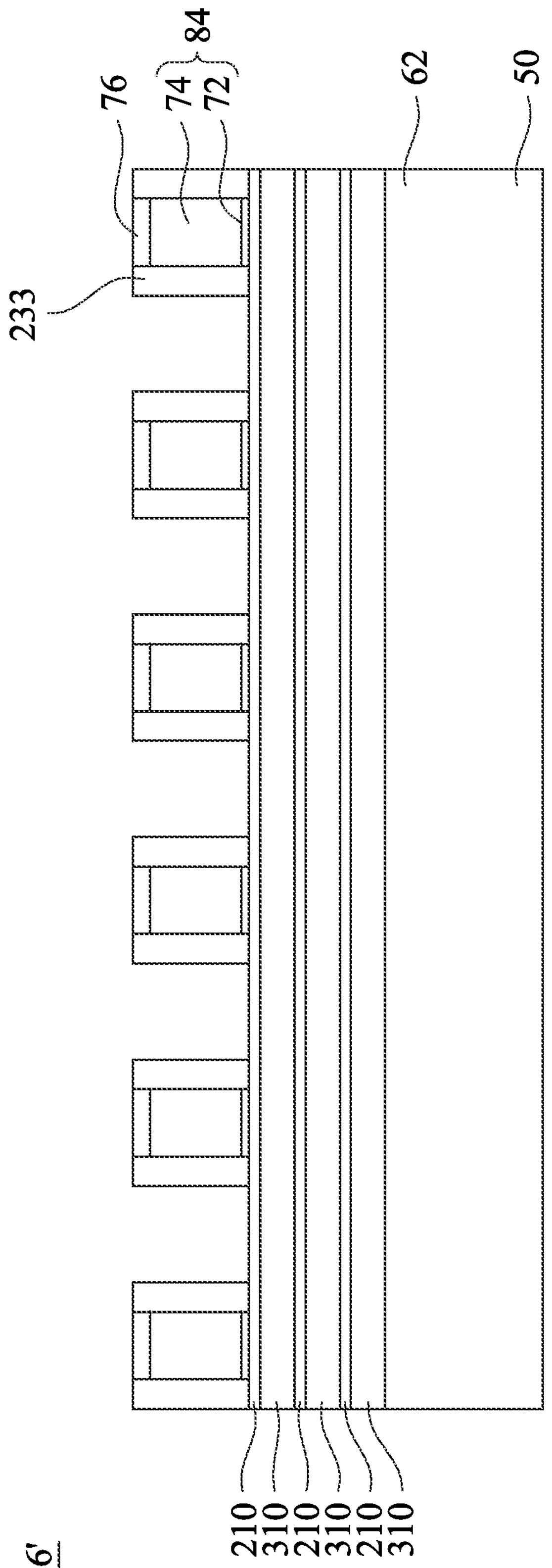

Reference is made to FIGS. 10A, 10B, and 10C. A dummy dielectric layer, a dummy gate layer, and a mask layer are sequentially formed on the fins 62 and the first and second semiconductor sheets 310, 210. The dummy dielectric layer is formed on the fins 62 and the first and second semiconductor sheets 310, 210. The dummy dielectric layer may be formed of a dielectric material such as silicon oxide, silicon nitride, a combination thereof, or the like, which may be deposited or thermally grown according to acceptable techniques. Subsequently, a dummy gate layer is formed over the dummy dielectric layer. Subsequently, a mask layer is formed over the dummy gate layer. The dummy gate layer may be deposited over the dummy dielectric layer and then planarized, such as by a CMP. The mask layer may be deposited over the dummy gate layer. The dummy gate layer may be formed of a conductive or non-conductive material, such as amorphous silicon, polycrystalline-silicon (polysilicon), polycrystalline silicon-germanium (poly-SiGe), a metal, a metallic nitride, a metallic silicide, a metallic oxide, or the like, which may be deposited by physical vapor deposition (PVD), CVD, or the like. The dummy gate layer may be formed of material(s) that have a high etching selectivity from the etching of insulation materials, e.g., the STI structures 251 and/or the dummy dielectric layer. The mask layer may be formed of a dielectric material such as silicon nitride, silicon oxynitride, or the like. In some embodiments, the dummy dielectric layer covers the fins 62, the first and second semiconductor sheets 310, 210, and the STI structures 251, such that the dummy dielectric layer extends over the STI structures 251 and between the dummy gate layer and the STI structures 251. In another embodiment, the dummy dielectric layer covers only the fins 62 and the first and second semiconductor sheets 310, 210.

The mask layer is patterned using acceptable photolithography and etching techniques to form masks 76. The pattern of the masks 76 is then transferred to the dummy gate layer by any acceptable etching technique to form dummy gates 74. The pattern of the masks 76 may optionally be further transferred to the dummy dielectric layer by any acceptable etching technique to form dummy dielectrics 72. The dummy gate 74 and the dummy dielectric 72 may be collectively referred to as a dummy gate structure 84. The dummy gate structures 84 cover portions of the first and second semiconductor sheets 310, 210 that will be exposed in subsequent processing to form channel regions. Specifically, the dummy gate structures 84 extend along the portions of the second semiconductor sheets 210 that will be patterned to form channel regions. The pattern of the masks 76 may be used to physically separate adjacent dummy gate structures 84. The dummy gate structures 84 may also have lengthwise directions substantially perpendicular (within process variations) to the lengthwise directions of the fins 62. The masks 76 can optionally be removed after patterning, such as by any acceptable etching technique.

Gate spacers 233 are formed over the first and second semiconductor sheets 310, 210, on exposed sidewalls of the masks 76, the dummy gates 74, and the dummy dielectrics 72. In some embodiments, the gate spacers 233 can be interchangeably referred to top spacers or upper gate spacers. In some embodiments, the gate spacers 233 may have a lateral dimension in a range from about 4 nm to about 12 nm. In some embodiments, the gate spacer 233 may include multiple dielectric material and selected from a group consist of $SiO_2$, $Si_3N_4$, carbon doped oxide, nitrogen doped oxide, porous oxide, air gap, or combinations thereof. The gate spacers 233 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gate structures 84 (thus forming the gate spacers 233).

Figure 11A:
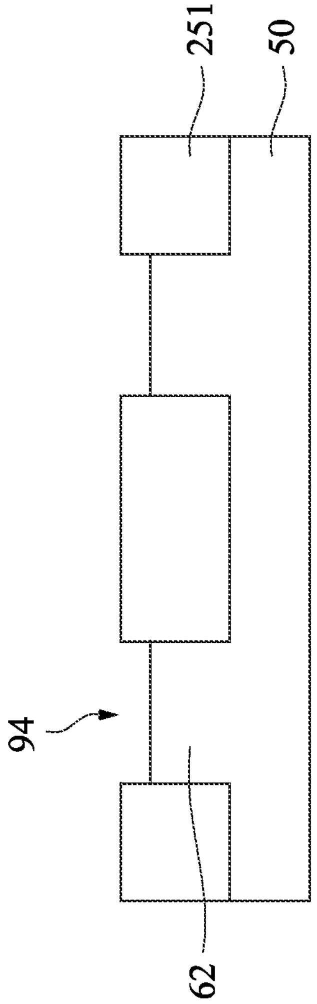
Figure 11B:
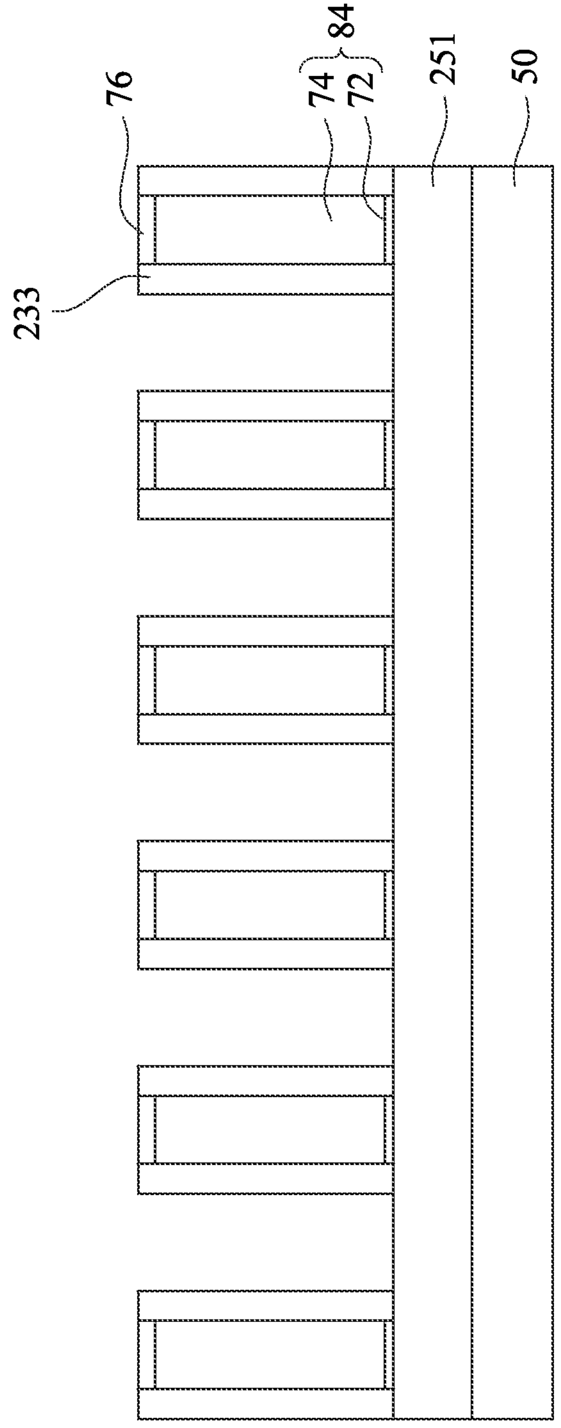
Figure 11C:
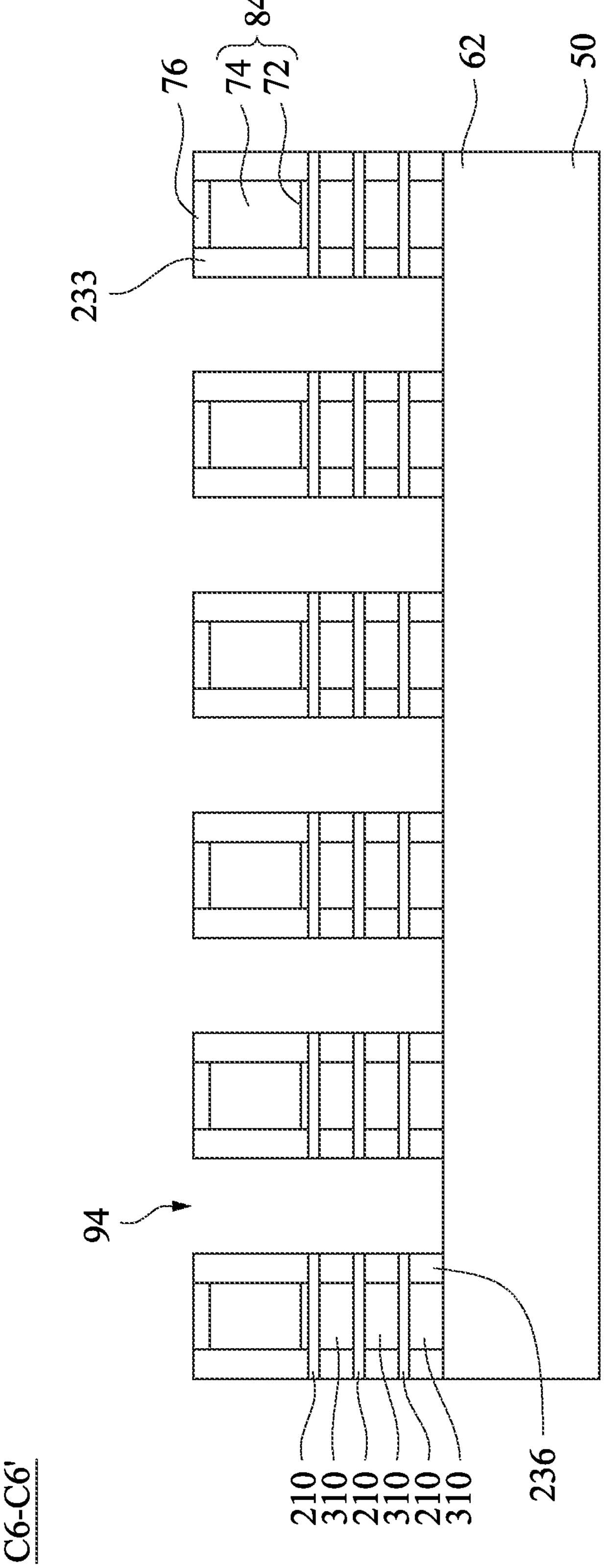

Reference is made to FIGS. 11A, 11B, and 11C. Source/drain recesses 94 are formed in the first and second semiconductor sheets 310, 210. In some embodiments, the source/drain recesses 94 extend through the first and second semiconductor sheets 310, 210 and into the fins 62. In some embodiments, the fins 62 may be etched such that bottom surfaces of the source/drain recesses 94 are disposed below the top surfaces of the STI structures 251. The source/drain recesses 94 may be formed by etching the first and second semiconductor sheets 310, 210 using an anisotropic etching process, such as a RIE, a NBE, or the like. The gate spacers 233 and the dummy gate structures 84 collectively mask portions of the fins 62 and/or the first and second semiconductor sheets 310, 210 during the etching processes used to form the source/drain recesses 94. A single etch process may be used to etch each of the first and second semiconductor sheets 310, 210, or multiple etch processes may be used to etch the first and second semiconductor sheets 310, 210. Timed etch processes may be used to stop the etching of the source/drain recesses 94 after the source/drain recesses 94 reach a desired depth.

Subsequently, inner spacers 236 are formed on sidewalls of the remaining portions of the first semiconductor sheets 310, e.g., those sidewalls exposed by the source/drain recesses 94. As will be subsequently described in greater detail, source/drain regions will be subsequently formed in the source/drain recesses 94, and the first semiconductor sheets 310 will be subsequently replaced with corresponding gate structures. The inner spacers 236 act as isolation features between the subsequently formed source/drain regions and the subsequently formed gate structures. Further, the inner spacers 236 may be used to substantially prevent damage to the subsequently formed source/drain regions by subsequent etching processes, such as etching processes used to subsequently remove the first semiconductor sheets 310. In some embodiments, the inner spacers 236 can be interchangeably referred to lower gate spacers. In some embodiments, the inner spacers 236 may have a lateral dimension in a range from about 4 nm to about 12 nm.

As an example to form the inner spacers 236, the source/drain recesses 94 can be laterally expanded. Specifically, portions of the sidewalls of the first semiconductor sheets 310 exposed by the source/drain recesses 94 may be recessed. Although sidewalls of the first semiconductor sheets 310 are illustrated as being straight, the sidewalls may be concave or convex. The sidewalls may be recessed by any acceptable etching process, such as one that is selective to the material of the first semiconductor sheets 310 (e.g., selectively etches the material of the first semiconductor sheets 310 at a faster rate than the material of the second semiconductor sheets 210). The etching may be isotropic. For example, when the second semiconductor sheets 210 are formed of silicon and the first semiconductor sheets 310 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 94 and recess the sidewalls of the first semiconductor sheets 310. The inner spacers 236 can then be formed by conformally forming an insulating material and subsequently etching the insulating material. The insulating material may be silicon nitride or silicon oxynitride, although any suitable material, such as low-dielectric constant (low-k) materials having a k-value less than about 3.5, may be utilized. In some embodiments, the inner spacer 236 may have a higher K (dielectric constant) value than the gate spacer 233. In some embodiments, the material of inner spacer is selected from a group including $SiO_2$, $Si_3N_4$, SiON, SiOC, SiOCN base dielectric material, air gap, or combinations thereof. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 236 are illustrated as being flush with respect to the sidewalls of the gate spacers 233, the outer sidewalls of the inner spacers 236 may extend beyond or be recessed from the sidewalls of the gate spacers 233. In other words, the inner spacers 236 may partially fill, completely fill, or overfill the sidewall recesses. Moreover, although the sidewalls of the inner spacers 236 are illustrated as being straight, the sidewalls of the inner spacers 236 may be concave or convex.

Figure 12A:
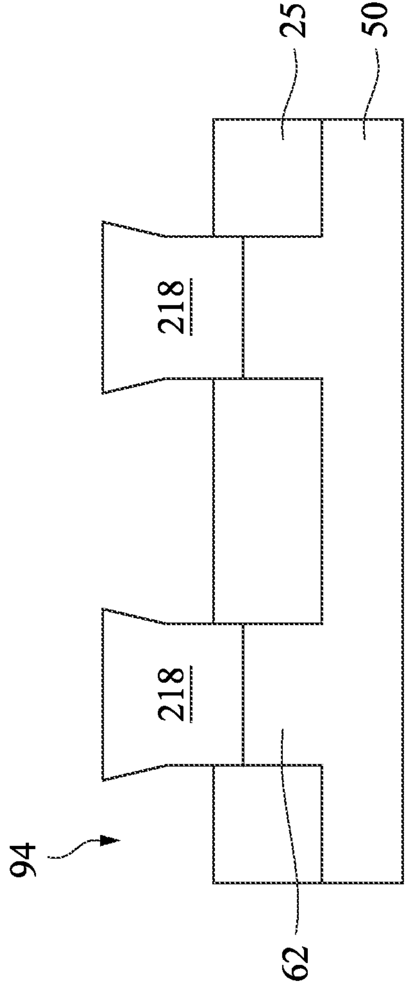
Figure 12B:
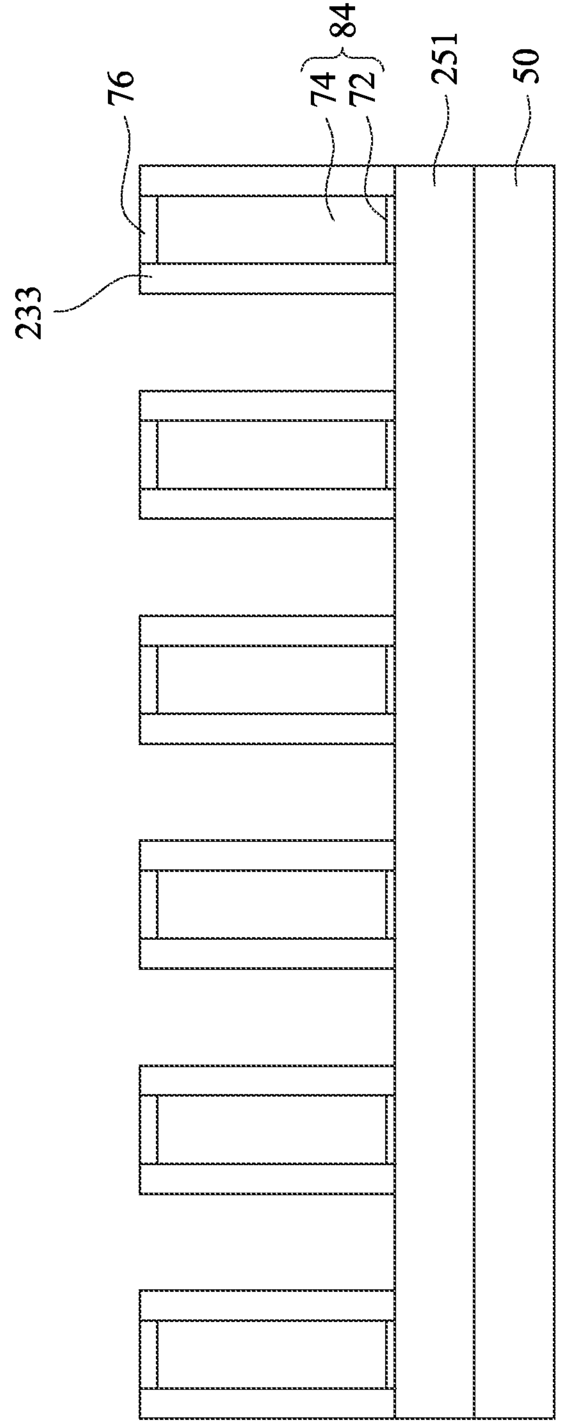
Figure 12C:
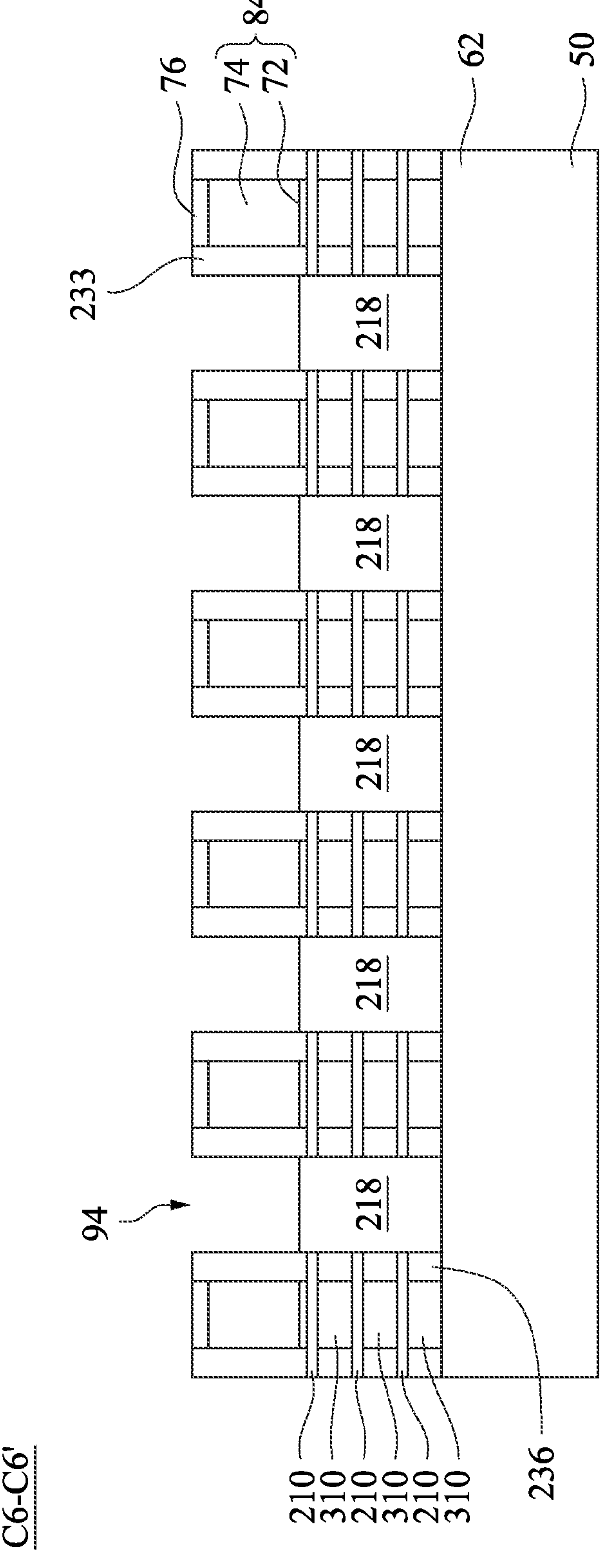

Reference is made to FIGS. 12A, 12B, and 12C. Epitaxial source/drain regions 218 are formed in the source/drain recesses 94, such that each dummy gate 84 (and corresponding channel regions) is disposed between respective adjacent pairs of the epitaxial source/drain regions 218. In some embodiments, the gate spacers 233 and the inner spacers 236 are used to separate the epitaxial source/drain regions 218 from, respectively, the dummy gate structures 84 and the first semiconductor sheets 310 by an appropriate lateral distance so that the epitaxial source/drain regions 218 do not short out with subsequently formed gates of the resulting nano-FETs. A material of the epitaxial source/drain regions 218 may be selected to exert stress in the respective channel regions, thereby improving performance of the semiconductor structure.

The epitaxial source/drain regions 218 in the first conductivity type device region 10C may be formed by masking the second conductivity type device region 10D. Then, the epitaxial source/drain regions 218 in the first conductivity type device region 10C is epitaxially grown in the source/drain recesses 94 in the first conductivity type device regions 10C. The epitaxial source/drain regions 218 in the first conductivity type device region 10C may include any acceptable material appropriate for n-type devices. For example, the epitaxial source/drain regions 218 in the first conductivity type device region 10C may include materials exerting a tensile strain on the channel regions, such as silicon, silicon carbide, phosphorous doped silicon carbide, silicon phosphide, or the like. The epitaxial source/drain regions 218 in the first conductivity type device region 10C may be referred to as "n-type source/drain region." The epitaxial source/drain regions 218 in the first conductivity type device region 10C may have surfaces raised from respective surfaces of the fins 62 and the first and second semiconductor sheets 310, 210, and may have facets.

In some embodiments, an upper portion of the source/drain region 218 in the first conductivity type device region 10C (see FIGS. 12A and 12C) can have a higher dopant concentration than a lower portion thereof. In some embodiments, the source/drain region 218 of the first conductivity type device region 10C may have a phosphorus concentration within a range from about $2E19/cm^3$ to about $3E21/cm^3$. In some embodiments, an upper portion of the source/drain region 218 of the first conductivity type device region 10C may have a greater phosphorus concentration than a lower portion thereof.

The epitaxial source/drain regions 218 in the second conductivity type device region 10D may be formed by masking the first conductivity type device region 10C. Then, the epitaxial source/drain regions 218 in the second conductivity type device region 10D can be epitaxially grown in the source/drain recesses 94 in the second conductivity type device region 10D. The epitaxial source/drain regions 218 in the second conductivity type device region 10D may include any acceptable material appropriate for p-type devices. For example, the epitaxial source/drain regions 218 in the second conductivity type device region 10D may include materials exerting a compressive strain on the channel regions, such as silicon germanium, boron doped silicon germanium, germanium, germanium tin, or the like. The epitaxial source/drain regions 218 in the second conductivity type device region 10D may be referred to as "p-type source/drain region." The epitaxial source/drain regions 218 in the second conductivity type device region 10D may have surfaces raised from respective surfaces of the fins 62 and the first and second semiconductor sheets 310, 210, and may have facets. In some embodiments, an upper portion of the source/drain region 218 in the second conductivity type device region 10D (see FIG. 12A) can have a higher dopant concentration than a lower portion thereof. In some embodiments, the source/drain region 218 of the second conductivity type device region 10D may have a boron concentration within a range from about $1E19/cm^3$ to about $6E20/cm^3$. In some embodiments, the source/drain region 218 of the second conductivity type device region 10D may have a Ge atomic percentage within a range of about 36% to about 85%. In some embodiments, an upper portion of the source/drain region 218 of the second conductivity type device region 10D may have a greater boron concentration than a lower portion thereof. In some embodiments, the source/drain regions 218 can be interchangeably referred to source/drain patterns or epitaxial structures.

Figure 13A:
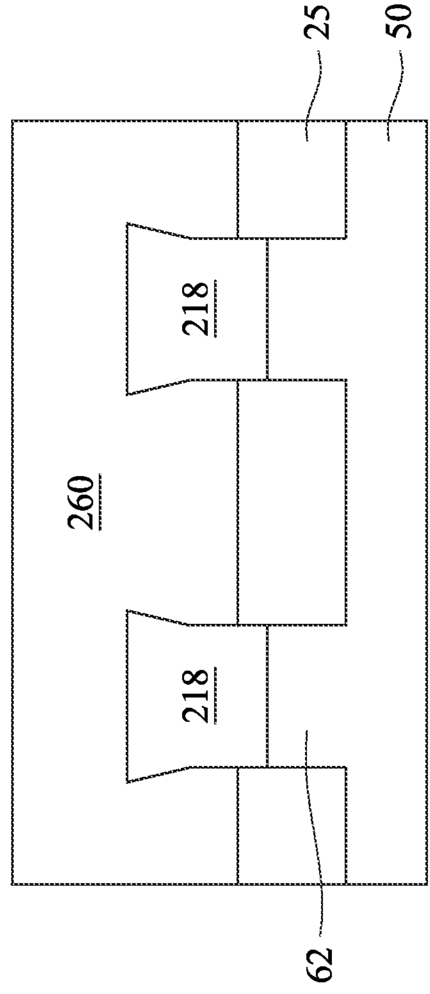
Figure 13B:
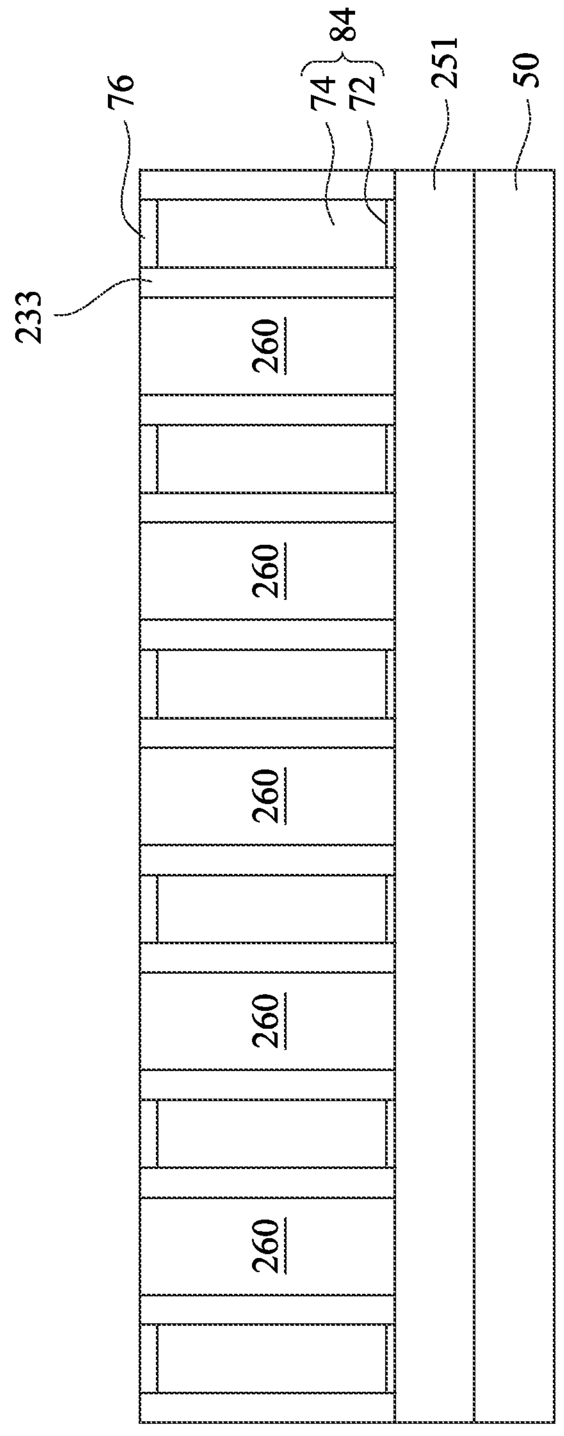
Figure 13C:
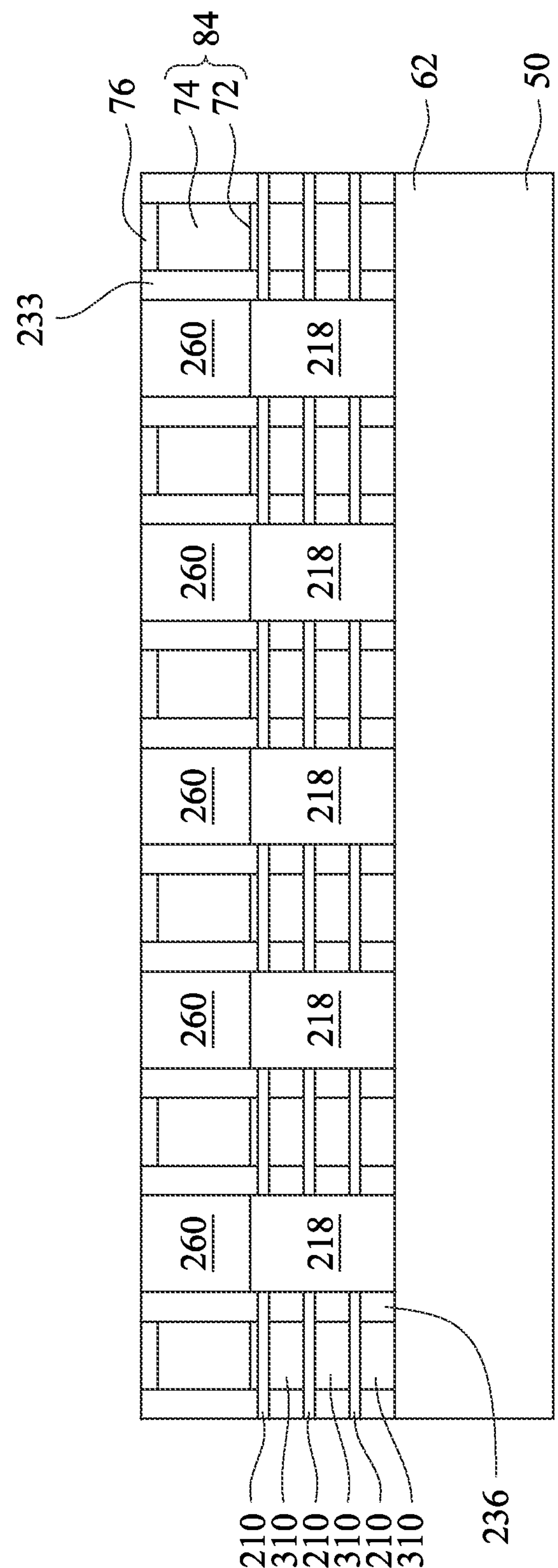

Reference is made to FIGS. 13A, 13B, and 13C. An inter-layer dielectric (ILD) layer 260 is deposited over the epitaxial source/drain regions 218, the gate spacers 233, the dummy gate structures 84. The ILD layer 260 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) is formed between the ILD layer 260 and the epitaxial source/drain regions 218, the gate spacers 233, and the dummy gate structures 844. The CESL may be formed of a dielectric material, such as silicon nitride, silicon oxide, silicon oxynitride, or the like, having a high etching selectivity from the etching of the ILD 260. The CESL may be formed by an any suitable method, such as CVD, ALD, or the like.

Subsequently, a removal process is performed to level the top surfaces of the ILD layer 260 with the top surfaces of the dummy gate structures 84. In some embodiments, a planarization process such as a chemical mechanical polish (CMP), an etch-back process, combinations thereof, or the like may be utilized. The planarization process may also remove the masks 76 on the dummy gate structures 84, and portions of the gate spacers 233 along sidewalls of the masks 76. After the planarization process, the top surfaces of the gate spacers 233, the ILD layer 260, the CESL, and the dummy gate structures 84 are coplanar (within process variations). Accordingly, the top surfaces of the dummy gate structures 84 are exposed through the ILD layer 260. In some embodiments, the masks 76 remain, and the planarization process levels the top surfaces of the ILD layer 260 with the top surfaces of the masks 76.

Figure 14A:
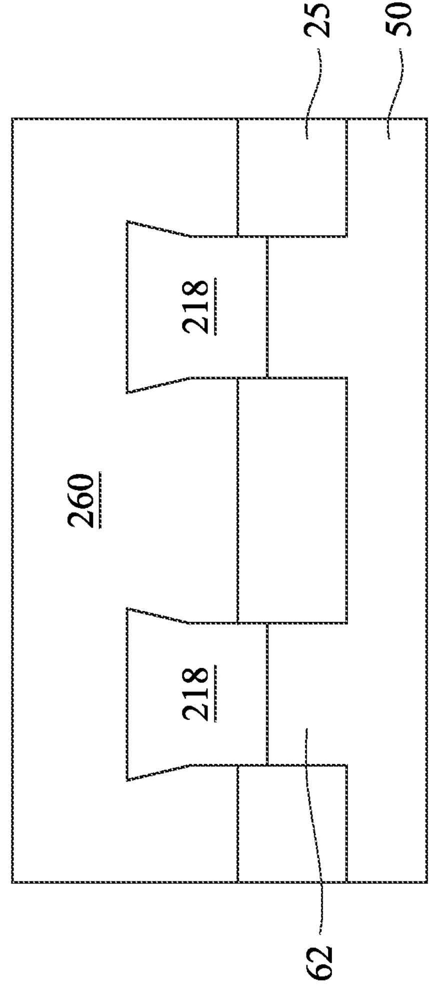
Figure 14B:
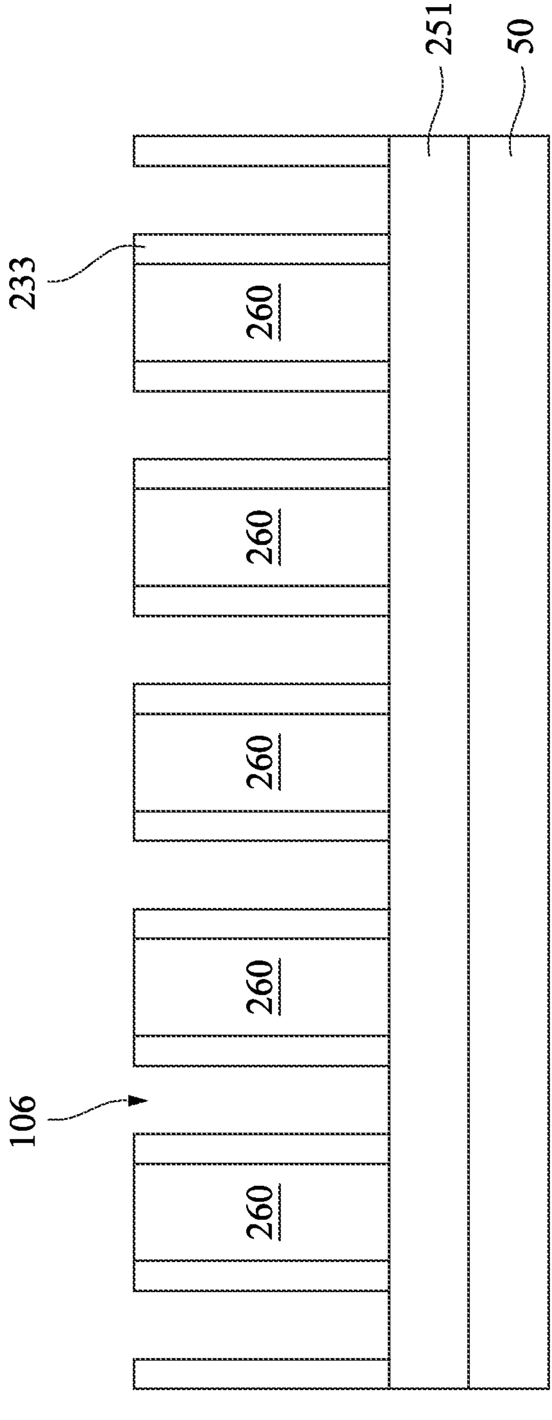
Figure 14C:
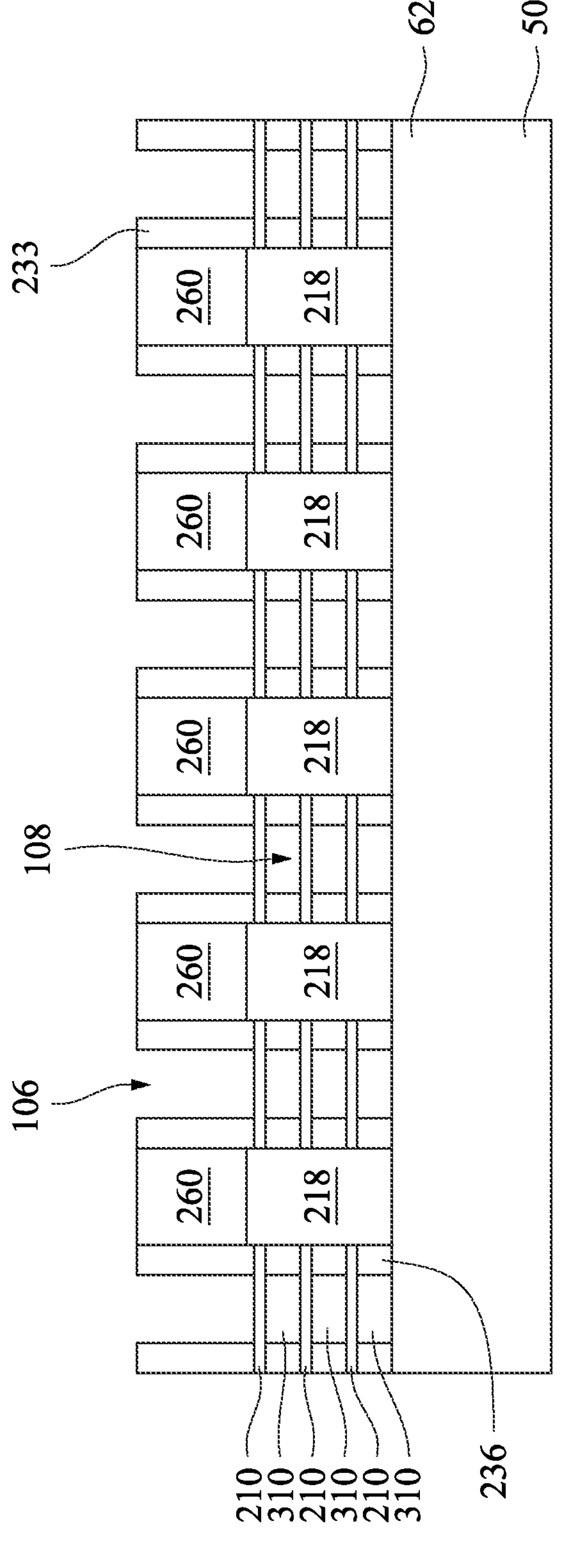

Reference is made to FIGS. 14A, 14B, and 14C. The dummy gate structures 84 are removed in an etching process, so that recesses 106 are formed. Portions of the dummy dielectrics 72 in the recesses 106 are also removed. In some embodiments, the dummy gate structures 84 are removed by an anisotropic dry etch process. For example, the etching process may include a dry etch process using reaction gas(es) that selectively etch the dummy gate structures 84 at a faster rate than the ILD layer 260 or the gate spacers 233. During the removal, the dummy dielectrics 72 may be used as etch stop layers when the dummy gate structures 84 are etched. The dummy dielectrics 72 are then removed. Each recess 106 exposes and/or overlies portions of the channel regions. Portions of the second semiconductor sheets 210 which act as the channel regions are disposed between adjacent pairs of the epitaxial source/drain regions 218.

The remaining portions of the first semiconductor sheets 310 are then removed to expand the recesses 106, such that openings 108 are formed in regions between the second semiconductor sheets 210. The remaining portions of the first semiconductor sheets 310 can be removed by any acceptable etching process that selectively etches the material of the first semiconductor sheets 310 at a faster rate than the material of the second semiconductor sheets 210. The etching may be isotropic. For example, when the first semiconductor sheets 310 are formed of silicon germanium and the second semiconductor sheets 210 are formed of silicon, the etching process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second semiconductor sheets 210. In some embodiments, the removing of the remaining portions of the first semiconductor sheets 310 can be interchangeably referred to as a channel releasing process. The second semiconductor sheets 210 can be interchangeably referred to as a vertically stacked multiple channels (sheets) and may have a vertically sheet pitch within a range of from about 10 nm to about 30 nm. In some embodiments, the second semiconductor sheets 210 may have a thickness within a range from about 4 nm to about 10 nm. In some embodiments, the vertically sheet pitch of the between adjacent two of the second semiconductor sheets 210 may be within a range from about 6 to about 20 nm.

Figure 15A:
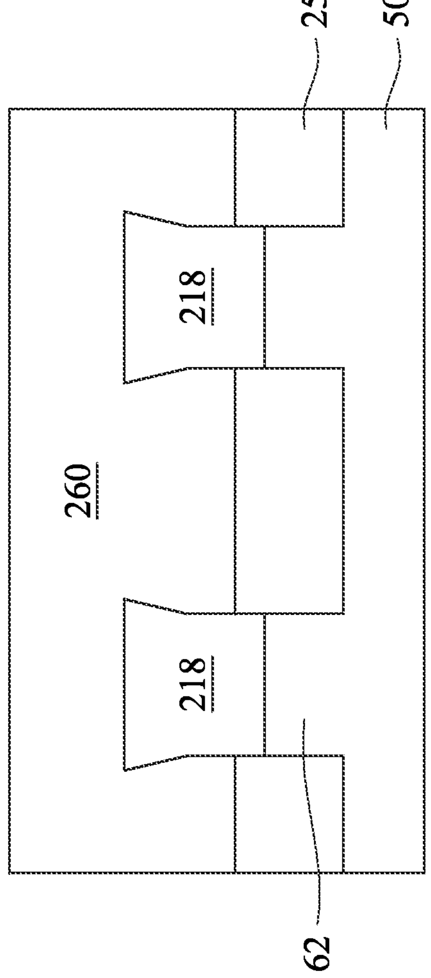
Figure 15B:
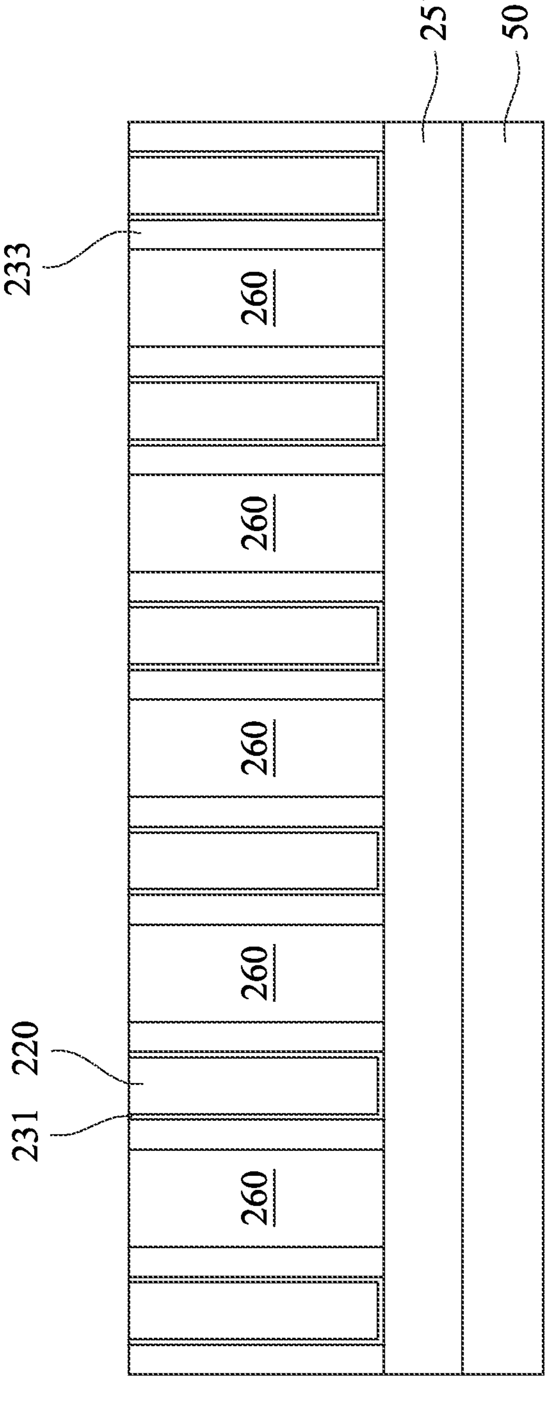
Figure 15C:
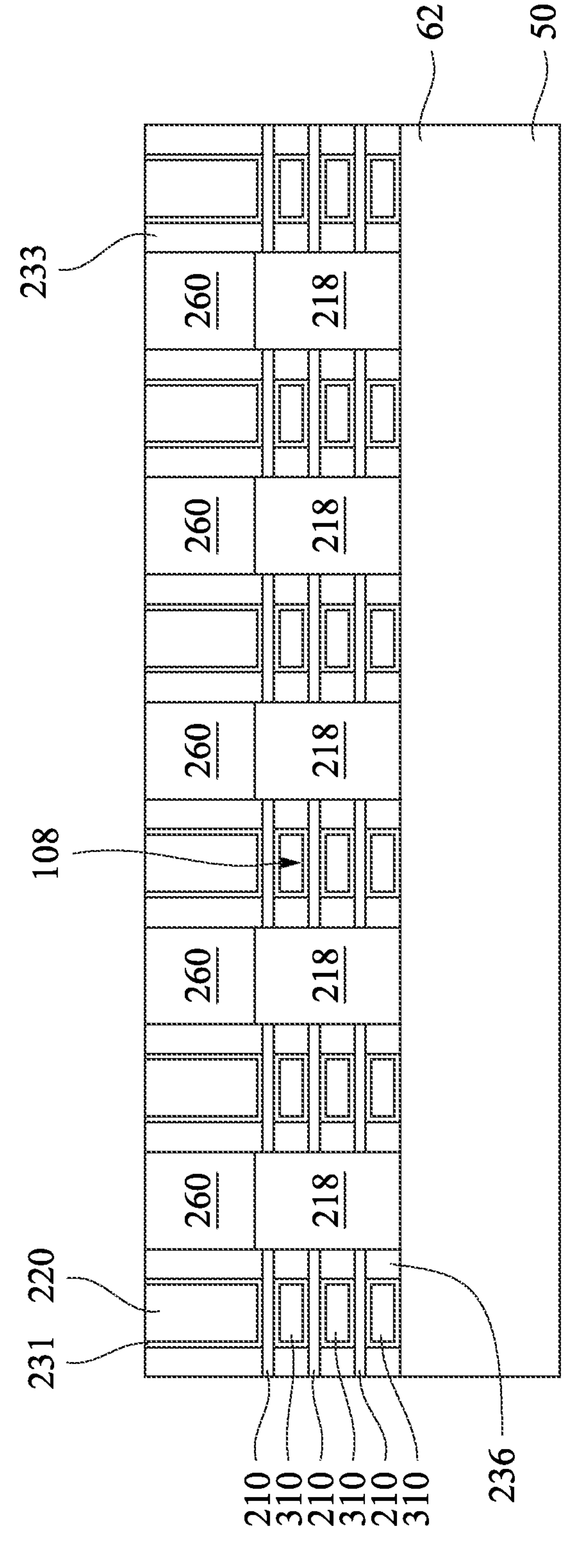

Reference is made to FIGS. 15A, 15B, and 15C. Gate structures are formed to wrap around the second semiconductor sheets 210. A gate dielectric layer 231 is formed in the recesses 106. Gate electrode layers 220 are formed on the gate dielectric layer 231. The gate dielectric layer 231 and the gate electrode layers 220 are layers for replacement gates, and each wrap around all (e.g., four) sides of the second semiconductor sheet 210. In some embodiments, the gate structure can be interchangeably referred to as a gate strip or a gate pattern.

The gate dielectric layer 231 is disposed on the sidewalls and/or the top surfaces of the fins 62; on the top surfaces, the sidewalls, and the bottom surfaces of the second semiconductor sheets 210; and on the sidewalls of the gate spacers 233. The gate dielectric layer 231 may include an oxide such as silicon oxide or a metal oxide, a silicate such as a metal silicate, combinations thereof, multi-layers thereof, or the like. The gate dielectric layer 231 may include a dielectric material having a k-value greater than about 7.0, such as a metal oxide or a silicate of hafnium, aluminum, zirconium, lanthanum, manganese, barium, titanium, lead, and combinations thereof. Although a single-layered gate dielectric layer 231 is illustrated in FIGS. 15B and 15C, as will be subsequently described in greater detail, the gate dielectric layer 231 may include any number of interfacial layers and any number of main layers.

The gate electrode layers 220 may include a metal-containing material such as titanium nitride, titanium oxide, tungsten, cobalt, ruthenium, aluminum, combinations thereof, multi-layers thereof, or the like. Although a single-layered gate electrode layers 220 is illustrated in FIGS. 15B and 15C, as will be subsequently described in greater detail, the gate electrode layer 220 may include any number of work function tuning layers, any number of barrier layers, any number of glue layers, and a fill material. In some embodiments, the gate electrode layers 220 may be made of a material selected from a group including TiN, TaN, TiAl, TiAlN, TaAl, TaAlN, TaAlC, TaCN, WNC, Co, Ni, Pt, W, or combinations thereof.

The formation of the gate dielectric layers 231 in the first conductivity type device region 10C and the second conductivity type device region 10D may form simultaneously such that the gate dielectric layers 231 in each region are formed of the same materials, and the formation of the gate electrode layers 220 may form simultaneously such that the gate electrode layers 220 in each region are formed of the same materials. In some embodiments, the gate dielectric layers 231 in each region may be formed by distinct processes, such that the gate dielectric layers 231 may be different materials and/or have a different number of layers, and/or the gate electrode layers 220 in each region may be formed by distinct processes, such that the gate electrode layers 220 may be different materials and/or have a different number of layers. Various masking steps may be used to mask and expose appropriate regions when using distinct processes. In the following description, at least portions of the gate electrode layers 220 in the first conductivity type device region 10C and the gate electrode layers 220 in the second conductivity type device region 10D are formed separately.

Subsequently, a removal process is performed to remove the excess portions of the materials of the gate dielectric layer 231 and the gate electrode layers 220, which excess portions are over the top surfaces of the ILD layer 260 and the gate spacers 233, thereby forming gate dielectric layer 231 and gate electrode layers 220. In some embodiments, a planarization process such as a chemical mechanical polish (CMP), an etch-back process, combinations thereof, or the like may be utilized. The gate dielectric layer 231, when planarized, has portions left in the recesses 106 (thus forming the gate dielectric layer 231). The gate electrode layers 220, when planarized, have portions left in the recesses 106 (thus forming the gate electrode layers 220). The top surfaces of the gate spacers 233; the CESL (not shown); the ILD layer 260; the gate dielectric layer 231, and the gate electrodes are coplanar (within process variations). The gate dielectric layer 231 and the gate electrode layers 220 form replacement gates of the resulting nano-FETs. Each respective pair of a gate dielectric layer 231 and a gate electrode layer 220 may be collectively referred to as a gate structure or a functional gate structure. The gate structures each extend along top surfaces, sidewalls, and bottom surfaces of a channel region of the second semiconductor sheet 210. In some embodiments, the gate electrode layers 220 each have a gate length in a range from about 6 nm to about 20 nm.

Figure 16A:
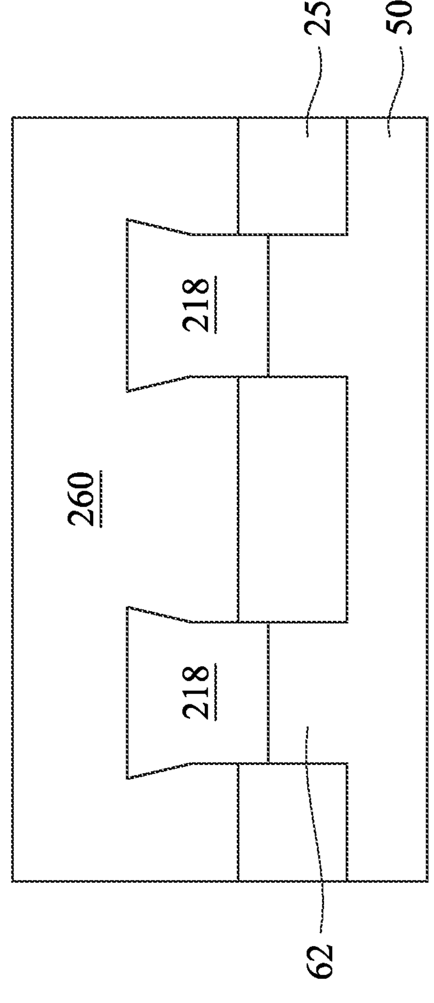
Figure 16B:
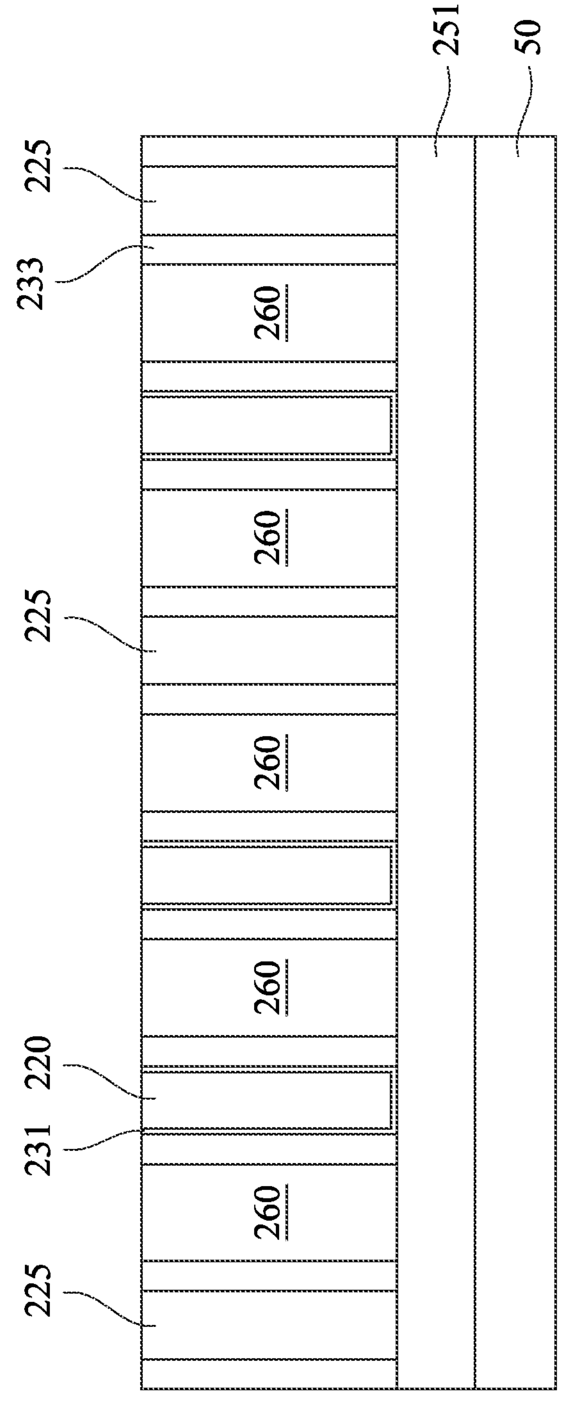
Figure 16C:
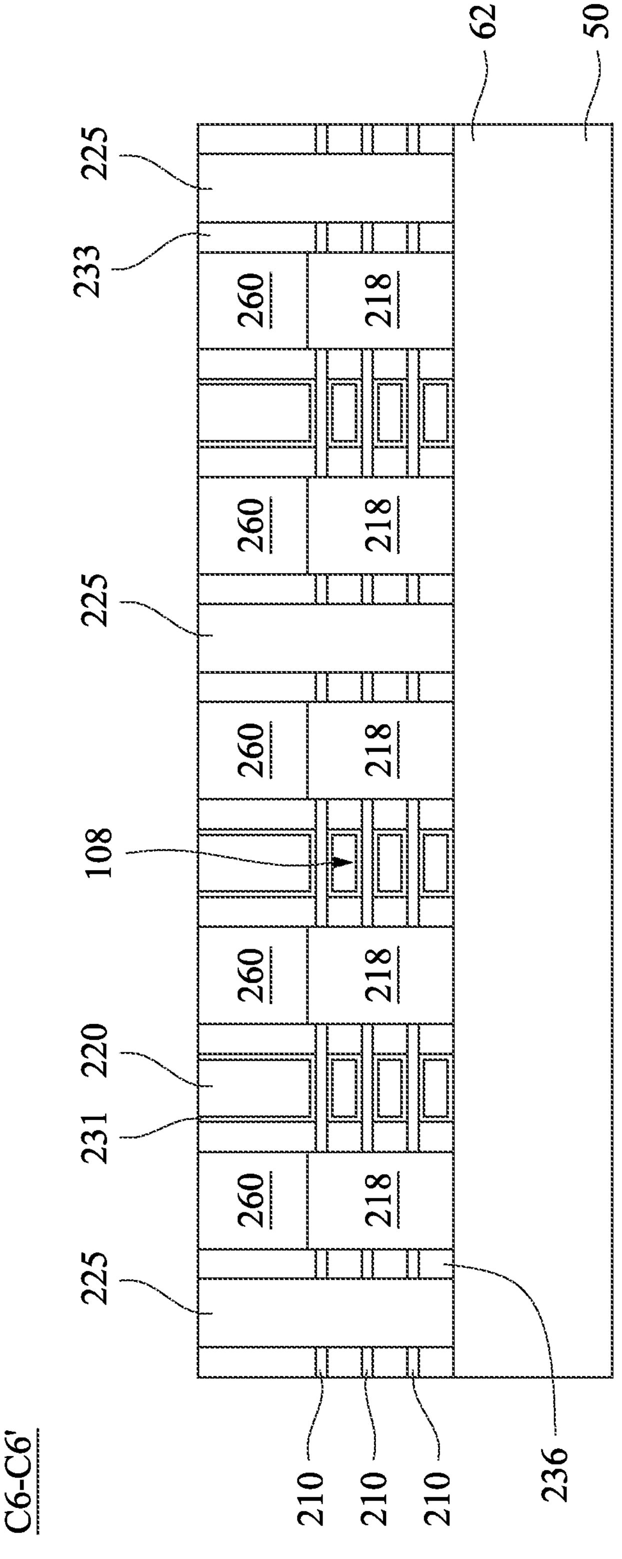

Reference is made to FIGS. 16A, 16B, and 16C. The gate electrode layers 220 and the gate dielectric layer 231 on the boundary of the first and second logic circuit regions 10A and 10B are removed to form isolation regions separating the source/drain regions of neighboring semiconductor devices from each other and separate different semiconductor devices. The isolation region may be formed by using an etching process. In the etching process, the gate electrode layers 220 and the gate dielectric layer 231 on the boundary of the first and second logic circuit regions 10A and 10B are etched anisotropically, until the underlying fins 62 are exposed. The etching may be stopped on the STI structures 251. In some embodiments, the fins 62 are then etched, and the etching continues down into the underlying substrate 50.

Subsequently, a dielectric material is filled in the isolation region (i.e., spaces originally occupied by the gate electrode layers 220 and the gate dielectric layer 231 warping the gate electrode layers 220) to form dielectric-base gates 225. As shown in FIGS. 2A and 2B, the dielectric-base gates 225 extend in the Y-direction and being dummy gates. The gate electrodes 220 are arranged between the dielectric-base gates 225. The material of the dielectric-base gates 225 is different from that of the gate electrodes 220. In some embodiments, the dielectric-base gates 225 can be made of silicon oxide ($SiO_x$), silicon nitride ($Si_xN_y$), silicon oxynitride (SiON), dielectric material(s), other suitable material, or a combination thereof. In some embodiments, the dielectric-base gates 225 can be formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 17A:
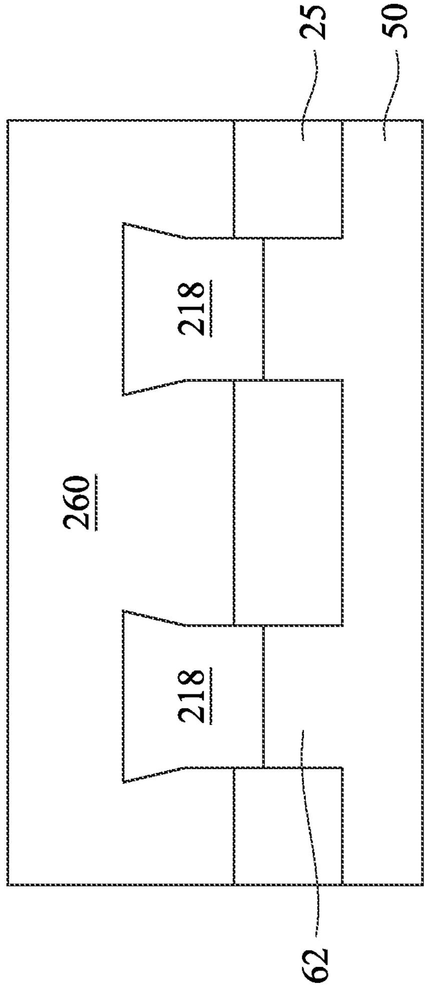
Figure 17B:
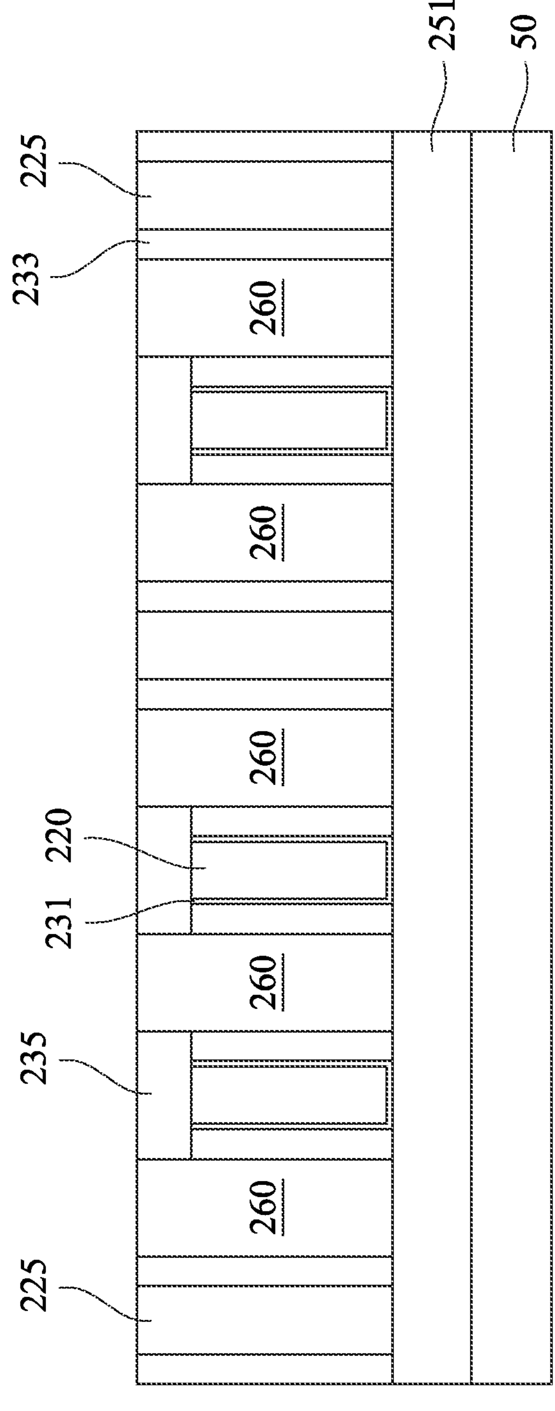
Figure 17C:
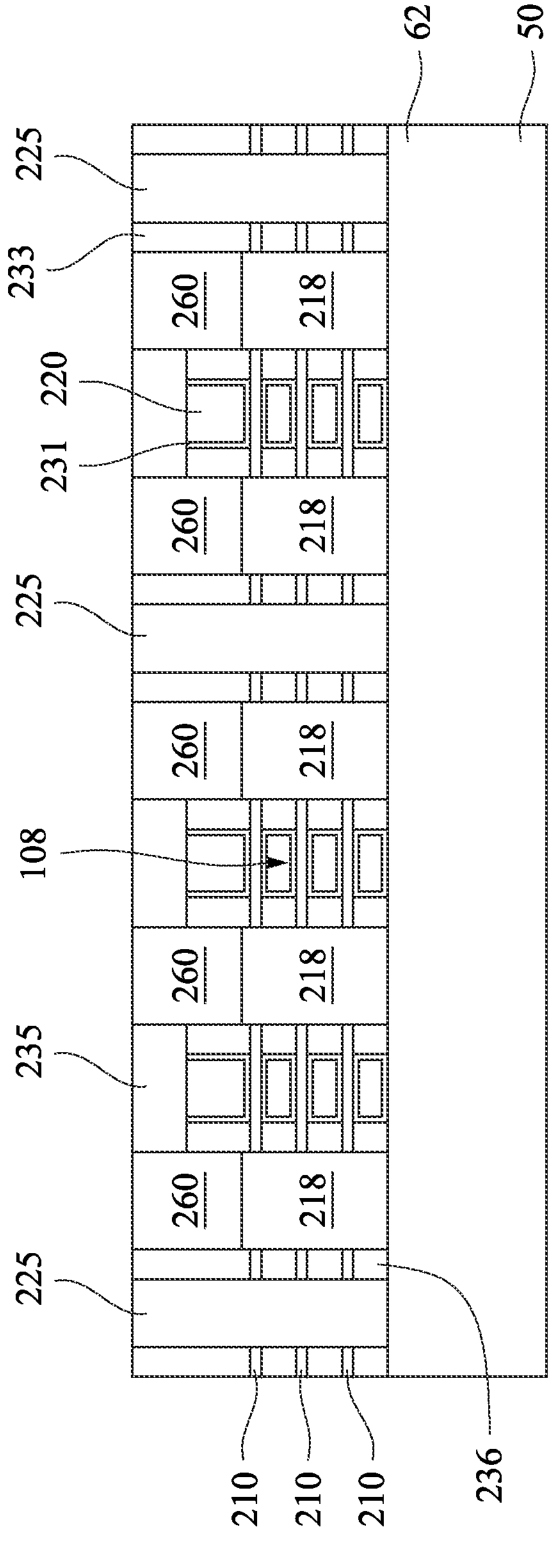

Reference is made to FIGS. 17A, 17B, and 17C. An etch back process is performed on the gate electrode layers 220 and the gate dielectric layer 231 to scale down the gate electrode layers 220 and the gate dielectric layer 231. The etch back process may include a bias plasma etching step. The bias plasma etching step may be performed to remove portions of the gate electrode layers 220 and the gate dielectric layer 231. Portions of the gate trenches may reappear with shallower depth. Top surfaces of the gate electrode layers 220 and the gate dielectric layer 231 may be no longer level with the ILD layer 260. Sidewalls of the gate spacers 233 are then exposed from the gate electrode layers 220 and the gate dielectric layer 231. In some embodiments, the bias plasma etching step may use a gas mixture of $Cl_2$, $O_2$, $BCl_3$, and Ar with a bias in a range from about 25V to about 1200V.

Subsequently, a hard mask layer 235 is formed over the gate electrode layers 220 and the gate dielectric layer 231 using, for example, a deposition process to deposit a dielectric material over the substrate 50, followed by a CMP process to remove excess dielectric material above the spacers 233 and the ILD layer 260. In some embodiments, source/drain contacts 240 and power supply voltage contacts 244 (see FIGS. 19A and 19C) formed subsequently are formed by a self-aligned contact process using the hard mask layer 235 as a contact etch protection layer. In some embodiments, the hard mask layer 235 may have a thickness in a range from about 2 nm to about 60 nm. In some embodiments, the hard mask layer 235 may be made of a nitride-based material, such as $Si_3N_4$, SiON, or a carbon-based material, such as SiC, SiOC, SiOCN, or combinations thereof. In some embodiments, the hard mask layer 235 may include $SiO_x$, SiBN, SiCBN, other suitable dielectric materials, or combinations thereof. In some embodiments, the hard mask layer 235 may include a metal oxide, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. The hard mask layer 235 has different etch selectivity than the spacers 233 and/or the ILD layer 260, so as to selective etch back the hard mask layer 235. By way of example, if the hard mask layer 235 is made of silicon nitride, the spacers 233 and/or the ILD layer 260 may be made of a dielectric material different from silicon nitride. If the hard mask layer 235 is made of silicon carbide (SiC), the spacers 233 and/or the ILD layer 260 may be made of a dielectric material different from silicon carbide. Therefore, the hard mask layer 235 can be used to define self-aligned gate contact region and thus referred to as a self-aligned contact (SAC) structure or a SAC layer.

Figure 18A:
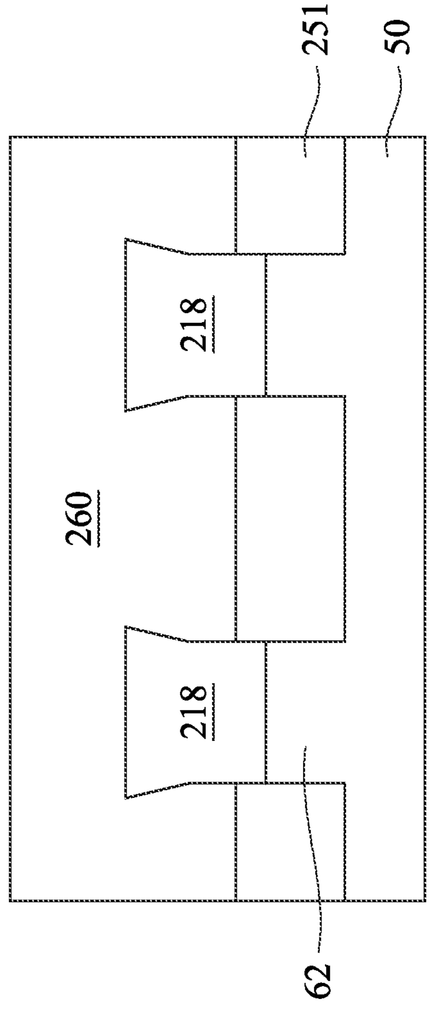
Figure 18B:
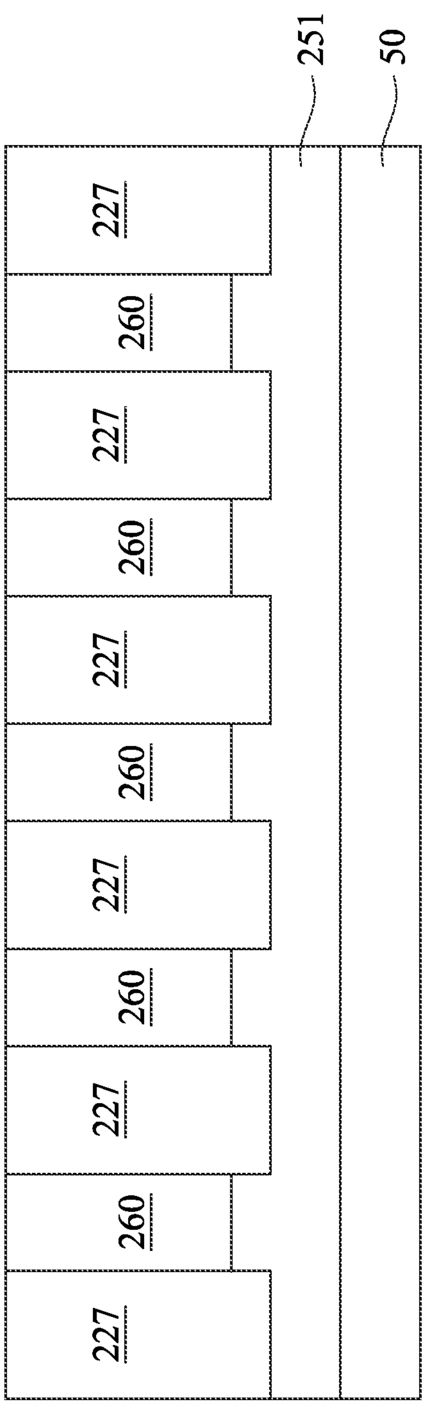
Figure 18C:
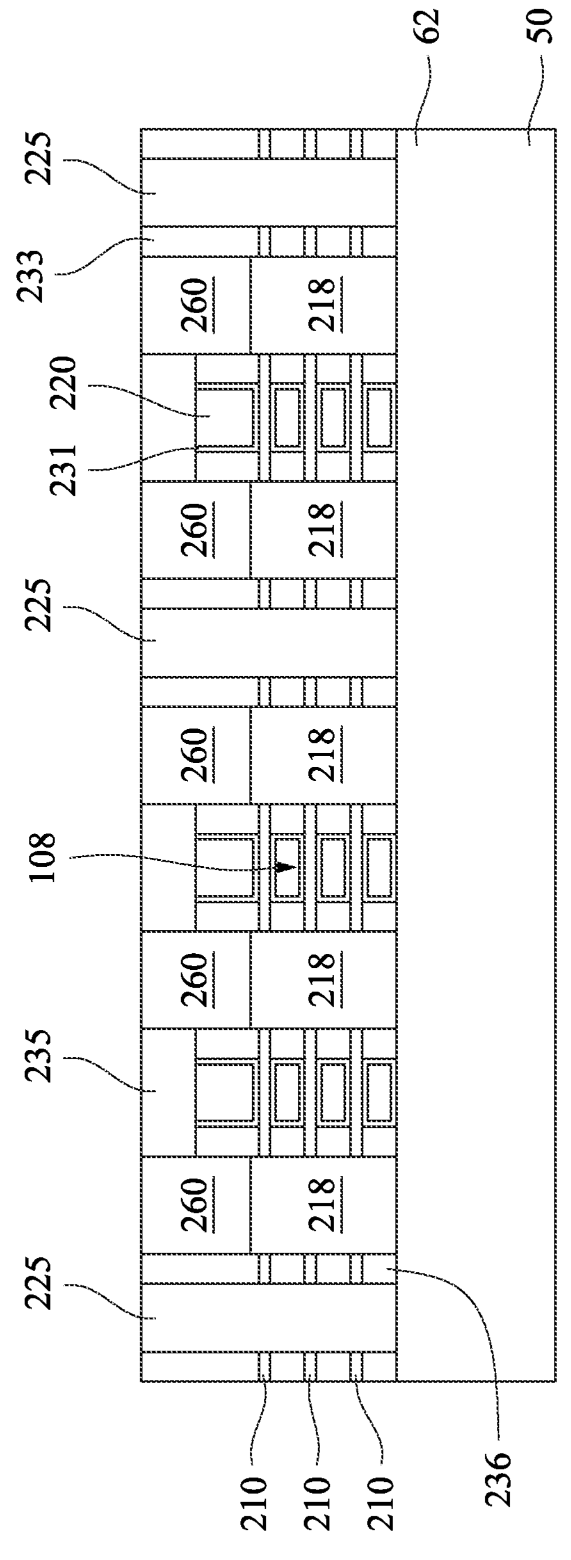

Reference is made to FIGS. 18A, 18B, and 18C. The dielectric regions 227 are formed on opposite ends of the gate electrode layers 220. In some embodiments, each dielectric region 227 is a gate-cut structure for the gate structure, and the gate-cut structure is formed by a cut metal gate (CMG) process. In some embodiments, the dielectric region 227 can be interchangeably referred to a gate end dielectric. Specifically, the opposite ends the gate electrode layers 220 are removed to form gate trenches. The ends of the gate electrode layers 220 may be removed by dry etching, wet etching, or a combination of dry and wet etching. For example, a wet etching process may include exposure to a hydroxide containing solution (e.g., ammonium hydroxide), deionized water, and/or other suitable etchant solutions. Subsequently, a dielectric material is deposited into the gate trenches, followed by a planarization process to remove excess portions of the dielectric material. The remaining dielectric material forms the dielectric regions 227.

In some embodiments, the deposition of the dielectric material of the dielectric regions 227 is performed using a conformal deposition process such as ALD, which may be PEALD, thermal ALD, or the like. The dielectric material may be formed of or comprise $SiO_2$, SiOC, SiOCN, or the like, or combinations thereof. In some embodiments, the dielectric region 227 may be made of a nitride-based material, such as $Si_3N_4$, or a carbon-based material, such as SiOCN, or combinations thereof. In some embodiments, the dielectric region 227 may be made of a material having a dielectric constant greater than about 9 (e.g., high dielectric constant (high-k) material). For example, the dielectric region 227 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. The dielectric regions 227 may be formed of a homogenous material, or may have a composite structure including more than one layer. The dielectric regions 227 may include dielectric liners, which may be formed of, for example, silicon oxide. In some embodiments, the dielectric material of the dielectric regions 227 comprises SiN, and the deposition is performed using process gases including dichlorosilane and ammonia. Hydrogen ($H_2$) may or may not be added.

Figure 19A:
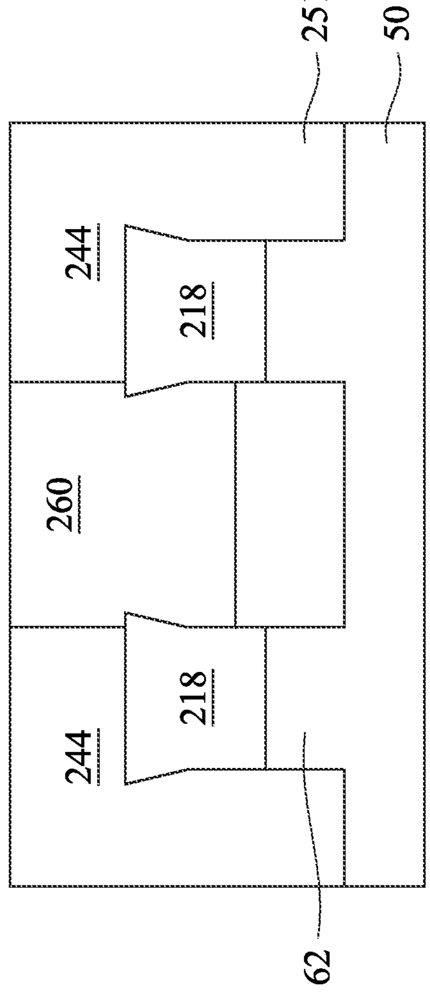
Figure 19B:
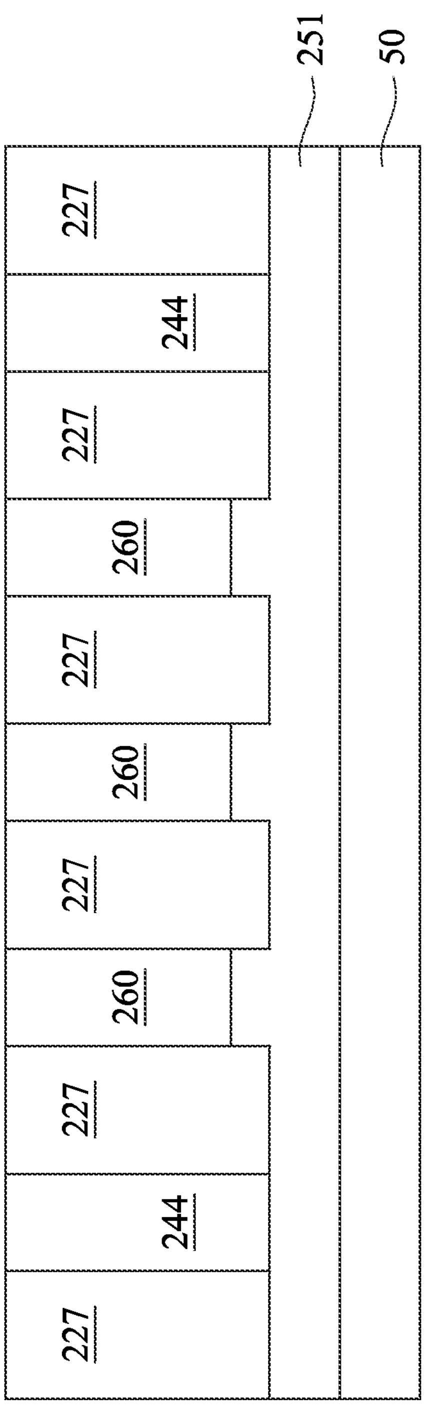
Figure 19C:
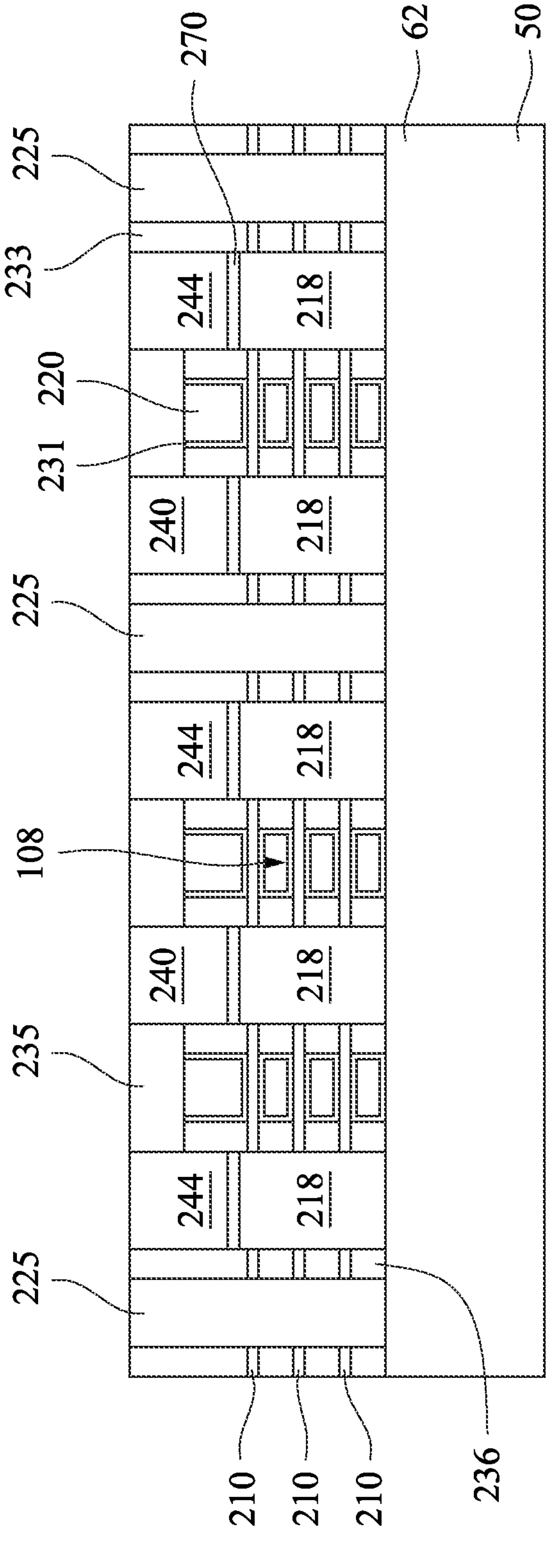

Reference is made to FIGS. 19A, 19B, and 19C. Source/drain contacts 240 and power supply voltage contacts 244 are formed in the ILD layer 260 and on the source/drain regions 218. In some embodiments, the source/drain silicide regions 270 can be formed between the source/drain contacts 240 and the source/drain regions 218 and between the power supply voltage contacts 244 and the source/drain regions 218. the front-side power supply voltage contact 244 lands on the source/drain region 218 and further downwardly extends to the back-side conductive via 248 through a shallow trench isolation (STI) structure 251. That is, the back-side conductive via 248 (see FIG. 23A) formed subsequently can be in contact with the source/drain region 218 and the front-side power supply voltage contact 244 at the same time. In some embodiments, as shown in FIG. 3B, the back-side conductive via 248 can be spaced apart from the source/drain region 218 by a back-side dielectric 331 formed subsequently and electrically connected to the source/drain region 218 through the front-side power supply voltage contact 244. In some embodiments, because the upper portion of the source/drain region 218 has a higher dopant concentration than a lower portion thereof, and thus a connection between the source/drain region 218 and the back-side conductive via 248 with the front-side power supply voltage contact 244 contacting the upper portion of the source/drain region 218 can have an improved resistance-capacitance (RC). In some embodiments, materials of the source/drain contacts 240 and the power supply voltage contacts 244 may include Cu, Co, Ru, Pt, Al, W, Ti, TaN, TiN, or any combinations thereof.

Figure 20A:
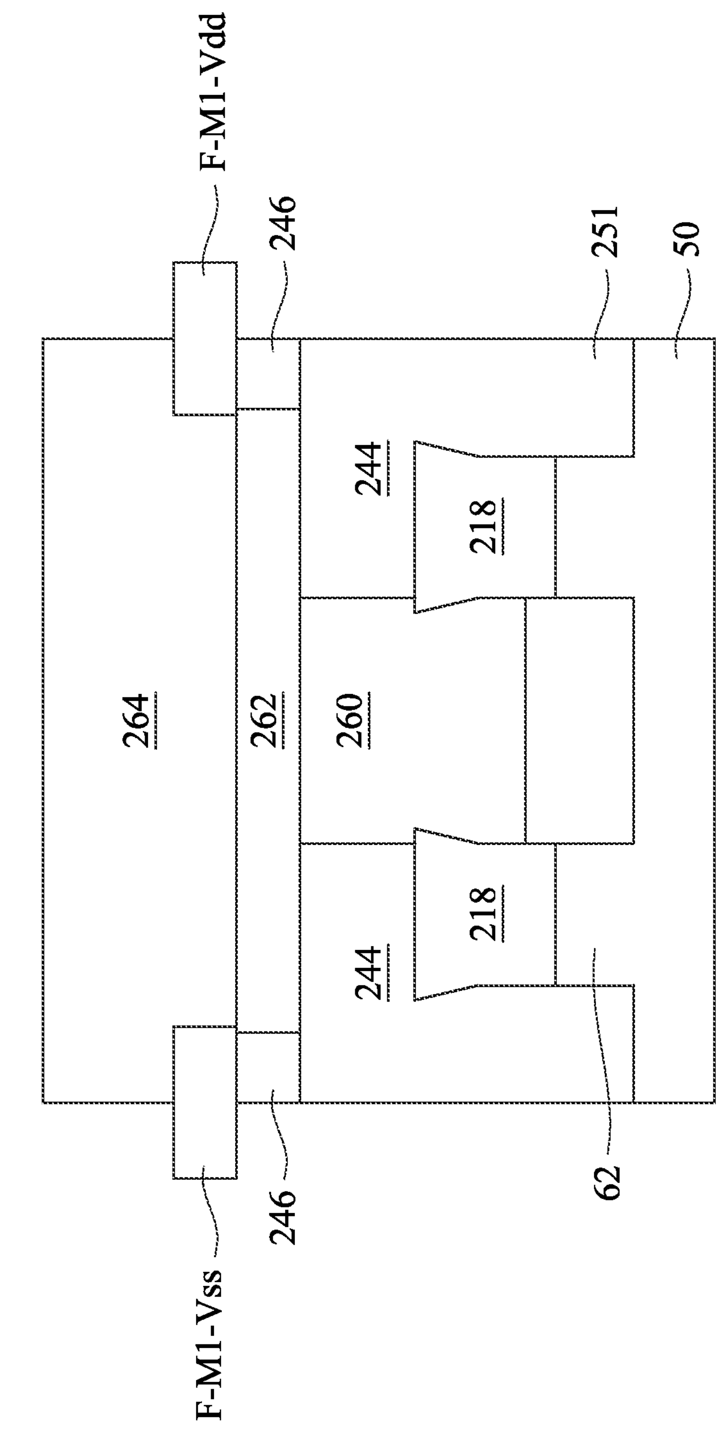
Figure 20B:
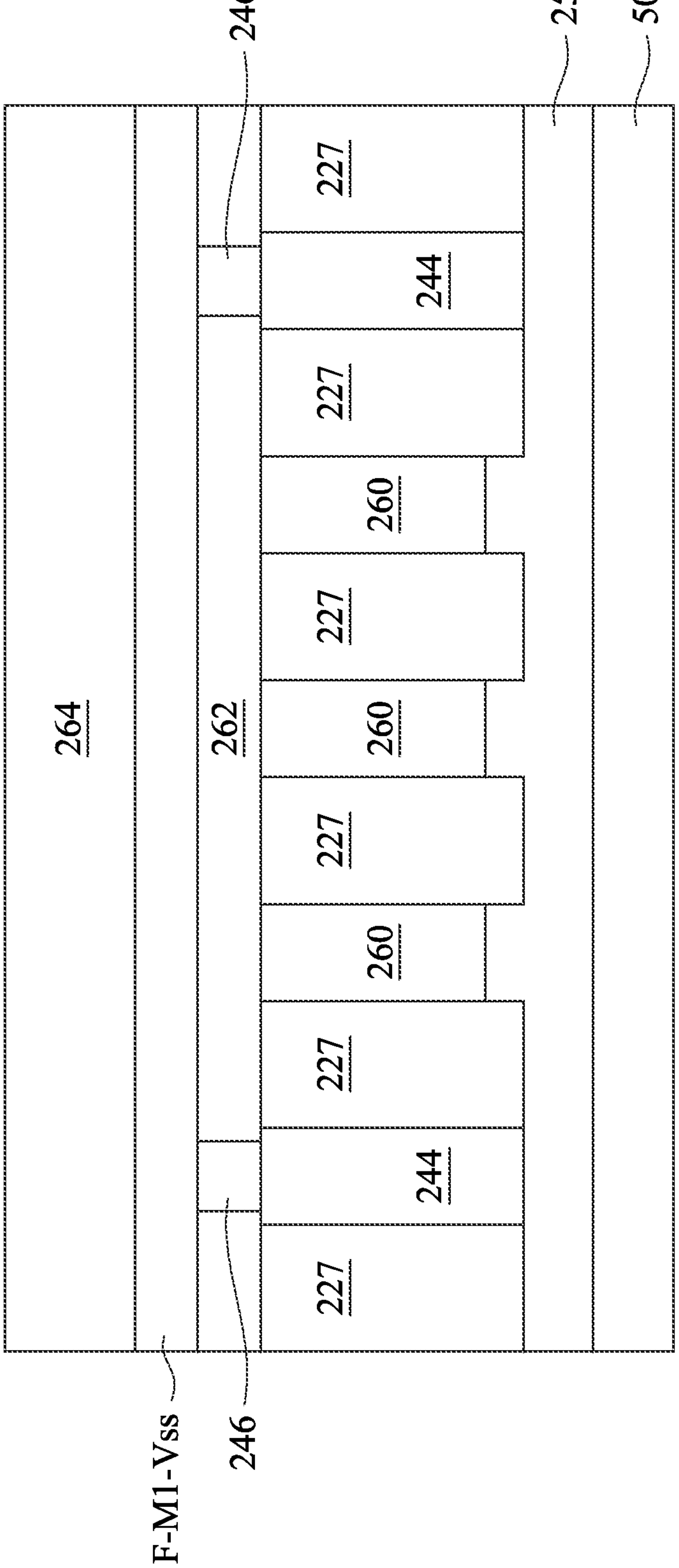
Figure 20C:
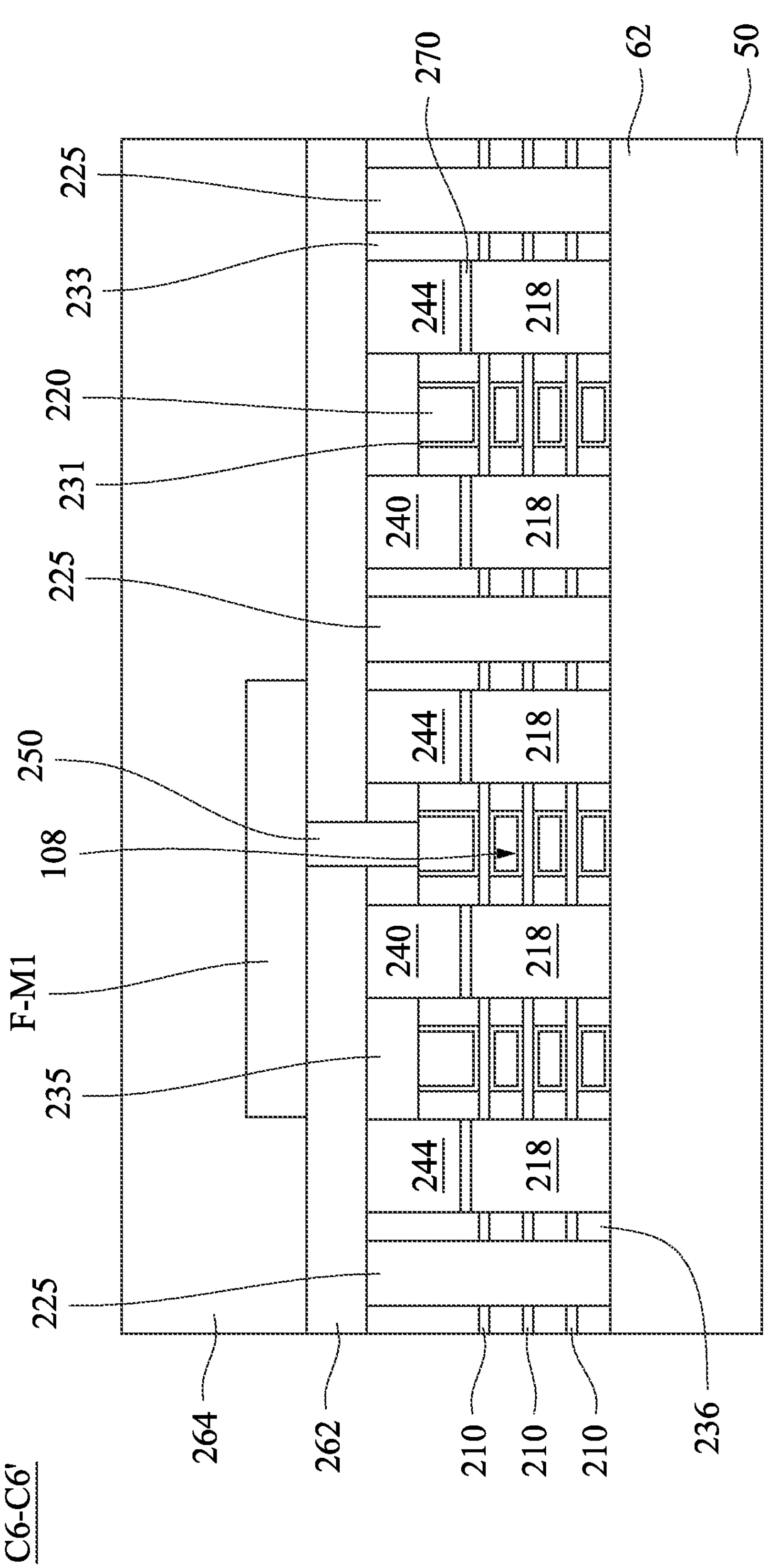

Reference is made to FIGS. 20A, 20B, and 20C. Source/drain vias 242 and conductive vias 246 are formed in an ILD layer 262 over the ILD layer 260, such that the source/drain vias 242 and the conductive vias 246 land on the source/drain contacts 240 and the power supply voltage contact 244, respectively. Gate vias 250 are formed to pass through the ILD layer 262 and the hard mask layer 235 and land on the gate electrode layers 220. The source/drain vias 242, conductive vias 246, and the gate vias 250 may include a metal-containing material such as titanium nitride, titanium oxide, tungsten, cobalt, ruthenium, aluminum, copper, combinations thereof, multi-layers thereof, or the like. The ILD layer 262 may be made of an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof.

Subsequently, a front-side interconnect structure is formed over the front-side gate vias 250, the front-side source/drain vias 242, and the front-side conductive vias 246. The interconnect structure includes a plurality of metallization layers with a plurality of metallization vias or interconnects. Other embodiments may contain more or fewer metallization layers and corresponding more or fewer number of vias. The metal line illustrated here just for an example, and the metal line may be otherwise oriented (rotated 90 degrees or at other orientations). The front-side interconnect structure may include metal lines F-M1 and power supply voltage lines F-M1-Vdd, F-M1-Vss formed in a first front-side metallization layer. The metal lines F-M1 and the power supply voltage lines F-M1-Vdd, F-M1-Vss are in an IMD (inter-metal dielectric) layer 264. The front-side metal layers F-M1 are electrically connected to the gate electrode layers 220 through the gate vias 250 and electrically connected to the source/drain regions 218 through the source/drain vias 242 and the source/drain contacts 240. The power supply voltage lines F-M1-Vdd, F-M1-Vss are electrically connected to the source/drain regions 218 through the conductive vias 246 and the power supply voltage contact 244. In some embodiments, materials of the metal lines F-M1 and the power supply voltage lines F-M1-Vdd, F-M1-Vss may include Cu, Co, Ru, Pt, Al, W, Ti, TaN, TiN, or any combinations thereof. In some embodiments, the IMD layer 264 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

Figure 21A:
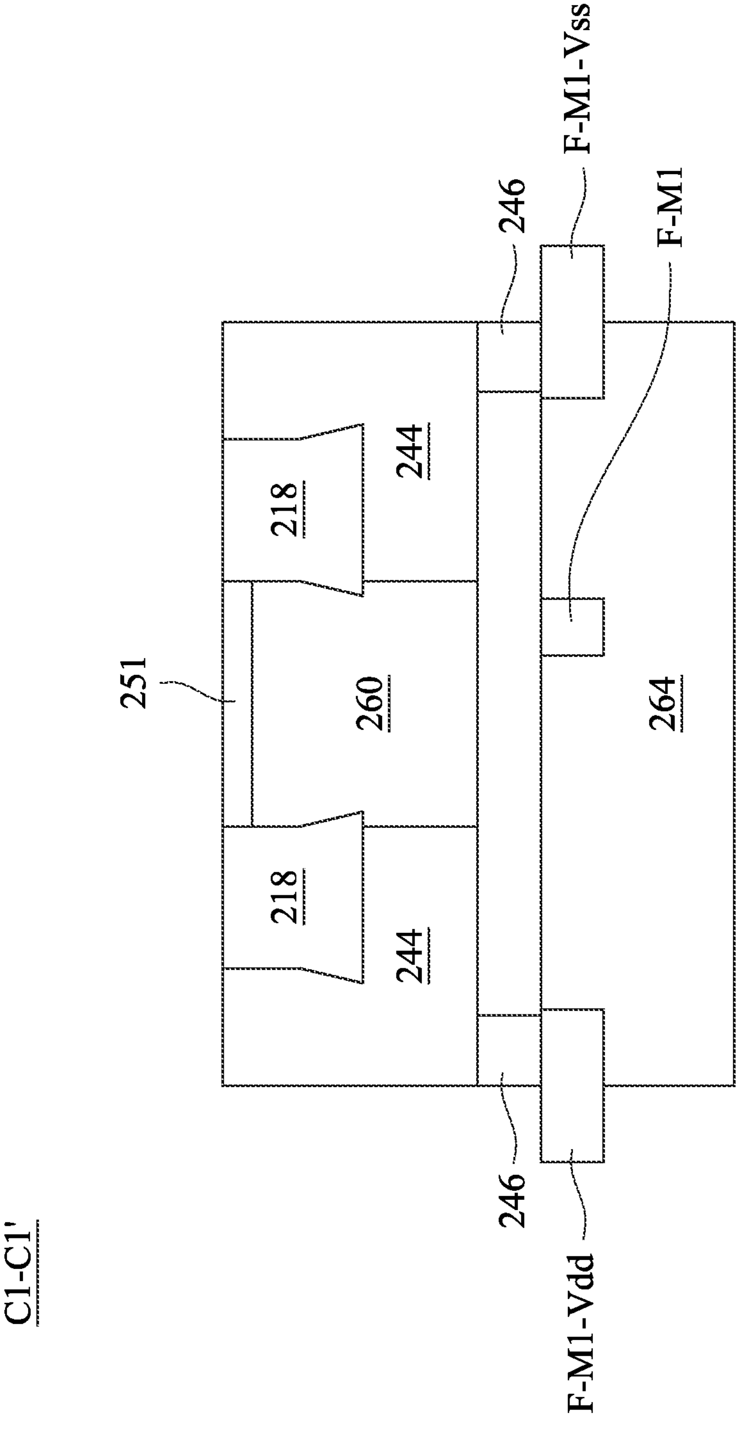
Figure 21B:
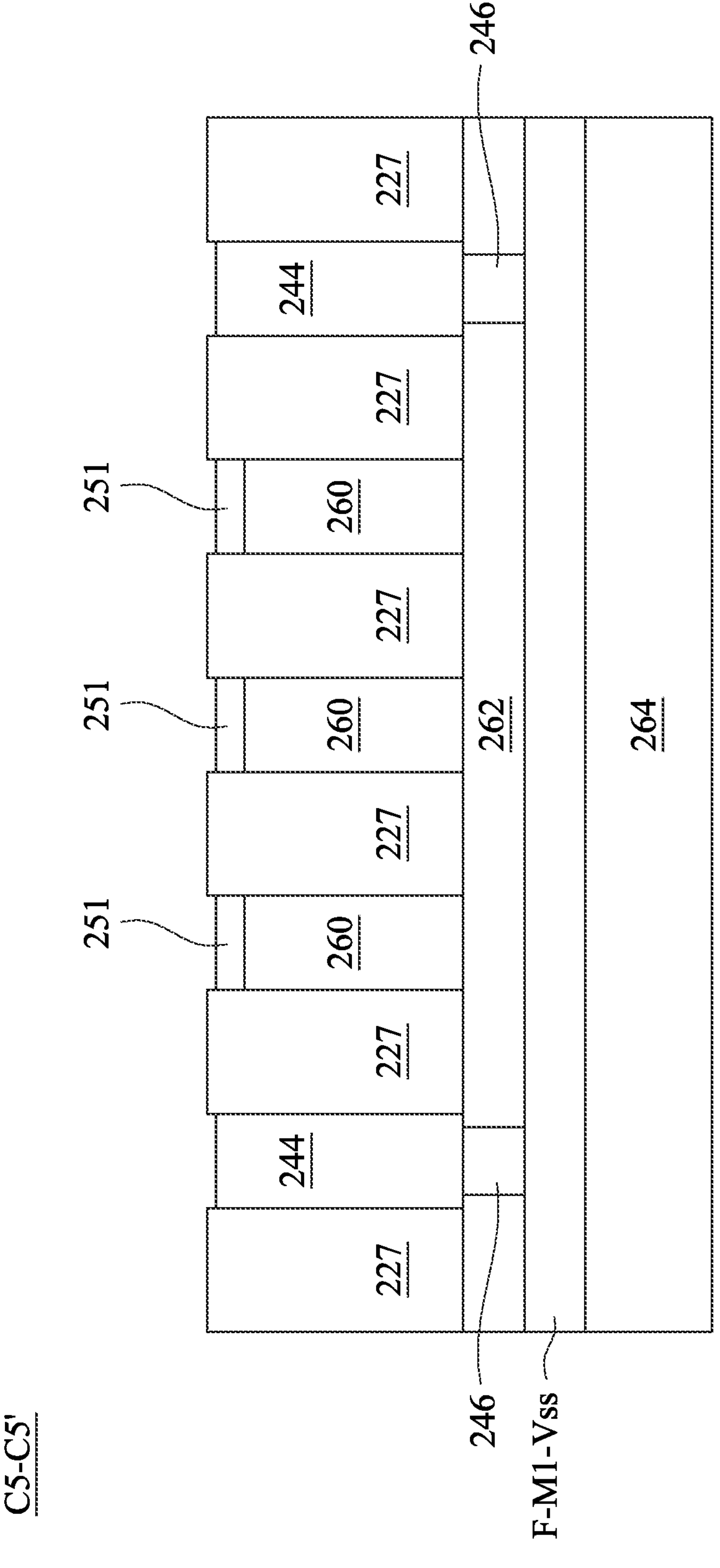
Figure 21C:
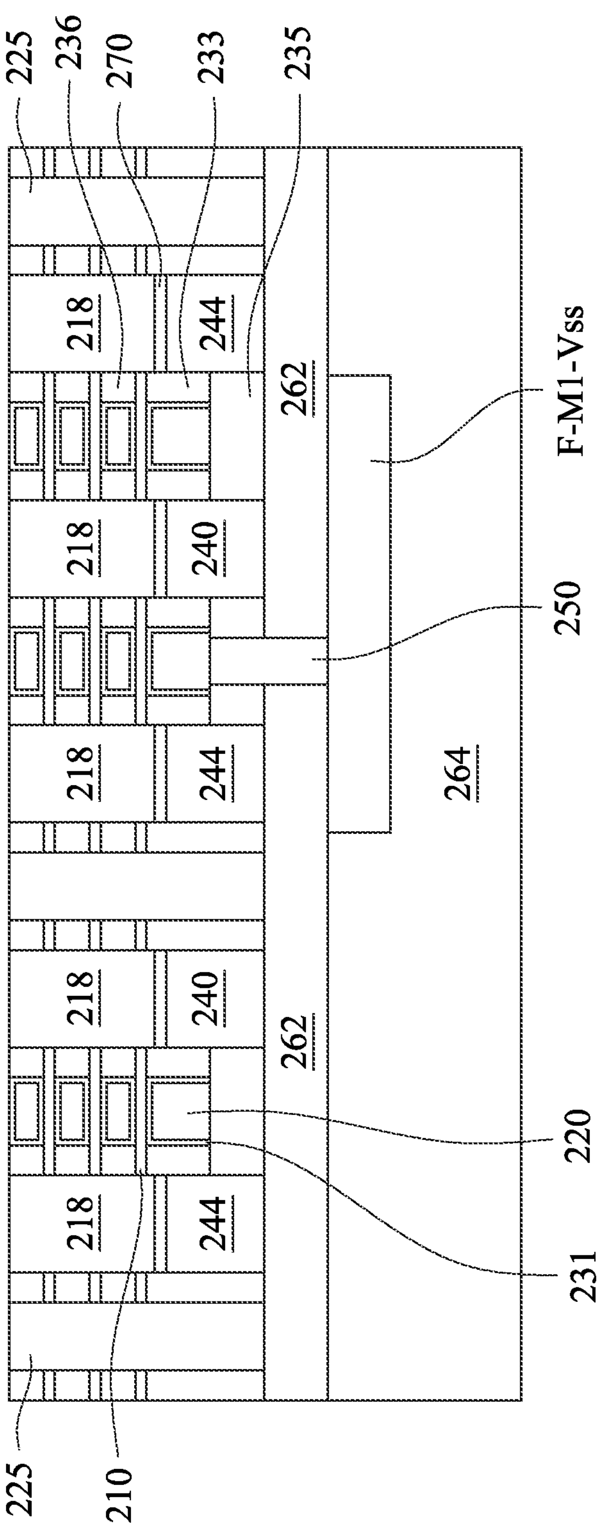

Reference is made to FIGS. 21A, 21B, and 21C. The structures of FIGS. 20A-20C are "flipped" upside down, and the substrate 50 and portions of the STI structure 251 are removed. The substrate 50, the fins 62, and the portions of the STI structure 251 may be removed in a plurality of process operations, for example, CMP, HNA, and/or TMAH etching, which stops at the source/drain regions 218. In some embodiments, the remaining portions of the STI structure 251 can be removed by any acceptable etching process that selectively etches the material of the STI structure 251 at a faster rate than the material of the source/drain regions 218, the inner spacers 236, and/or the gate dielectric layer 231. After the removal process, the source/drain regions 218, the inner spacers 236, and/or the gate dielectric layer 231 are exposed as shown in FIGS. 21A-21C.

Figure 22A:
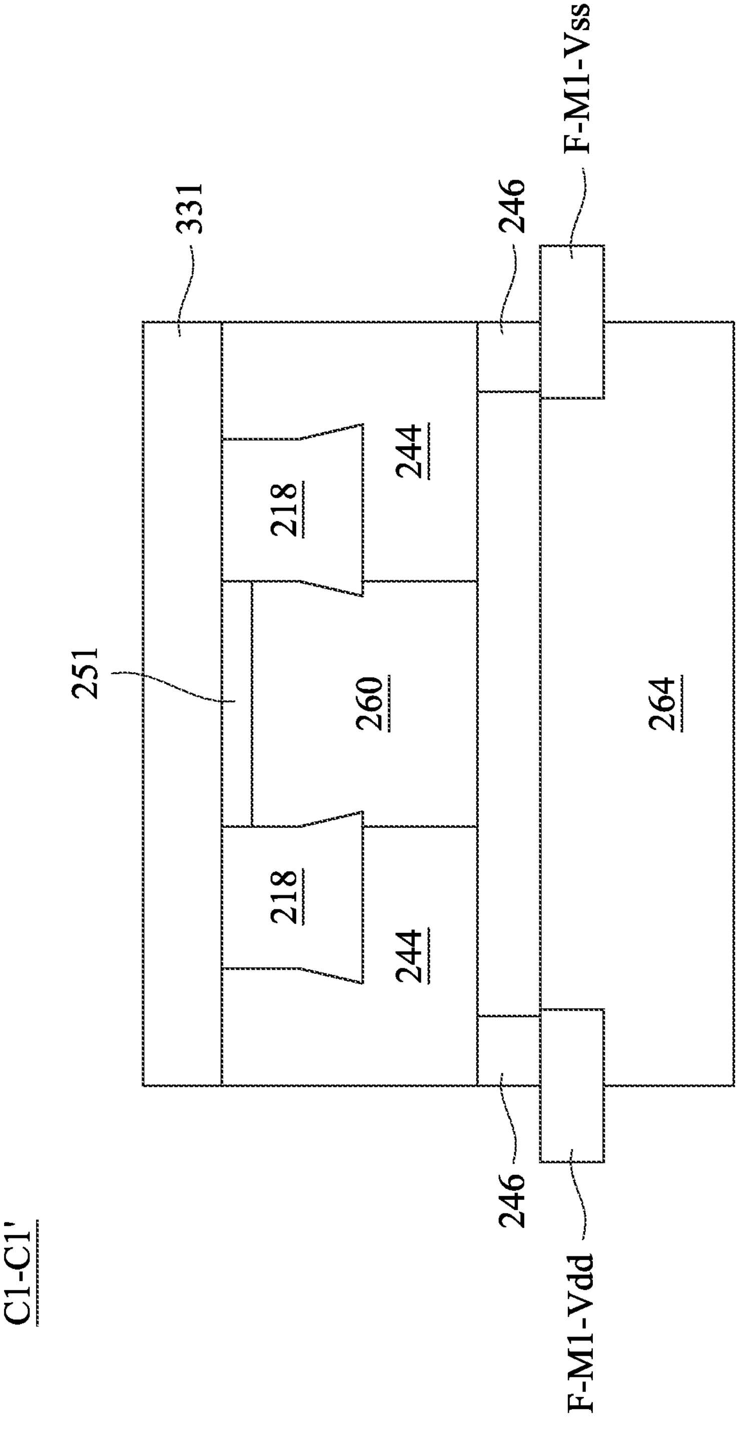
Figure 22B:
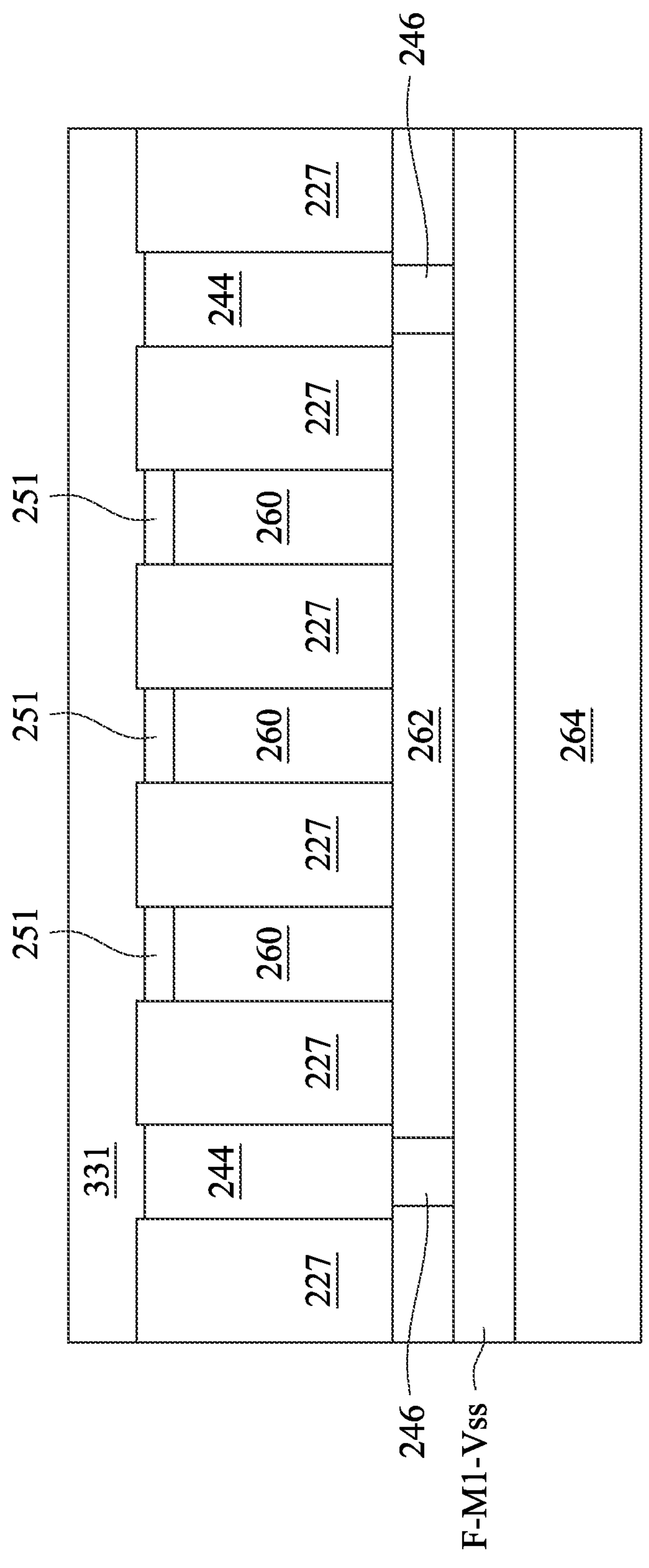
Figure 22C:
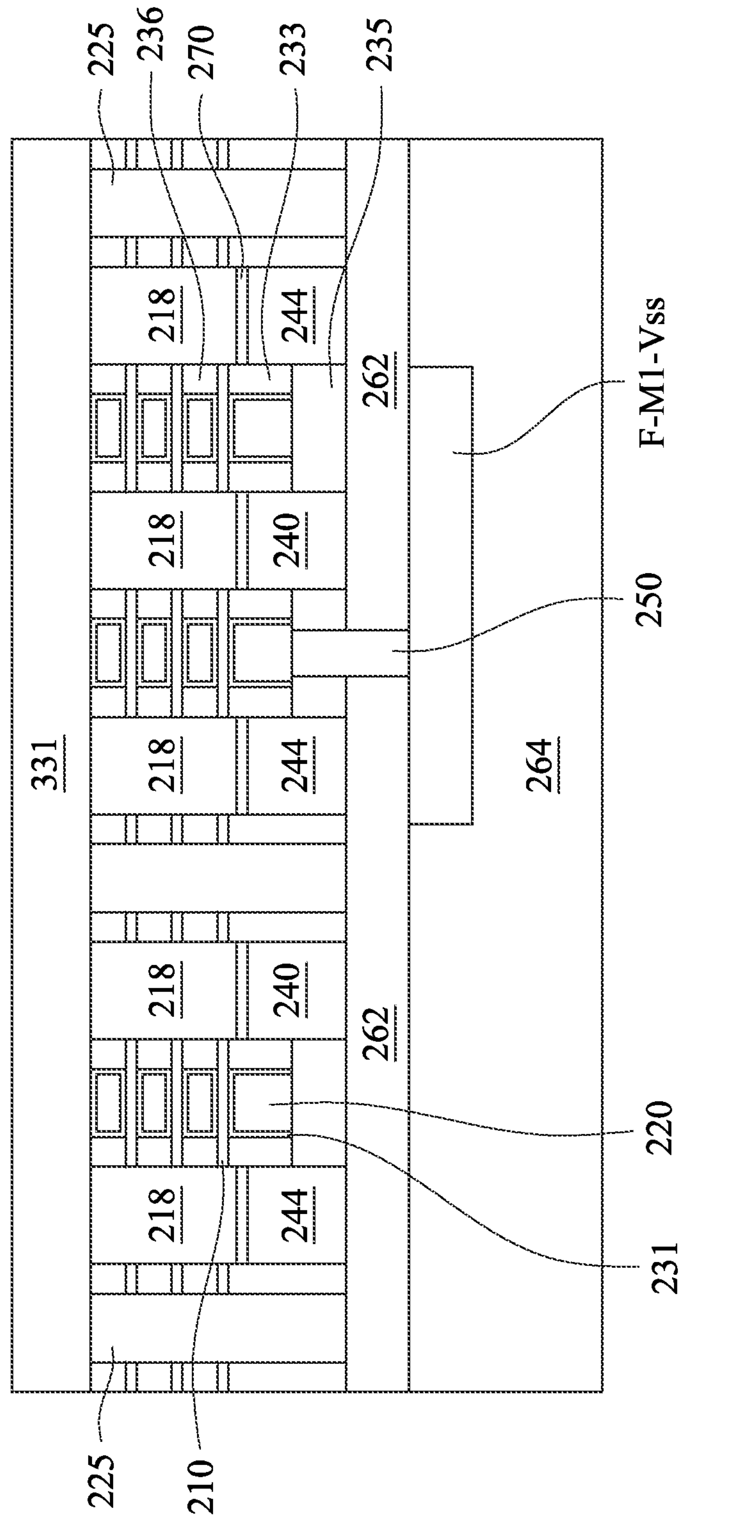

Reference is made to FIGS. 22A, 22B, and 22C. A back-side dielectric 331 is formed over the STI structures 251, the source/drain regions 218, the inner spacers 236, and/or the gate dielectric layer 231. The back-side dielectric 331 may be made of an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof.

Figure 23A:
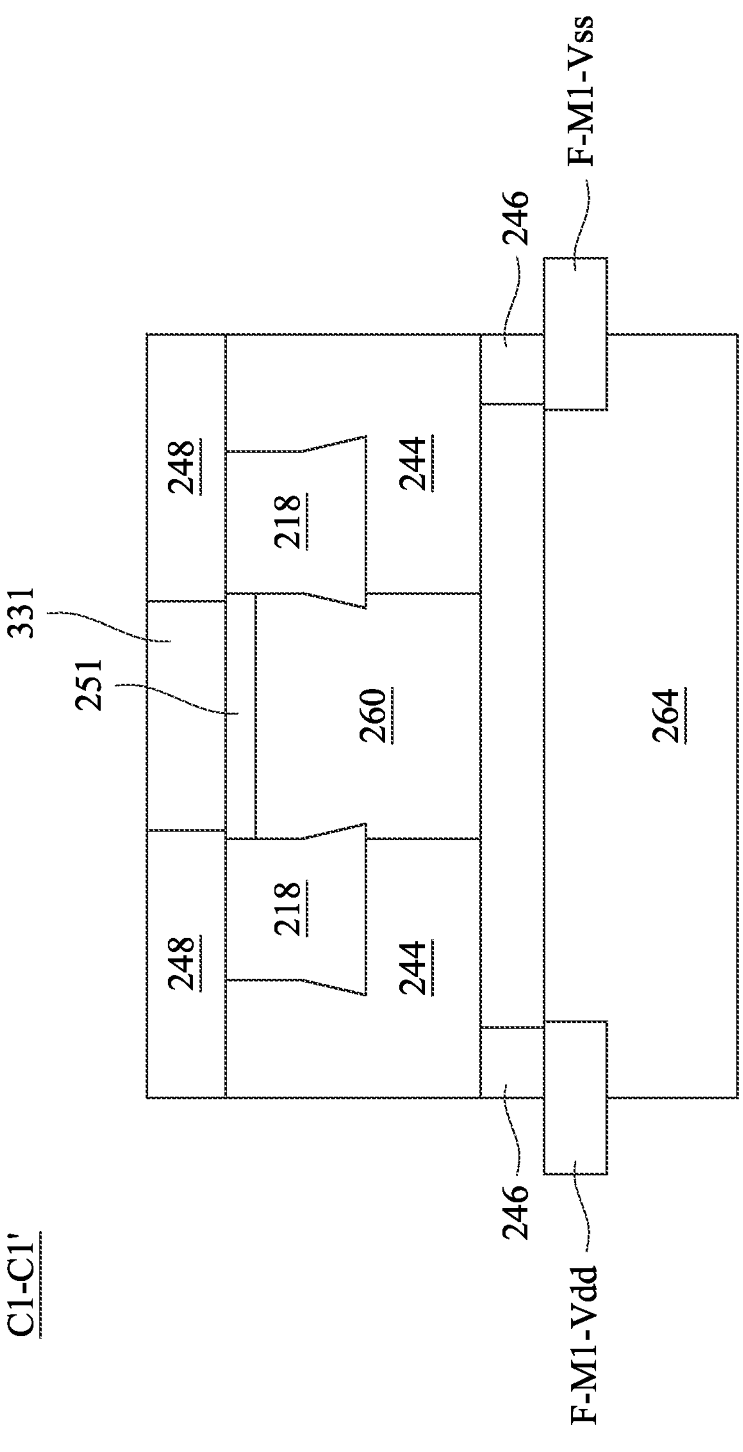
Figure 23B:
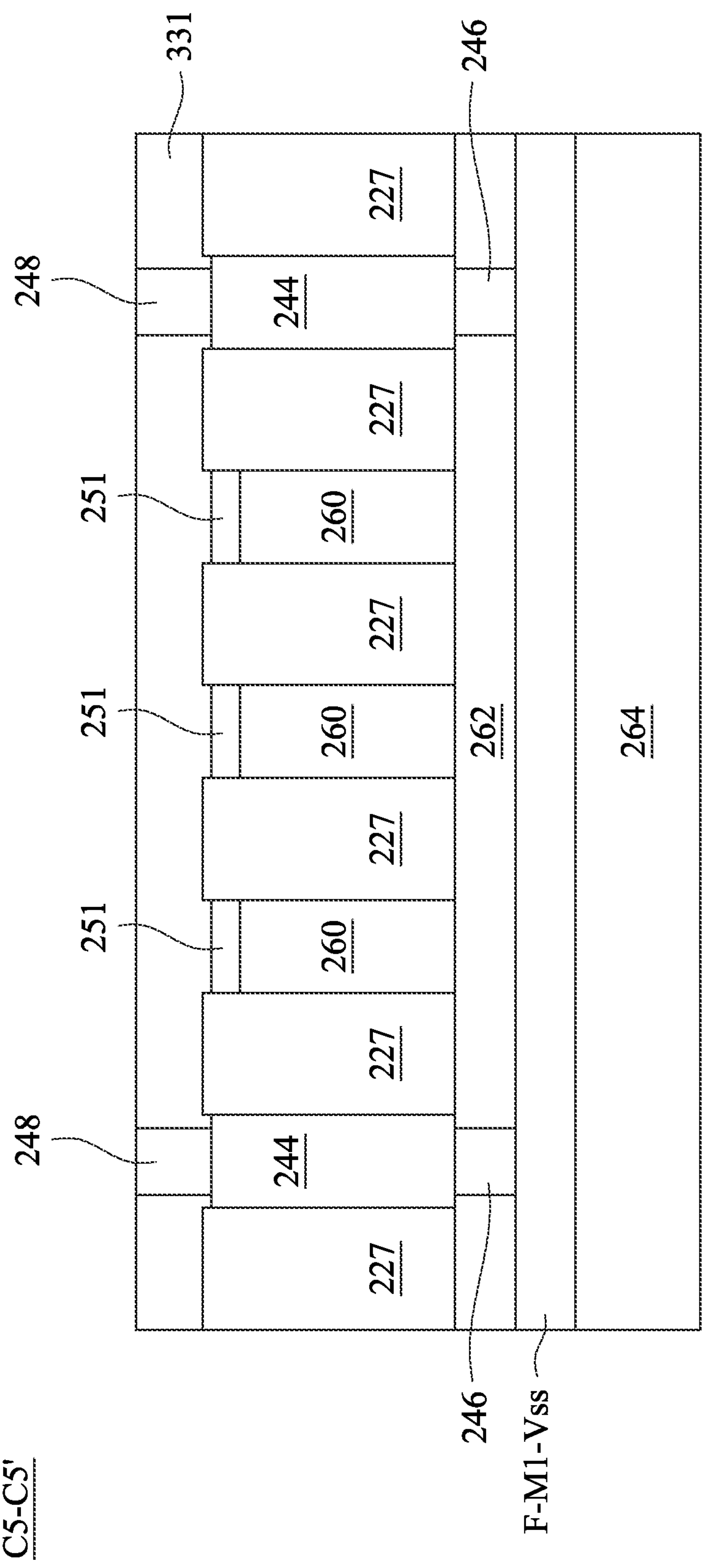
Figure 23C:
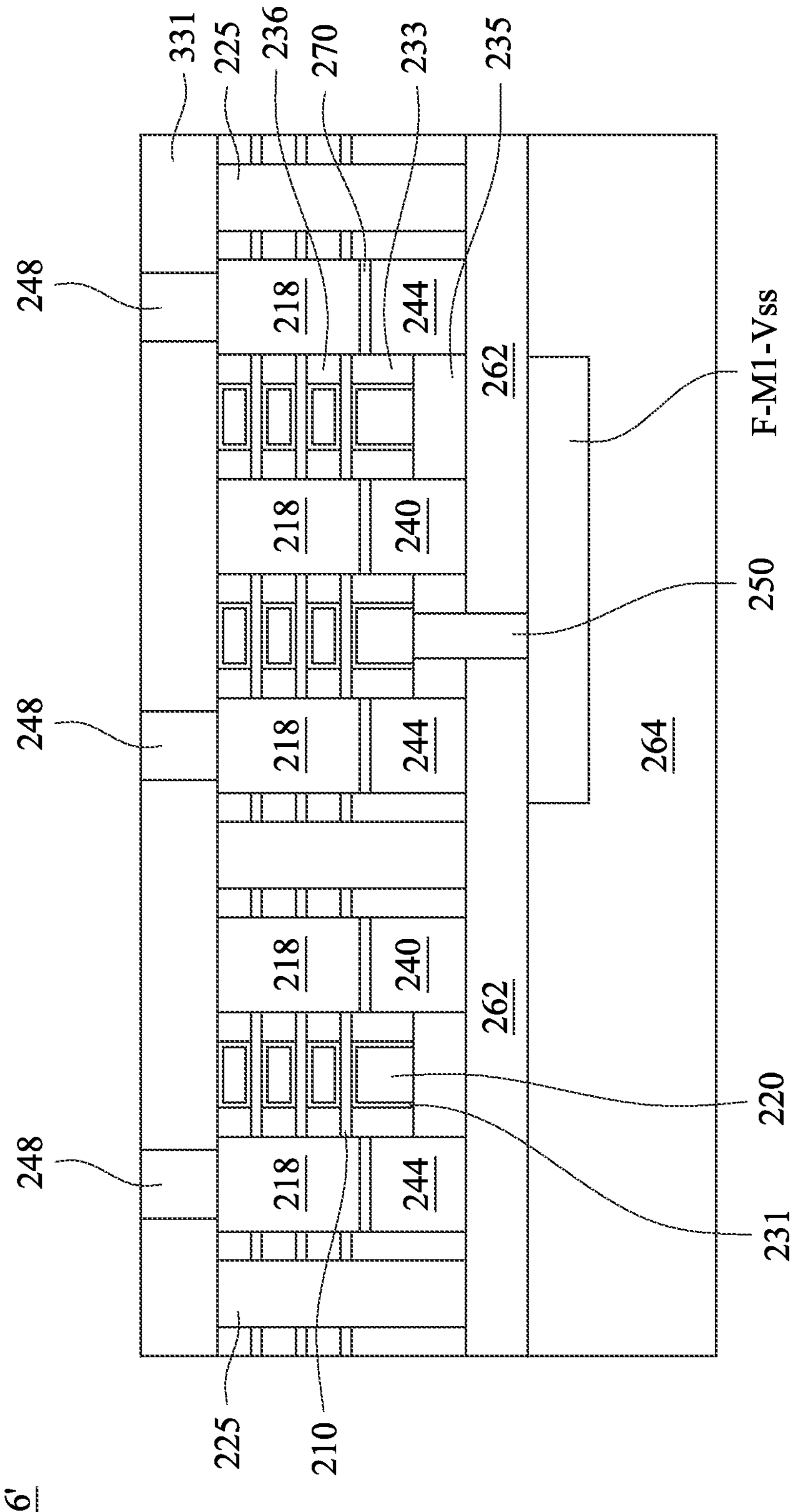

Reference is made to FIGS. 23A, 23B, and 23C. The back-side conductive vias 248 are formed in the back-side dielectric 331 and on the source/drain regions 218 contacting the front-side power supply voltage contact 244 (see FIG. 23A). In some embodiments, the back-side conductive vias 248 can be interchangeably referred to back-side source/drain vias. In some embodiments, the back-side conductive vias 248 may be made of a metal-containing material such as titanium nitride, titanium oxide, tungsten, cobalt, ruthenium, aluminum, copper, combinations thereof, multi-layers thereof, or the like.

Figure 24A:
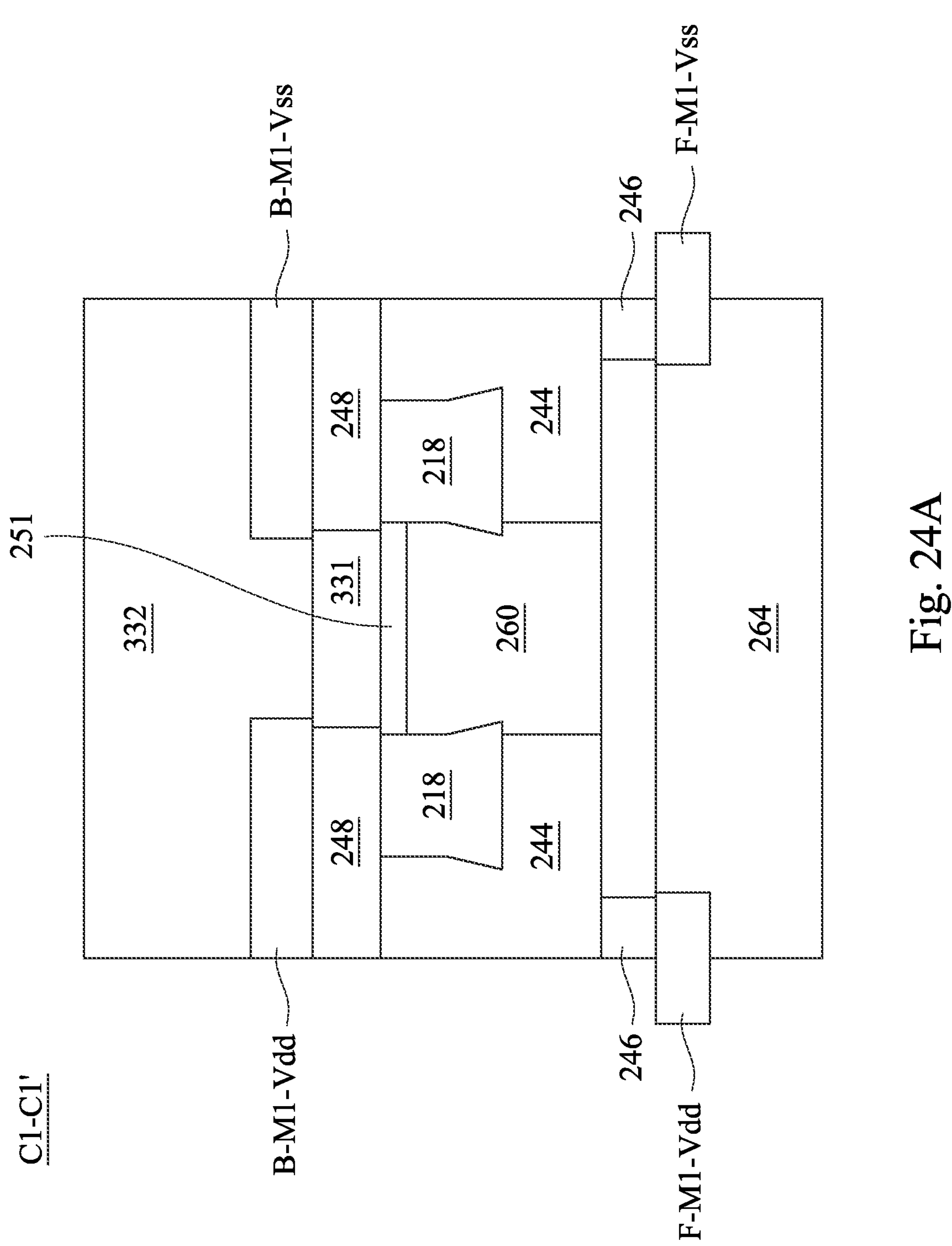
Figure 24B:
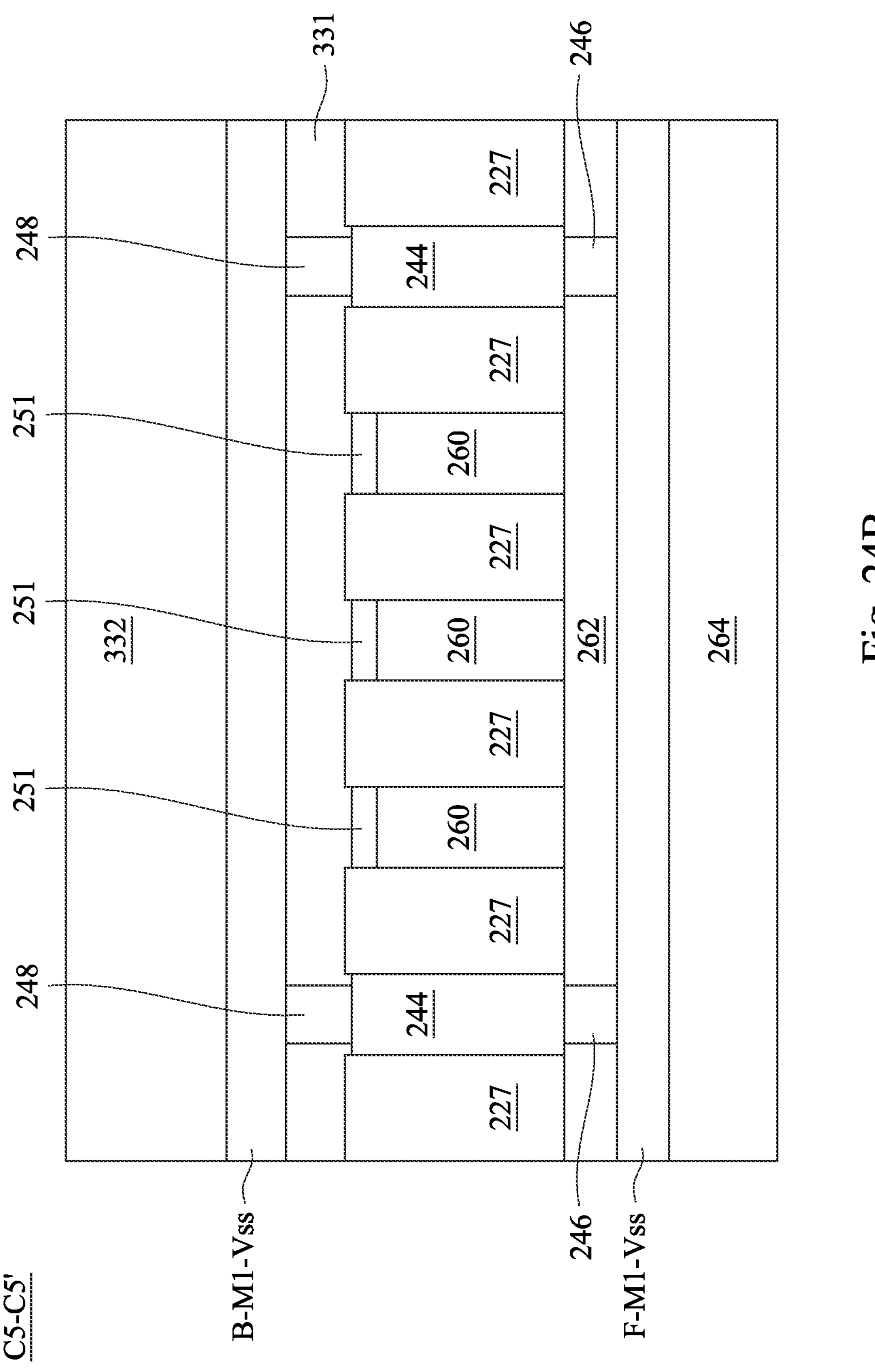
Figure 24C:
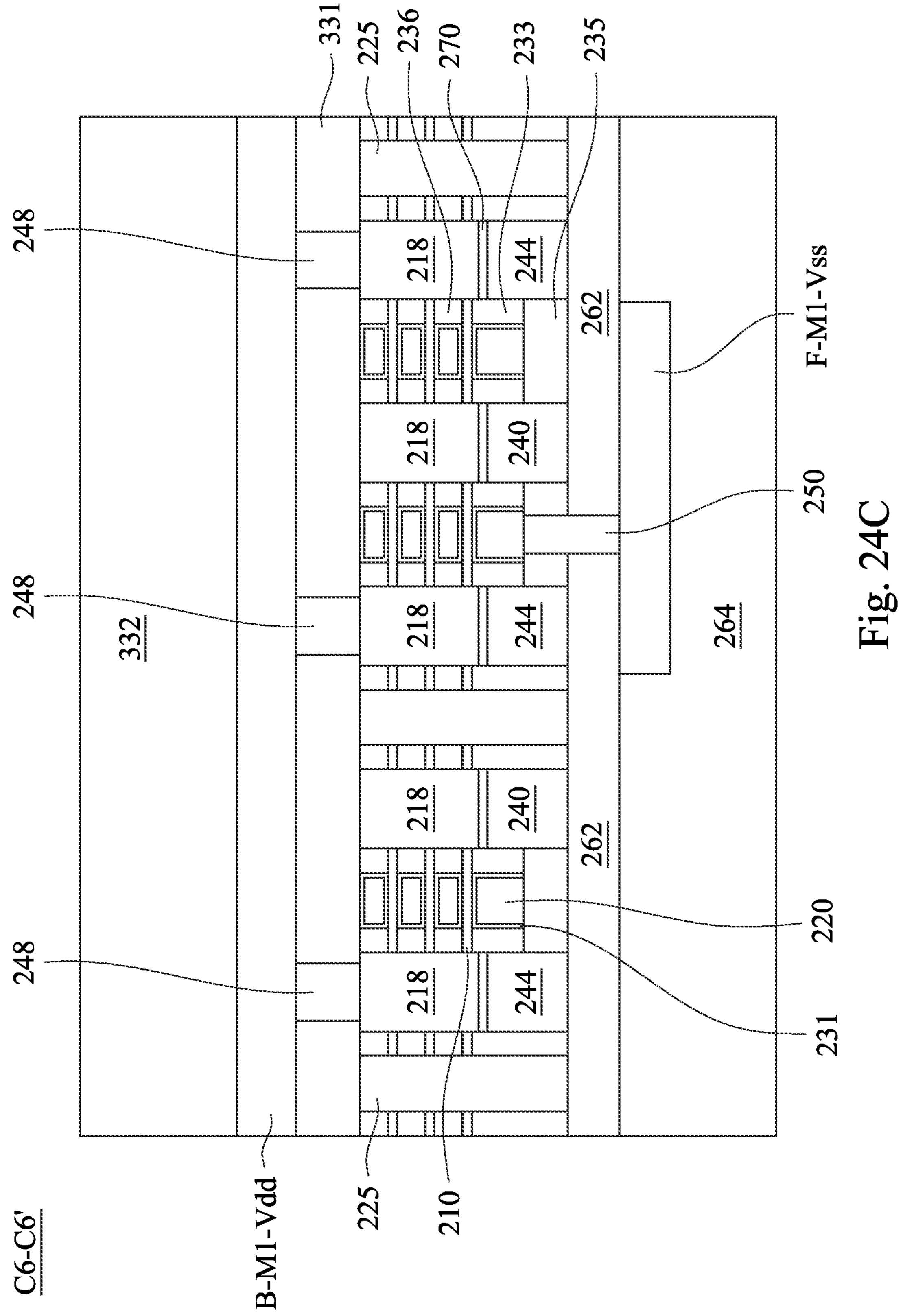

Reference is made to FIGS. 24A, 24B, and 24C. A back-side interconnect structure is formed over the back-side conductive vias source/drain contact. The back-side interconnect structure includes a plurality of metallization layers with a plurality of metallization vias or interconnects. Other embodiments may contain more or fewer metallization layers and corresponding more or fewer number of vias. The metal line illustrated here just for an example, and the metal line may be otherwise oriented (rotated 90 degrees or at other orientations). The back-side interconnect structure may include the power supply voltage lines B-M1-Vss, B-M1-Vdd in a first back-side metallization layer formed in an IMD layer 332. The power supply voltage lines B-M1-Vss, B-M1-Vdd are electrically connected to the source/drain regions 218 through the back-side conductive vias 248 with the front-side power supply voltage contact 244. In some embodiments, materials of the power supply voltage lines B-M1-Vss, B-M2-Vdd may include Cu, Co, Ru, Pt, Al, W, Ti, TaN, TiN, or any combinations thereof. In some embodiments, the IMD layer 332 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a metal line routing method to improve the functional density and operation performance on the IC structure. That is, the power conductive via 248 is moved to wafer back-side to reduce the routing loading and further decrease the logic cell area. The source/drain region 218 can be served as a power conductor path that connects metal layers (e.g., power supply voltage lines Vdd, Vss) on wafer front-side and wafer back-side, such that an area to serve as an additional connection area for front-side and back-side metal layers can be removed, which in turn saves to provide an extra strap area and a connection manufacturing process for the power conductor path. In addition, the back-side power conductive via of the present disclosure can be electrically connected to the source/drain region through the front-side power supply voltage contact having a contact area with an upper portion of the source/drain region. In some embodiments, the upper portion of the source/drain region can have a greater surface area and a higher dopant concentration than a lower portion thereof, and thus a connection between the source/drain region and the back-side conductive via with the front-side power supply voltage contact contacting the upper portion of the source/drain region can have an improved resistance-capacitance (RC), such that a contact resistance for a source node to Vdd/Vss connection can be improved.

In some embodiments, a method includes forming a transistor comprising a channel region, a gate structure surrounding the channel region, and a plurality of source/drain regions on opposite sides of the gate structure; forming a front-side contact on a front-side of one of the source/drain regions; forming a back-side conductive via below the one of the source/drain regions, wherein the front-side contact further downwardly extends from the front-side of the one of the source/drain regions to the back-side conductive via; forming a back-side power supply voltage line connecting to the back-side conductive via. In some embodiments, the one of the source/drain regions is in contact with the back-side conductive via. In some embodiments, the method further includes forming a back-side dielectric layer sandwiched between the one of the source/drain regions and the back-side conductive via, the front-side contact passing through the back-side dielectric layer and being in contact with the back-side conductive via. In some embodiments, the method further includes forming a front-side power supply voltage line electrically connecting to the front-side contact. In some embodiments, the method further includes forming a front-side conductive via landing on the front-side contact, the front-side power supply voltage line being in contact with the front-side conductive via. In some embodiments, the front-side contact is free from being in contact with conductive vias. In some embodiments, the method further includes forming a shallow trench isolation (STI) structure laterally surrounding a lower portion of the one of the source/drain regions, the front-side contact passing through the STI structure and being in contact with the back-side conductive via. In some embodiments, the one of the source/drain regions comprises an n-type dopant, an upper portion of the one of the source/drain regions having a higher n-type dopant concentration than a lower portion of the one of the source/drain regions. In some embodiments, the one of the source/drain regions comprises a p-type dopant, an upper portion of the one of the source/drain regions having a higher p-type dopant concentration than a lower portion of the one of the source/drain regions. In some embodiments, the transistor is a vertically stacked multiple channels gate all around transistor.

In some embodiments, a method includes forming a plurality of first nanostructures arranged in a vertical direction; forming a gate strip surrounding each of the first nanostructures; growing a plurality of first epitaxial structures on either side of each of the first nanostructures; forming a dielectric layer over the first epitaxial structures; forming a first contact in the dielectric layer, wherein one of the first epitaxial structures is partially embedded in a back-side of the first contact; forming a first conductive via underlying the one of the first epitaxial structures, the first conductive via being in contact with the back-side of the first contact; forming a first power supply voltage line in contact with a back-side of the first conductive via. In some embodiments, the method further includes forming a second power supply voltage line above the dielectric layer, the second power supply voltage line being electrically connecting to the first contact. In some embodiments, the method further includes forming a plurality of second nanostructures arranged in the vertical direction, wherein the gate strip further surrounds each of the second nanostructures; growing a plurality of second epitaxial structures on either side of each of the second nanostructures; forming a second contact in the dielectric layer, wherein one of the second epitaxial structures is partially embedded in the second contact. In some embodiments, the method further includes forming a second conductive via underlying the one of the second epitaxial structures, the second conductive via being in contact with a back-side of the second contact. In some embodiments, the first contact has a greater height than the first one of the first epitaxial structures. In some embodiments, the first nanostructures, the gate strip, and the first epitaxial structures form an inverter circuit, an NAND circuit, an NOR circuit, an AND circuit, an OR circuit, a flip-flop circuit, or a SCAN circuit.

In some embodiments, the semiconductor structure includes a plurality of semiconductor sheets, a functional gate pattern, source/drain patterns, a front-side contact, a back-side via, and a back-side power supply voltage line. The semiconductor sheets are arranged in a vertical direction. The functional gate pattern is across the semiconductor sheets from a top view. The source/drain patterns are on opposite sides of the semiconductor sheets. The front-side contact has a first portion formed on a top surface of one of the source/drain patterns, and a second portion formed on a sidewall of the one of the source/drain patterns from a cross sectional view. The back-side via is below the one of the source/drain patterns. The second portion of the front-side contact is further in contact with the back-side via. The back-side power supply voltage line is in contact with the back-side via. In some embodiments, the method further includes a front-side via landing on the front-side contact. In some embodiments, the method further includes a front-side power supply voltage line spanning the front-side via. In some embodiments, the method further includes a dummy gate pattern extending in parallel with a lengthwise direction of the functional gate pattern, wherein the front-side contact laterally between the dummy gate pattern and the functional gate pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a transistor comprising a channel region, a gate structure surrounding the channel region, and a plurality of source/drain regions on opposite sides of the gate structure;

forming a front-side contact on a front-side of one of the source/drain regions;

forming a back-side conductive via below the one of the source/drain regions, wherein the front-side contact further downwardly extends from the front-side of the one of the source/drain regions to the back-side conductive via, wherein the one of the source/drain regions is in contact with the back-side conductive via; and forming a back-side power supply voltage line connecting to the back-side conductive via.

2. The method of claim 1, comprising:

forming an isolation structure, wherein a lower portion of the one of the source/drain regions is formed adjacent the isolation structure; and removing material of the isolation structure to expose a bottom surface of the front-side contact, a bottom surface of the one of the source/drain regions, and a bottom surface of the gate structure;

wherein forming the back-side conductive via comprises forming the back-side conductive via having an upper surface contiguous with the bottom surface of the front-side contact, the bottom surface of the one of the source/drain regions, and a bottom surface of the isolation structure.

3. The method of claim 1, further comprising:

forming a back-side dielectric layer sandwiched between the one of the source/drain regions and the back-side conductive via, the front-side contact passing through the back-side dielectric layer and being in contact with the back-side conductive via.

4. The method of claim 1, further comprising:

forming a front-side power supply voltage line electrically connecting to the front-side contact.

5. The method of claim 4, further comprising:

forming a front-side conductive via landing on the front-side contact, the front-side power supply voltage line being in contact with the front-side conductive via.

6. The method of claim 1, wherein the front-side contact is free from being in contact with conductive vias.

7. The method of claim 1, further comprising:

forming a shallow trench isolation (STI) structure laterally surrounding a lower portion of the one of the source/drain regions, the front-side contact passing through the STI structure and being in contact with the back-side conductive via.

8. The method of claim 1, wherein the one of the source/drain regions comprises an n-type dopant, an upper portion of the one of the source/drain regions having a higher n-type dopant concentration than a lower portion of the one of the source/drain regions.

9. The method of claim 1, wherein the one of the source/drain regions comprises a p-type dopant, an upper portion of the one of the source/drain regions having a higher p-type dopant concentration than a lower portion of the one of the source/drain regions.

10. The method of claim 1, wherein the transistor is a vertically stacked multiple channels gate all around transistor.

11. A method, comprising:

forming a plurality of first nanostructures arranged in a vertical direction;

forming a gate strip surrounding each of the first nanostructures;

growing a plurality of first epitaxial structures on either side of each of the first nanostructures;

forming a dielectric layer over the first epitaxial structures;

forming a first contact in the dielectric layer, wherein one of the first epitaxial structures is partially embedded in a back-side of the first contact;

forming a first conductive via underlying the one of the first epitaxial structures, the first conductive via being in contact with the back-side of the first contact and having an upper surface contiguous with a bottom surface of the one of the first epitaxial structures; and forming a first power supply voltage line in contact with a back-side of the first conductive via.

12. The method of claim 11, further comprising:

forming a second power supply voltage line above the dielectric layer, the second power supply voltage line being electrically connecting to the first contact.

13. The method of claim 11, further comprising:

forming a plurality of second nanostructures arranged in the vertical direction, wherein the gate strip further surrounds each of the second nanostructures;

growing a plurality of second epitaxial structures on either side of each of the second nanostructures; and forming a second contact in the dielectric layer, wherein one of the second epitaxial structures is partially embedded in the second contact.

14. The method of claim 13, further comprising:

forming a second conductive via underlying the one of the second epitaxial structures, the second conductive via being in contact with a back-side of the second contact.

15. The method of claim 11, wherein the first contact has a greater height than the one of the first epitaxial structures.

16. The method of claim 11, wherein the first nanostructures, the gate strip, and the first epitaxial structures form an inverter circuit, an NAND circuit, an NOR circuit, an AND circuit, an OR circuit, a flip-flop circuit, or a SCAN circuit.

17. A method, comprising:

forming a plurality of nanostructures arranged in a first direction;

forming a source/drain region adjacent the plurality of nanostructures along a second direction different than the first direction;

forming a contact layer around the source/drain region, the contact layer extending from above the source/drain region to below the source/drain region; and forming a conductive via having an upper surface contiguous with a bottom surface of the contact layer;

prior to forming the conductive via, forming a back-side dielectric on the bottom surface of the contact layer and a bottom surface of the source/drain region; and thinning a portion of the back-side dielectric underlying the source/drain region;

wherein forming the conductive via comprises forming the conductive via underlying the source/drain region and separated from the source/drain region by the back-side dielectric.

18. The method of claim 17, wherein:

forming the back-side dielectric comprises forming the back-side dielectric on a bottom surface of an isolation structure positioned adjacent the source/drain region.

19. The method of claim 18, wherein forming the contact layer comprises:

removing a second isolation structure positioned adjacent the source/drain region, yielding an opening; and forming the contact layer in the opening.

20. The method of claim 17, further comprising:

forming a front-side conductive via overlying the contact layer; and forming a power supply voltage line overlying the front-side conductive via, the power supply voltage line being electrically coupled to the conductive via through the contact layer.

* * * * *